US011211109B2

(12) United States Patent
Matsubara

(10) Patent No.: US 11,211,109 B2
(45) Date of Patent: Dec. 28, 2021

(54) ACCESS SCHEMES FOR PROTECTING STORED DATA IN A MEMORY DEVICE

(71) Applicant: Micron Technology, Inc., Boise, ID (US)

(72) Inventor: Yasushi Matsubara, Isehara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/103,521

(22) Filed: Nov. 24, 2020

(65) Prior Publication Data

US 2021/0210129 A1    Jul. 8, 2021

Related U.S. Application Data

(62) Division of application No. 15/958,973, filed on Apr. 20, 2018, now Pat. No. 10,867,653.

(51) Int. Cl.

| G11C 11/22 | (2006.01) |
|---|---|
| G11C 11/4074 | (2006.01) |
| G11C 11/4091 | (2006.01) |
| G06F 12/14 | (2006.01) |
| G11C 8/08 | (2006.01) |
| G11C 16/26 | (2006.01) |
| G11C 16/08 | (2006.01) |
| G11C 16/10 | (2006.01) |

(52) U.S. Cl.
CPC ...... *G11C 11/2257* (2013.01); *G06F 12/1425* (2013.01); *G11C 8/08* (2013.01); *G11C 11/4074* (2013.01); *G11C 11/4091* (2013.01); *G11C 16/08* (2013.01); *G11C 16/10* (2013.01); *G11C 16/26* (2013.01)

(58) Field of Classification Search
CPC ............ G11C 11/2257; G11C 11/4074; G11C 11/4091; G11C 8/08; G11C 16/08; G11C 16/10; G11C 16/26
USPC .................................................. 365/189.09
See application file for complete search history.

(56) References Cited

U.S. PATENT DOCUMENTS

| 4,873,664 | A | * | 10/1989 | Eaton, Jr. | ................. | G11C 11/22 365/145 |
|---|---|---|---|---|---|---|
| 5,218,566 | A | * | 6/1993 | Papaliolios | ............... | G11C 7/14 365/145 |
| 5,574,679 | A | | 11/1996 | Ohtsuki et al. | | |
| 6,078,529 | A | * | 6/2000 | Tada | ........................ | G11C 7/06 365/189.07 |

(Continued)

*Primary Examiner* — Sung Il Cho
(74) *Attorney, Agent, or Firm* — Holland & Hart LLP

(57) ABSTRACT

Methods, systems, and devices for protecting stored data in a memory device are described. In one example, a memory device may include a set of memory cells coupled with a digit line and a plate line. A method of operating the memory device may include performing an access operation on a selected memory cell of the set of memory cells, and performing an equalization operation on a non-selected memory cell of the plurality of memory cells based on performing the access operation. The equalization operation may include applying an equal voltage to opposite terminals of the non-selected memory cell via the digit line and the plate line, which may allow built-up charge, such as leakage charge resulting from the access operation, to dissipate. Such an equalization operation may reduce a likelihood of memory loss in non-selected memory cells after access operations.

17 Claims, 17 Drawing Sheets

(56) References Cited

U.S. PATENT DOCUMENTS

| | | | |
|---|---|---|---|
| 6,181,620 B1* | 1/2001 | Agata | G11C 7/1042 |
| | | | 365/203 |
| 6,292,386 B1 | 9/2001 | Hoenigschmid | |
| 6,297,985 B1* | 10/2001 | Kang | G11C 11/22 |
| | | | 365/145 |
| 6,459,609 B1 | 10/2002 | Du | |
| 6,757,186 B2 | 6/2004 | Lin | |
| 6,859,380 B2* | 2/2005 | Ashikaga | G11C 11/22 |
| | | | 365/145 |
| 6,909,626 B2* | 6/2005 | Torrisi | G11C 11/22 |
| | | | 365/145 |
| 7,545,696 B2 | 6/2009 | Yamaoka | |
| 9,715,919 B1 | 7/2017 | Ingalls et al. | |
| 9,786,345 B1 | 10/2017 | Thiruvengadam et al. | |
| 9,786,347 B1 | 10/2017 | Kawamura et al. | |
| 9,786,348 B1 | 10/2017 | Kawamura et al. | |
| 9,786,349 B1 | 10/2017 | Calderoni et al. | |
| 9,792,973 B2 | 10/2017 | Kawamura et al. | |
| 9,799,388 B1 | 10/2017 | Carman | |
| 10,049,713 B2 | 8/2018 | Di Vincenzo et al. | |
| 10,074,422 B1* | 9/2018 | Tandingan | G11C 11/2293 |
| 10,153,020 B1 | 12/2018 | Vimercati | |
| 10,163,480 B1 | 12/2018 | Kawamura et al. | |
| 10,360,966 B2 | 7/2019 | Derner et al. | |
| 10,446,220 B1 | 10/2019 | Guo et al. | |
| 10,622,650 B2 | 4/2020 | Bozzolo et al. | |
| 10,692,557 B1 | 6/2020 | Bolandrina et al. | |
| 10,726,917 B1 | 7/2020 | Bedeschi et al. | |
| 10,855,295 B2 | 12/2020 | Fackenthal et al. | |
| 10,878,874 B2 | 12/2020 | Hattori et al. | |
| 2003/0076704 A1 | 4/2003 | Ashikaga | |
| 2003/0179610 A1* | 9/2003 | Sakai | G11C 16/3418 |
| | | | 365/189.09 |
| 2005/0152193 A1* | 7/2005 | Sakai | G11C 11/22 |
| | | | 365/189.09 |
| 2006/0067101 A1* | 3/2006 | Sakai | G11C 11/22 |
| | | | 365/145 |
| 2010/0128515 A1 | 5/2010 | Fukushi | |
| 2011/0317507 A1* | 12/2011 | Nakazawa | G11C 11/22 |
| | | | 365/230.03 |
| 2014/0247642 A1* | 9/2014 | Madhan | G11C 11/221 |
| | | | 365/145 |
| 2015/0109875 A1* | 4/2015 | Okuda | G11C 8/10 |
| | | | 365/230.06 |
| 2015/0128515 A1 | 5/2015 | Meyer | |
| 2016/0086648 A1* | 3/2016 | Doi | G11C 11/2257 |
| | | | 365/145 |
| 2016/0260489 A1* | 9/2016 | Lee | G11C 16/3427 |
| 2017/0098478 A1* | 4/2017 | Lee | G11C 29/44 |
| 2017/0352397 A1 | 12/2017 | Guo et al. | |
| 2018/0061470 A1 | 3/2018 | Di Vincenzo et al. | |
| 2018/0308538 A1 | 10/2018 | Vo et al. | |
| 2018/0366174 A1* | 12/2018 | Liu | G11C 11/221 |
| 2019/0027204 A1 | 1/2019 | Kim et al. | |
| 2019/0043564 A1* | 2/2019 | Madraswala | G11C 16/08 |
| 2019/0051335 A1 | 2/2019 | Nagata | |
| 2019/0066753 A1 | 2/2019 | Muzzetto | |

* cited by examiner

ACCESS SCHEMES FOR PROTECTING STORED DATA IN A MEMORY DEVICE

CROSS REFERENCE

The present Application for Patent is a divisional of U.S. patent application Ser. No. 15/958,973, by Matsubara, entitled "ACCESS SCHEMES FOR PROTECTING STORED DATA IN A MEMORY DEVICE," filed Apr. 20, 2018, assigned to the assignee hereof, and is expressly incorporated by reference in its entirety herein.

BACKGROUND

The following relates generally to memory systems and more specifically to access schemes for protecting stored data in a memory device.

Memory devices are widely used to store information in various electronic devices such as computers, wireless communication devices, cameras, digital displays, and the like. Information is stored by programing different states of a memory device. For example, binary memory devices have two logic states, often denoted by a logic "1" or a logic "0". In other memory devices, more than two logic states may be stored. To access the stored information, a component of the electronic device may read, or sense, the stored logic state in the memory device. To store information, a component of the electronic device may write, or program, the logic state in the memory device.

Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source. In some cases, non-volatile memory may use similar device architectures as volatile memory but may have non-volatile properties by employing such physical phenomena as ferroelectric capacitance or different material phases.

Improving memory devices, may include increasing memory cell density, increasing read/write speeds, increasing reliability, increasing data retention, reducing power consumption, or reducing manufacturing costs, among other metrics. In some cases, access operations on a selected memory cell may cause charge to accumulate on non-selected memory cells, which may contribute to a loss of data stored in the non-selected memory cells.

DETAILED DESCRIPTION

Figure 1:
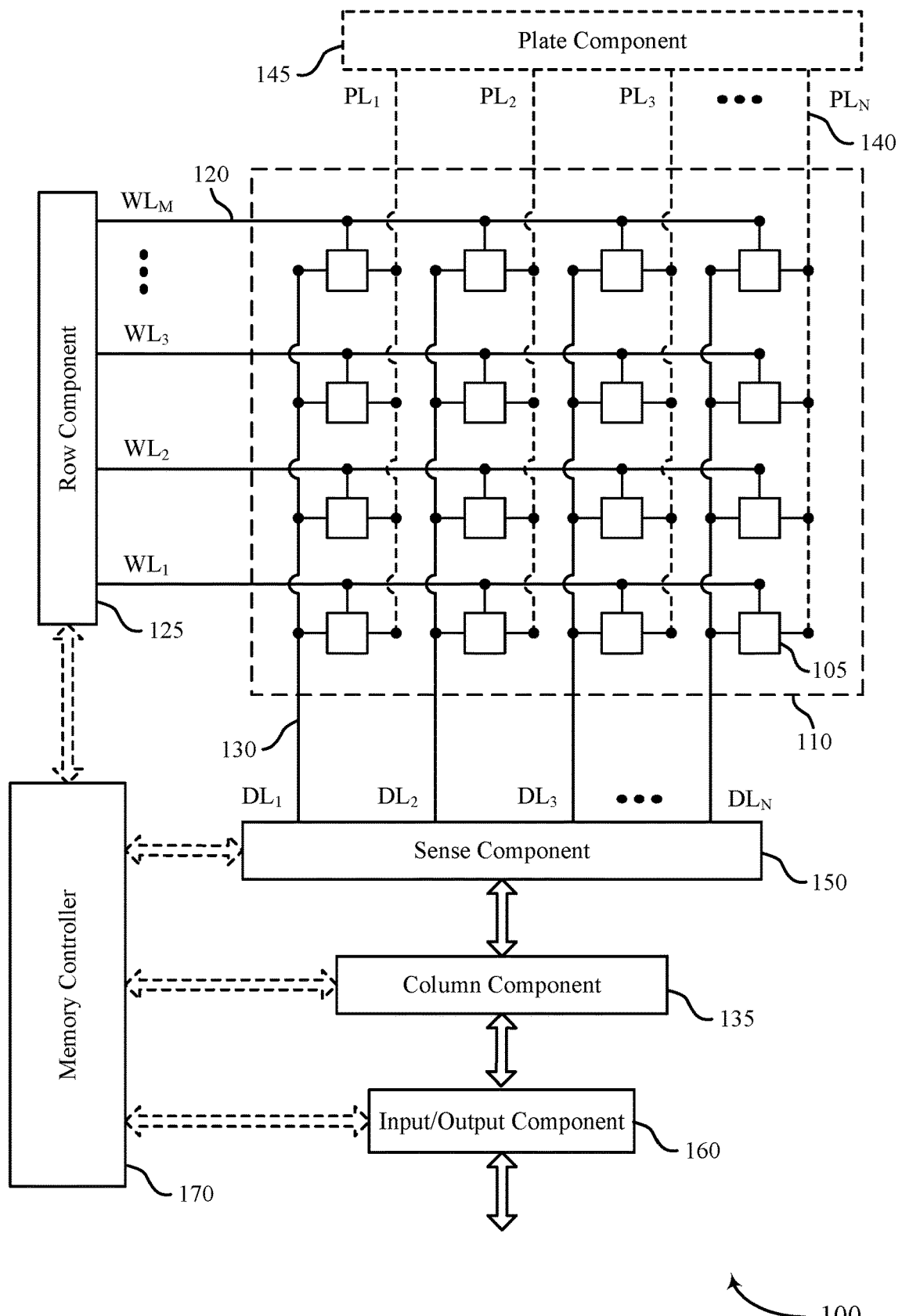
FIG. 1 illustrates an example memory device that supports access schemes for protecting stored data in a memory device in accordance with examples of the present disclosure.

The logic state of non-selected memory cells may be more effectively maintained by performing access schemes for protecting stored data in a memory device in accordance with aspects of the present disclosure. For example, a memory device may include a set of memory cells coupled with or between a digit line and a plate line. Each of the memory cells may include a cell selection component configured to selectively couple the respective one of the memory cells with the digit line. In some examples, each of the cell selection components may be coupled (e.g., at a control node, a control terminal, a selection node, or selection terminal of the cell selection component) with a respective one of a plurality of word lines, which may be used to activate or deactivate the particular cell selection component.

An access operation (e.g., which may include a read operation, a write operation, a rewrite operation, a refresh operation, or a combination thereof) may be performed on a selected one of the memory cells (e.g., a memory cell selected or otherwise identified for the access operation). In some examples, the access operation may be associated with biasing the plate line or the digit line. During the access operation, the cell selection component for the selected memory cell may be activated such that the selected memory cell may be selectively coupled with the digit line and the plate line. Thus, a signal associated with the access operation (e.g., a voltage associated with the access operation, a charge associated with the access operation, a current associated with the access operation) may pass to, from, or through the selected memory cell as a result of the biasing of the digit line or the plate line for the access operation.

Although the cell selection components of non-selected memory cells (e.g., cells not selected or otherwise identified for the access operation) may be deactivated, charge (e.g., leakage charge) may flow through a deactivated cell selection components. For example, when the digit line or plate line is biased at a voltage associated with the access operation on the selected memory cell, a difference in voltage between the digit line or plate line and a non-selected memory cell may cause charge to flow across the deactivated cell selection component and to or from the non-selected memory cell (e.g., during the access operation on the selected memory cell). In some examples, the leakage charge may cause a bias (e.g., a non-zero bias or voltage) across a memory cell that would otherwise have not have such a bias (e.g., a cell that would otherwise have an equalized bias or voltage) across the memory cell. Such a leakage charge or zero bias may accumulate on or from non-selected memory cells in successive access operations, which, in some examples, may cause a loss of data stored in the non-selected memory cells.

In accordance with examples of the present disclosure, operations may be performed after an access operation on a selected memory cell to enable or otherwise support the dissipation of accumulated leakage charge or bias from non-selected memory cells. For example, after an access operation on a selected memory cell, the cell selection component of one or more non-selected memory cells may be activated (e.g., by activating a word line associated with one or more non-selected memory cells). While the cell selection components of non-selected memory cells are activated, the associated digit line and plate line may be coupled with voltage sources that support the dissipation of accumulated leakage charge or bias. For example, the digit line and the plate line may be coupled with a same voltage source, coupled with voltage sources having the same voltage, or coupled with voltage sources having voltages that otherwise support the dissipation of leakage charge or bias accumulated at non-selected memory cells. In some examples, the described operations associated with such a dissipation of leakage charge or bias may be referred to as a dissipation operation or an equalization operation.

The dissipation of leakage charge or bias accumulated at non-selected memory cells from the access operations performed on selected memory cells may prevent or reduce the degradation of a logic state stored by a memory cell. For example, ferroelectric memory cells may operate based on a non-linear polarization behavior (e.g., an ability to store charge in an absence of an applied electrical field). In other words, as one example, a polarized ferroelectric memory storage element may store charge even when no electric field is actively applied across the memory cell (e.g., in an equalized state). Leakage charge or a non-zero bias may cause a degradation or loss of polarization, however, and such a degradation of polarization may be exacerbated by leakage charge or bias accumulating from successive access operations. By performing the dissipation or equalization operations described herein, leakage charge or non-zero bias accumulated at a non-selected ferroelectric memory cell, for example, may be dissipated after an access operation on a selected memory cell, which may mitigate or prevent the accumulation of leakage charge or bias across successive access operations and improve the ability of a memory device to maintain stored data.

Features of the disclosure introduced above are further described with reference to FIGS. 1 through 3 in the context of memory arrays, memory circuits, and memory cell behaviors that support access schemes for protecting stored data in a memory device. Specific examples are then described with reference to FIGS. 4 through 7, which illustrate a particular circuit with associated timing diagrams that support access schemes for protecting stored data in a memory device. Further examples of circuits that may support the described operations are described with reference to FIGS. 8 through 12. These and other features of the disclosure are further described with respect to FIGS. 13 through 17, which illustrate apparatus diagrams, system diagrams, and flowcharts that support access schemes for protecting stored data in a memory device.

FIG. 1 illustrates an example memory device 100 that supports access schemes for protecting stored data in a memory device in accordance with various embodiments of the present disclosure. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states. In some examples, the memory cells 105 may include a capacitive memory element, a ferroelectric memory element, a resistive element, a self-selecting memory element, or a combination thereof. The set of memory cells 105 may be part of a memory array 110 of the memory device 100 (e.g., an array of memory cells 105).

In some examples, a memory cell 105 may store an electric charge representative of the programmable logic states (e.g., storing charge in a capacitor). In one example, a charged and uncharged capacitor may represent two logic states, respectively. In another example, a positively charged and negatively charged capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states (e.g., supporting more than two logic states in a respective memory cell 105). In some examples, such as FeRAM architectures, a memory cell 105 may include a ferroelectric capacitor having a ferroelectric material as an insulating layer between terminals of the capacitor. Different levels of polarization of a ferroelectric capacitor may represent different logic states (e.g., supporting two or more logic states in a respective memory cell 105). Ferroelectric materials have non-linear polarization properties including those discussed in further detail with reference to FIG. 3.

In some examples, a memory cell 105 may include a material portion, which may be referred to as a memory element, a memory storage element, a self-selecting memory element, or a self-selecting memory storage element. The material portion may have a variable and configurable electrical resistance that is representative of different logic states.

For example, a material that can take the form of a crystalline atomic configuration or an amorphous atomic configuration (e.g., able to maintain either a crystalline state or an amorphous state over an ambient operating temperature range of the memory device 100) may have different electrical resistances depending on the atomic configuration. A more-crystalline state of the material (e.g., a single crystal, a collection of a relatively large crystal grains that may be substantially crystalline) may have a relatively low electrical resistance, and may alternatively be referred to as a "SET"

logic state. A more-amorphous state of the material (e.g., an entirely amorphous state, some distribution of relatively small crystal grains that may be substantially amorphous) may have a relatively high electrical resistance, and may alternatively be referred to as a "RESET" logic state. Thus, a voltage applied to such a memory cell 105 may result in different current flow depending on whether the material portion of the memory cell 105 is in the more-crystalline or the more-amorphous state. Accordingly, the magnitude of the current resulting from applying a read voltage to the memory cell 105 may be used to determine a logic state stored by memory cell 105.

In some examples, a memory element may be configured with various ratios of crystalline and amorphous areas (e.g., varying degrees of atomic order and disorder) that may result in intermediate resistances, which may represent different logic states (e.g., supporting two or more logic states in a respective memory cell 105). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored logic state corresponding to an atomic configuration, or combination of atomic configurations.

In some cases, a memory element in a more-amorphous state may be associated with a threshold voltage. In some examples, electrical current may flow through a memory element in the more-amorphous state when a voltage greater than the threshold voltage is applied across the memory element. In some examples, electrical current may not flow through a memory element in the more-amorphous state when a voltage less than the threshold voltage is applied across the memory element. In some cases, a memory element in a more-crystalline state may not be associated with a threshold voltage (e.g., may be associated with a threshold voltage of zero). In some examples, electrical current may flow through a memory element in the more-crystalline state in response to a non-zero voltage across the memory element.

In some cases, a material in both the more-amorphous state and the more-crystalline state may be associated with threshold voltages. For example, self-selecting memory may enhance differences in a threshold voltage of a memory cell between different programmed states (e.g., by way of different compositional distributions). The logic state of a memory cell 105 having such a memory element may be set by heating the memory element to a temperature profile over time that supports forming a particular atomic configuration, or combination of atomic configurations.

A memory device 100 may include a three-dimensional (3D) memory array, where a plurality of two-dimensional (2D) memory arrays (e.g., decks, levels) are formed on top of one another. Such an arrangement may increase the number of memory cells 105 that may be placed or created on a single die or substrate as compared with 2D arrays, which in turn may reduce production costs or increase the performance of a memory device 100, or both. The decks may be separated by an electrically insulating material. Each deck or level may be aligned or positioned so that memory cells 105 may be approximately aligned with one another across each deck, forming a stack of memory cells 105.

In the example of memory device 100, each row of memory cells 105 may be coupled with one of a plurality of first access lines 120 (e.g., a word line (WL), such as one of $WL_1$ through $WL_M$), and each column of memory cells 105 may be coupled with one of a plurality of second access lines 130 (e.g., a digit line (DL), such as one of $DL_1$ through $DL_N$). In some cases, first access lines 120 and second access lines 130 may be substantially perpendicular to one another in the memory device 100 (e.g., when viewing a plane of a deck of the memory device 100, as shown in FIG. 1). References to word lines and bit lines, or their analogues, are interchangeable without loss of understanding or operation.

In general, one memory cell 105 may be located at the intersection of (e.g., coupled with, coupled between) an access line 120 and an access line 130. This intersection may be referred to as an address of a memory cell 105. A target or selected memory cell 105 may be a memory cell 105 located at the intersection of an energized or otherwise selected access line 120 and an energized or otherwise selected access line 130. In other words, an access line 120 and an access line 130 may be energized or otherwise selected to access (e.g., read, write, rewrite, refresh) a memory cell 105 at their intersection. Other memory cells 105 that are in electronic communication with (e.g., connected to) the same access line 120 or 130 may be referred to as untargeted or non-selected memory cells 105.

In some architectures, the logic storing component (e.g., a capacitive memory element, a ferroelectric memory element, a resistive memory element, other memory element) of a memory cell 105 may be electrically isolated from a second access line 130 by a cell selection component. A first access line 120 may be coupled with the cell selection component (e.g., via a control node or terminal of the cell selection component), and may control the cell selection component of the memory cell 105. For example, the cell selection component may be a transistor and the first access line 120 may be coupled with a gate of the transistor (e.g., where a gate node of the transistor may be a control node of the transistor). Activating the first access line 120 of a memory cell 105 may result in an electrical connection or closed circuit between the logic storing component of the memory cell 105 and its corresponding second access line 130. The second access line 130 may then be accessed to read or write the memory cell 105.

In some examples, memory cells 105 may also be coupled with one of a plurality of third access lines 140 (e.g., a plate line (PL), such as one of $PL_1$ through $PL_N$). In some examples, the plurality of third access lines 140 may couple memory cells 105 with one or more voltage sources for various sensing and/or writing operations including those described herein. For example, when a memory cell 105 employs a capacitor for storing a logic state, a second access line 130 may provide access to a first terminal or a first plate of the capacitor, and a third access line 140 may provide access to a second terminal or a second plate of the capacitor (e.g., a terminal associated with an opposite plate of the capacitor as opposed to the first terminal of the capacitor, a terminal otherwise on the opposite side of a capacitance from the first terminal of the capacitor).

The plurality of third access lines 140 may be coupled with a plate component 145, which may control various operations such as activating one or more of the plurality of third access lines 140, or selectively coupling one or more of the plurality of third access lines 140 with a voltage source or other circuit element. Although the plurality of third access lines 140 of the memory device 100 are shown as substantially parallel with the plurality of second access lines 130, in other examples, a plurality of third access lines 140 may be substantially parallel with the plurality of first access lines 120, or in any other configuration.

Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein. In some examples, an electrode may be coupled with (e.g., between) a memory cell 105 and an access line 120, or with (e.g., between) a memory cell 105 and an access line 130. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory device 100.

Access operations such as reading, writing, rewriting, and refreshing may be performed on a memory cell 105 by activating or selecting a first access line 120, a second access line 130, and/or a third access line 140 coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds. Upon selecting a memory cell 105, a resulting signal may be used to determine the logic state stored by the memory cell 105. For example, a memory cell 105 with a capacitive memory element storing a logic state may be selected, and the resulting flow of charge via an access line and/or resulting voltage of an access line may be detected to determine the programmed logic state stored by the memory cell 105.

Accessing memory cells 105 may be controlled through a row component 125 (e.g., a row decoder), a column component 135 (e.g., a column decoder), or a plate component 145 (e.g., a plate driver). For example, a row component 125 may receive a row address from the memory controller 170 and activate the appropriate first access line 120 based on the received row address. Similarly, a column component 135 may receive a column address from the memory controller 170 and activate the appropriate second access line 130. Thus, in some examples, a memory cell 105 may be accessed by activating a first access line 120 and a second access line 130. In some examples, such access operations may be accompanied by a plate component 145 biasing one or more of the third access lines 140, which may be referred to as "moving the plate" of memory cells 105 or the memory array.

In some examples, the memory controller 170 may control the operation (e.g., read operations, write operations, rewrite operations, refresh operations, discharge operations, dissipation operations, equalization operations) of memory cells 105 through the various components (e.g. row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired access line 120 and access line 130. The memory controller 170 may also generate or control various voltages or currents used during the operation of memory device 100. For example, the memory controller 170 may apply a discharge or equalization voltage to one or more of an access line 120, an access line 130, or an access line 140 after accessing one or more memory cells 105.

In general, the amplitude, shape, or duration of an applied voltage, current, or charge may be adjusted or varied, and may be different for the various operations discussed in operating the memory device 100. Further, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105, are set to a single logic state.

A memory cell 105 may be read (e.g., sensed) by a sense component 150 when the memory cell 105 is accessed (e.g., in cooperation with the memory controller 170) to determine a logic state stored by the memory cell 105. For example, the sense component 150 may be configured to sense a current or charge through the memory cell 105, or a voltage resulting from coupling the memory cell 105 with the sense component 150 or other intervening component (e.g., a signal development component between the memory cell 105 and the sense component 150), responsive to a read operation. The sense component 150 may provide an output signal indicative of the logic state stored by the memory cell 105 to one or more components (e.g., to the column component 135, the input/output component 160, the memory controller 170).

In some examples, during or after accessing the memory cell 105, the logic storage portion of memory cell 105 may discharge, or otherwise permit electrical charge or current to flow via its corresponding access lines 120, 130, or 140. Such charge or current may result from biasing, or applying a voltage, to the memory cell 105 from one or more voltage sources or supplies (not shown) of the memory device 100, where such voltage sources or supplies may be part of the row component 125, the column component 135, the plate component 145, the sense component 150, the memory controller 170, or some other component (e.g., a biasing component). In some examples, a discharge of a memory cell 105 may cause a change in the voltage of the access line 130, which the sense component 150 may compare to a reference voltage to determine the stored state of the memory cell 105. In some examples, a voltage may be applied to a memory cell 105 (e.g., using the corresponding access line 120 and access line 130) and the presence of a resulting current may depend on the applied voltage and the resistance state of a memory element of the memory cell 105, which the sense component 150 may use to determine the stored state of the memory cell 105

In some examples, when a read signal (e.g., a read pulse, a read current, a read voltage) is applied across a memory cell 105 with a memory element storing a first logic state (e.g., a SET state, associated with a more-crystalline atomic configuration), the memory cell 105 conducts current due to the read pulse exceeding a threshold voltage of the memory cell 105. In response or based on this, the sense component 150 may therefore detect a current through the memory cell 105 as part of determining the logic state stored by the memory cell 105. When a read pulse is applied to the memory cell 105 with the memory element storing a second logic state (e.g., a RESET state, associated with a more-amorphous atomic configuration), which may occur before or after the application of a read pulse across a memory cell 105 with a memory element storing a first logic state, the memory cell 105 may not conduct current due to the read pulse not exceeding the threshold voltage of the memory cell 105. The sense component 150 may therefore detect little or no current through the memory cell 105 as part of determining the stored logic state.

In some examples, a threshold current may be defined for sensing the logic state stored by a memory cell 105. The threshold current may be set above a current that may pass through the memory cell 105 when the memory cell 105 does not threshold in response to the read pulse, but equal to or below an expected current through the memory cell 105 when the memory cell 105 does threshold in response to the read pulse. For example, the threshold current may be higher than a leakage current of the associated access lines 120, 130, or 140. In some examples, a logic state stored by a memory cell 105 may be determined based on a voltage (e.g., across a shunt resistance) resulting from the current driven by a read pulse. For example, the resulting voltage may be compared relative to a reference voltage, with a resulting voltage less than the reference voltage corresponding to a first logic state and a resulting voltage greater than the reference voltage corresponding to a second logic state.

In some examples, more than one voltage may be applied when reading a memory cell 105 (e.g., multiple voltages may be applied as part of a read operation). For example, if an applied read voltage does not result in current flow, one or more other read voltages may be applied (e.g., until a current is detected by sense component 150). Based on assessing the read voltage that resulted in current flow, the stored logic state of the memory cell 105 may be determined. In some cases, a read voltage may be ramped (e.g., smoothly increasing higher in magnitude) until a current flow or other condition is detected by a sense component 150. In other cases, predetermined read voltages may be applied (e.g., a predetermined sequence of read voltages that increase higher in magnitude in a stepwise manner) until a current is detected. Likewise, a read current may be applied to a memory cell 105 and the magnitude of the voltage to create the read current may depend on the electrical resistance or the total threshold voltage of the memory cell 105.

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set of access lines 130 connected to the sense component 150. For example, a sense component 150 may include a separate sensing circuit (e.g., a separate sense amplifier, a separate signal development component) for each of a set of access lines 130 coupled with the sense component 150, such that a logic state may be separately detected for a respective memory cell 105 coupled with a respective one of the set of access lines 130. In some examples, a reference signal source (e.g., a reference component) or generated reference signal may be shared between components of the memory device 100 (e.g., shared among one or more sense components 150, shared among separate sensing circuits of a sense component 150).

The sense component 150 may be included in a device that includes the memory device 100. For example, the sense component 150 may be included with other read and write circuits, decoding circuits, or register circuits of the memory that may be coupled to the memory device 100. In some examples, the detected logic state of a memory cell 105 may be output through a column component 135 as an output. In some examples, a sense component 150 may be part of a column component 135 or a row component 125. In some examples, a sense component 150 may be connected to or otherwise in electronic communication with a column component 135 or a row component 125.

Although a single sense component 150 is shown, a memory device 100 may include more than one sense component 150. For example a first sense component 150 may be coupled with a first subset of access lines 130 and a second sense component 150 may be coupled with a second subset of access lines 130 (e.g., different from the first subset of access lines 130). In some examples, such a division of sense components 150 may support parallel (e.g., simultaneous) operation of multiple sense components 150. In some examples, such a division of sense components 150 may support matching sense components 150 having different configurations or characteristics to particular subsets of the memory cells 105 of the memory device (e.g., supporting different types of memory cells 105, supporting different characteristics of subsets of memory cells 105, supporting different characteristics of subsets of access lines 130). Additionally or alternatively, two or more sense components 150 may be coupled with a same set of access lines 130 (e.g., for component redundancy). In some examples, such a configuration may support maintaining functionality to overcome a failure or otherwise poor operation of one of the redundant sense components 150. In some examples, such a configuration may support the ability to select one of the redundant sense components 150 for particular operational characteristics (e.g., as related to power consumption characteristics, as related to access speed characteristics for a particular sensing operation, as related to operating memory cells 105 in a volatile mode or a non-volatile mode).

In some memory architectures, accessing the memory cell 105 may degrade or destroy the stored logic state and rewrite or refresh operations may be performed to return the original logic state to memory cell 105. In DRAM or FeRAM, for example, a capacitor of a memory cell 105 may be partially or completely discharged during a sense operation, thereby corrupting the logic state that was stored in the memory cell 105. In PCM, for example, sense operations may cause a change in the atomic configuration of a memory cell 105, thereby changing the resistance state of the memory cell 105. Thus, in some examples, the logic state stored in a memory cell 105 may be rewritten after an access operation. Further, activating a single access line 120, 130, or 140 may result in the discharge of all memory cells 105 coupled with the activated access line 120, 130, or 140. Thus, several or all memory cells 105 coupled with an access line 120, 130, or 140 associated with an access operation (e.g., all cells of an accessed row, all cells of an accessed column) may be rewritten after the access operation.

In some examples, reading a memory cell 105 may be non-destructive. That is, the logic state of the memory cell 105 may not need to be rewritten after the memory cell 105 is read. For example, in non-volatile memory such as PCM, accessing the memory cell 105 may not destroy the logic state and, thus, the memory cell 105 may not require rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write, refresh, or equalization pulse or bias to maintain the stored logic state. Refreshing the memory cell 105 may reduce or eliminate read disturb errors or logic state corruption due to a charge leakage or a change in an atomic configuration of a memory element over time.

A memory cell 105 may also be set, or written, by activating the relevant first access line 120, second access line 130, and/or third access line 140. In other words, a logic state may be stored in the memory cell 105. Row component 125, column component 135, or plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to the capacitor, and then isolating the capacitor (e.g., isolating the capacitor from a voltage source used to write the memory cell 105) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage may be applied across the ferroelectric memory element (e.g., grounding, virtually grounding, or equalizing a voltage across the ferroelectric memory element). In the case of PCM, a memory element may be written by applying a current with a profile that causes (e.g., by way of heating and cooling) the memory element to form an atomic configuration associated with a desired logic state.

In some examples in accordance with the present disclosure, the memory device 100 may include a set of memory cells 105 coupled with or between a second access line 130 and a third access line 140. Each of the memory cells 105 may include a cell selection component configured to selectively couple the respective one of the memory cells 105 with the second access line 130 or the third access line 140. In some examples, each of the cell selection components may be coupled (e.g., at a control node or a control terminal of the respective cell selection component) with a respective one of the first access lines 120, which may be used to activate or deactivate the particular cell selection component.

An access operation, which may include a read operation, a write operation, a rewrite operation, a refresh operation, or a combination thereof, may be performed on a selected one of the memory cells 105. In some examples, the access operation may be associated with biasing the associated second access line 130 or the associated third access line 140. During the access operation, the cell selection component for the selected memory cell 105 may be activated, such that the selected memory cell 105 may be selectively coupled with the second access line 130 and the third access line 140. Thus, a signal associated with the access operation (e.g., a voltage associated with the access operation, a charge associated with the access operation, a current associated with the access operation) may pass to, from, or through the selected memory cell 105 as a result of the biasing of the second access line 130 or the third access line 140 for the access operation.

Although the cell selection components of non-selected memory cells 105 may be deactivated, leakage charge may flow through a deactivated cell selection components. For example, when the associated second access line 130 or third access line 140 is biased at a voltage associated with the access operation on the selected memory cell 105, a difference in voltage between a non-selected memory cell 105 and the second access line 130 or the third access line 140 may cause leakage charge to flow across the deactivated cell selection component to or from the non-selected memory cell 105 (e.g., during the access operation on the selected memory cell). Such a leakage charge may accumulate on non-selected memory cells 105 in successive access operations, or may cause a non-zero bias or voltage to accumulate at the non-selected memory cell. In some examples, such an accumulation of leakage charge or bias may cause a loss of data stored in the non-selected memory cells 105.

In accordance with examples of the present disclosure, operations may be performed after an access operation on a selected memory cell 105 to encourage or otherwise support the dissipation of accumulated leakage charge or bias from non-selected memory cells 105. For example, after an access operation on a selected memory cell 105, the cell selection component of one or more non-selected memory cells 105 may be activated (e.g., by activating a first access line 120 associated with one or more non-selected memory cells). While the cell selection components of non-selected memory cells 105 are activated, the associated second access line 130 and third access line 140 may be coupled with voltage sources that support the dissipation of accumulated leakage charge or voltage bias. For example, the second access line 130 and the third access line 140 may be coupled with a same voltage source, or coupled with voltage sources having the same voltage, or coupled with voltage sources having voltages that otherwise support the dissipation of leakage charge or bias accumulated at non-selected memory cells 105.

In some examples, the described operations associated with such a dissipation of leakage charge or bias may be referred to as a dissipation operation or an equalization operation. By performing the dissipation or equalization operations described herein, leakage charge or voltage bias accumulated at a non-selected memory cell 105 may be dissipated after an access operation on a selected memory cell 105, which may mitigate or prevent the accumulation of leakage charge across successive access operations and improve the ability of the memory device 100 to maintain stored data.

Figure 2:
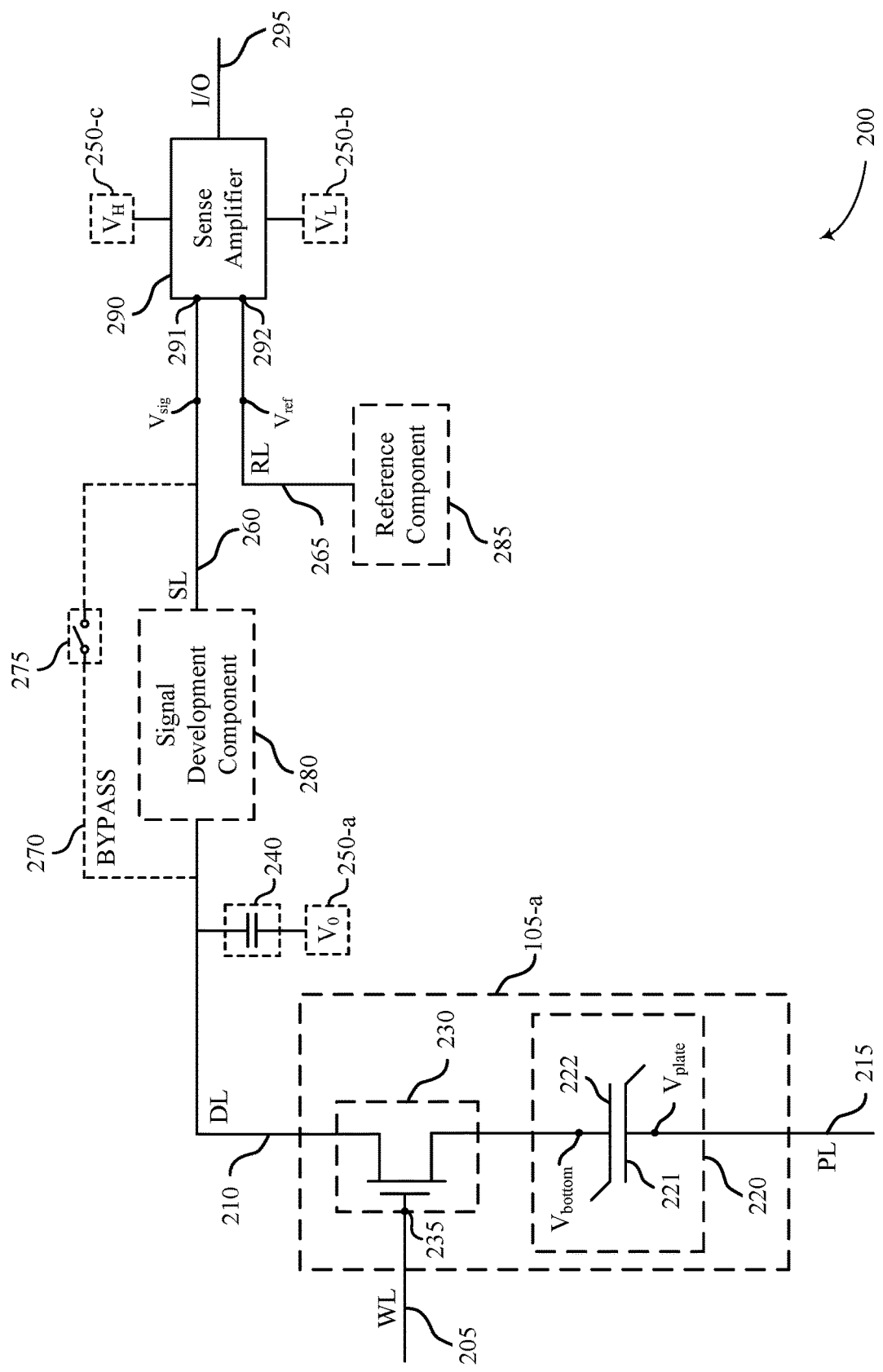
FIG. 2 illustrates an example circuit that supports access schemes for protecting stored data in a memory device in accordance with examples of the present disclosure.

FIG. 2 illustrates an example circuit 200 that supports access schemes for protecting stored data in a memory device in accordance with various embodiments of the present disclosure. Circuit 200 may include a memory cell 105-a, which may be an example of a memory cell 105 described with reference to FIG. 1. Circuit 200 may also include a sense amplifier 290, which may be a portion of a sense component 150 described with reference to FIG. 1. Circuit 200 may also include a word line 205, a digit line 210, and a plate line 215, which, in some examples, may correspond to a first access line 120, a second access line 130, and a third access line 140, respectively, as described with reference to FIG. 1. The circuit 200 may also include a reference line 265 used by the sense amplifier 290 to determine a stored logic state of the memory cell 105-a.

As illustrated in FIG. 2, the sense amplifier 290 may include a first node 291 and a second node 292 which, in some examples, may be coupled with different access lines of a circuit (e.g., a signal line 260 and a reference line 265 of the circuit 200, respectively) or a common access line of a different circuit (not shown). However, other configurations of access lines and/or reference lines are possible in accordance with various embodiments of the present disclosure.

Memory cell 105-a may include a logic storage component (e.g., a memory element), such as a capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The orientation of cell plate 221 and cell bottom 222 may be different (e.g., flipped) without changing the operation of the memory cell 105-a. The cell plate 221 may be accessed via the plate line 215 and cell bottom 222 may be accessed via the digit line 210. As described herein, various logic states may be stored by charging, discharging, and/or polarizing the capacitor 220.

The capacitor 220 may be in electronic communication with the digit line 210, and the stored logic state of the capacitor 220 may be read or sensed by operating various elements represented in circuit 200. For example, the memory cell 105-a may also include a cell selection component 230 which, in some examples, may be referred to as a switching component coupled with an access line (e.g., the digit line 210) and the capacitor 220. In some examples, a cell selection component 230 may be considered to be outside the illustrative boundary of the memory cell 105-a, and the cell selection component may be referred to as a switching component coupled with an access line (e.g., the digit line 210) and the memory cell 105-a.

The capacitor 220 may be selectively coupled with the digit line 210 when cell selection component 230 is activated (e.g., by way of an activating logical signal), and the capacitor 220 can be selectively isolated from digit line 210 when cell selection component 230 is deactivated (e.g., by way of a deactivating logical signal). A logical signal or other selection signal or voltage may be applied to a control node 235 (e.g., a control node, a control terminal, a selection node, a selection terminal) of the cell selection component 230 (e.g., via the word line 205). In other words, the cell selection component 230 may be configured to selectively couple or decouple the capacitor 220 and the digit line 210 based on a logical signal or voltage applied via the word line 205 to the control node 235.

Activating the cell selection component 230 may be referred to as selecting the memory cell 105-a in some examples, and deactivating the cell selection component 230 may be referred to as deselecting the memory cell 105-a in some examples. In some examples, the cell selection component 230 is a transistor and its operation may be controlled by applying an activation voltage to the transistor gate (e.g., a control or selection node or terminal). The voltage for activating the transistor (e.g., the voltage between the transistor gate terminal and the transistor source terminal) may be a voltage greater than the threshold voltage magnitude of the transistor. The word line 205 may be used to activate the cell selection component 230. For example, a selection voltage applied to the word line 205 (e.g., a word line logical signal or a word line voltage) may be applied to the gate of a transistor of cell selection component 230, which may selectively connect the capacitor 220 with the digit line 210 (e.g., providing a conductive path between the capacitor 220 and the digit line 210).

In other examples, the positions of the cell selection component 230 and the capacitor 220 in the memory cell 105-a may be switched, such that cell selection component 230 may be coupled with or between the plate line 215 and the cell plate 221, and the capacitor 220 may be coupled with or between the digit line 210 and the other terminal of the cell selection component 230. In such an embodiment, the cell selection component 230 may remain in electronic communication with the digit line 210 through the capacitor 220. This configuration may be associated with alternative timing and biasing for access operations.

In examples that employ a ferroelectric capacitor 220, the capacitor 220 may or may not fully discharge upon connection to the digit line 210. In various schemes, to sense the logic state stored by a ferroelectric capacitor 220, a voltage may be applied to the plate line 215 and/or the digit line 210, and the word line 205 may be biased (e.g., by activating the word line 205) to select the memory cell 105-a. In some cases, the plate line 215 and/or the digit line 210 may be virtually grounded and then isolated from the virtual ground, which may be referred to as a floating condition, an idle condition, or a standby condition, prior activating the word line 205.

Operation of the memory cell 105-a by varying the voltage to cell plate 221 (e.g., via the plate line 215) may be referred to as "moving the cell plate." Biasing the plate line 215 and/or the digit line 210 may result in a voltage difference (e.g., the voltage of the digit line 210 minus the voltage of the plate line 215) across the capacitor 220. The voltage difference may accompany a change in the stored charge on capacitor 220, where the magnitude of the change in stored charge may depend on the initial state of the capacitor 220 (e.g., whether the initial logic state stored a logic 1 or a logic 0). In some schemes, the change in the stored charge of the capacitor 220 may cause a change in the voltage of the digit line 210, which may be used by the sense component 150-a to determine the stored logic state of the memory cell 105-a.

The digit line 210 may be coupled with additional memory cells 105 (not shown), and the digit line 210 may have properties that result in a non-negligible intrinsic capacitance 240 (e.g., on the order of picofarads (pF)), which may couple the digit line 210 with a voltage source 250-a. The voltage source 250-a may represent a common ground or virtual ground voltage, or the voltage of an adjacent access line of the circuit 200 (not shown). Although illustrated as a separate element in FIG. 2, the intrinsic capacitance 240 may be associated with properties distributed throughout the digit line 210.

In some examples, the intrinsic capacitance 240 may depend on physical characteristics of the digit line 210, including conductor dimensions (e.g., length, width, thickness) of the digit line 210. The intrinsic capacitance 240 may also depend on characteristics of adjacent access lines or circuit components, proximity to such adjacent access lines or circuit components, or insulation characteristics between the digit line 210 and such access lines or circuit components. Thus, a change in voltage of digit line 210 after selecting the memory cell 105-a may depend on the net capacitance of (e.g., associated with) the digit line 210. In other words, as charge flows along the digit line 210 (e.g., to the digit line 210, from the digit line 210), some finite charge may be stored along the digit line 210 (e.g., in the intrinsic capacitance 240, other capacitance coupled with the digit line 210), and the resulting voltage of the digit line 210 may depend on the net capacitance of the digit line 210.

The resulting voltage of the digit line 210 after selecting the memory cell 105-a may be compared to a reference (e.g., a voltage of the reference line 265) by the sense component 150-a to determine the logic state that was stored in the memory cell 105-a. In some examples, a voltage of the reference line 265 may be provided by a reference component 285. In other examples, the reference component 285 may be omitted and a reference voltage may be provided, for example, by accessing the memory cell 105-a to generate the reference voltage (e.g., in a self-referencing access operation). Other operations may be used to support selecting and/or sensing the memory cell 105-a, including operations for supporting access schemes for protecting stored data as described herein.

In some examples, the circuit 200 may include a signal development component 280, which may be an example of a signal development circuit coupled with or between the memory cell 105-a and the sense amplifier 290. The signal development component 280 may amplify or otherwise convert signals of the digit line 210 prior to a sensing operation. The signal development component 280 may include, for example, a transistor, an amplifier, a cascode, or any other charge or voltage converter or amplifier component. In some examples, the signal development component 280 may include a charge transfer sensing amplifier (CTSA). In some examples with a signal development component 280, a line between the sense amplifier 290 and the signal development component 280 may be referred to as a signal line (e.g., signal line 260). In some examples (e.g., examples with or without a signal development component 280), the digit line 210 may connect directly with the sense amplifier 290.

In some examples, the circuit 200 may include a bypass line 270 that may permit selectively bypassing the signal development component 280 or some other signal generation circuit between the memory cell 105-a and the sense amplifier 290. In some examples, the bypass line 270 may be selectively enabled by way of a switching component 275. In other words, when the switching component 275 is activated, the digit line 210 may be coupled with the signal line 260 via the bypass line 270 (e.g., coupling the memory cell 105-a with the sense component 150-a).

In some examples, when the switching component 275 is activated, the signal development component 280 may be selectively isolated from one or both of the digit line 210 or the signal line 260 (e.g., by another switching component or selection component, not shown). When the switching component 275 is deactivated, the digit line 210 may be selectively coupled with the signal line 260 via the signal development component 280. In other examples, a selection component may be used to selectively couple the memory cell 105-a (e.g., the digit line 210) with one of the signal development component 280 or the bypass line 270. Additionally or alternatively, in some examples, a selection component may be used to selectively couple the sense amplifier 290 with one of the signal development component 280 or the bypass line 270. In some examples, a selectable bypass line 270 may support generating a sense signal for detecting a logic state of the memory cell 105-a by using the signal development component 280, and generating a write signal to write a logic state to the memory cell 105-a that bypasses the signal development component 280.

Some examples of a memory device that supports the described access schemes for protecting stored data in the memory device may share a common access line (not shown) between a memory cell 105 and a sense amplifier 290 to support generating a sense signal and a reference signal from the same memory cell 105. In one example, a common access line between a signal development component 280 and a sense amplifier 290 may be referred to as a "common line," an "AMPCAP line," or an "AMPCAP node," and the common access line may take the place of the signal line 260 and the reference line 265 illustrated in circuit 200. In such examples the common access line may be connected to the sense amplifier 290 at two different nodes (e.g., a first node 291 and a second node 292, as described herein). In some examples, a common access line may permit a self-referencing read operation to share, in both a signal generating operation and a reference generating operation, components that may exist between the sense amplifier 290 and a memory cell 105 being accessed. Such a configuration may reduce the sensitivity of the sense amplifier 290 to operational variations of various components in a memory device, such as memory cells 105, access lines (e.g., a word line 205, a digit line 210, a plate line 215), signal development circuits (e.g., signal development component 280), transistors, voltage sources 250, and others.

Although the digit line 210 and the signal line 260 are identified as separate lines, the digit line 210, the signal line 260, and any other lines connecting a memory cell 105 with a sense component 150 may be referred to as a single access line in accordance with the present disclosure. Constituent portions of such an access line may be identified separately for the purposes of illustrating intervening components and intervening signals in various example configurations.

The sense amplifier 290 may include various transistors or amplifiers to detect, convert, or amplify a difference in signals, which may be referred to as latching. For example, the sense amplifier 290 may include circuit elements that receive and compare a sense signal voltage (e.g., $V_{sig}$) at the first node 291 with a reference signal voltage (e.g., $V_{ref}$) at the second node 292. An output of the sense amplifier may be driven to a higher (e.g., a positive) or a lower voltage (e.g., a negative voltage, a ground voltage) based on the comparison at the sense amplifier 290.

For example, if the first node 291 has a lower voltage than the second node 292, the output of the sense amplifier 290 may be driven to a relatively lower voltage of a first sense amplifier voltage source 250-b (e.g., a voltage of $V_L$, which may be a ground voltage substantially equal to $V_0$ or a negative voltage). A sense component 150 that includes the sense amplifier 290 may latch the output of the sense amplifier 290 to determine the logic state stored in the memory cell 105-a (e.g., detecting a logic 0 when the first node 291 has a lower voltage than the second node 292).

If the first node 291 has a higher voltage than the second node 292, the output of the sense amplifier 290 may be driven to the voltage of a second sense amplifier voltage source 250-c (e.g., a voltage of $V_H$). A sense component 150 that includes the sense amplifier 290 may latch the output of the sense amplifier 290 to determine the logic state stored in the memory cell 105-a (e.g., detecting a logic 1 when the first node 291 has a higher voltage than the second node 292). The latched output of the sense amplifier 290, corresponding to the detected logic state of memory cell 105-a, may then be output via one or more input/output (I/O) lines (e.g., I/O line 295), which may include an output through a column component 135 via input/output component 160 described with reference to FIG. 1.

To perform a write operation on the memory cell 105-a, a voltage may be applied across the capacitor 220. Various methods may be used. In one example, the cell selection component 230 may be activated through the word line 205 (e.g., by activating the word line 205) to electrically connect the capacitor 220 to the digit line 210. A voltage may be applied across capacitor 220 by controlling the voltage of the cell plate 221 (e.g., through the plate line 215) and the cell bottom 222 (e.g., through the digit line 210).

For example, to write a logic 0, the cell plate 221 may be taken high (e.g., applying a positive voltage to the plate line 215), and the cell bottom 222 may be taken low (e.g., grounding the digit line 210, virtually grounding the digit line 210, applying a negative voltage to the digit line 210). The opposite process may be performed to write a logic 1, where the cell plate 221 is taken low and the cell bottom 222 is taken high. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220. In some examples, the sense amplifier 290 may be used to perform the write operations, which may include coupling the first sense amplifier voltage source 250-$b$ or the second sense component voltage source 250-$c$ with the digit line. When the sense amplifier 290 is used to perform the write operations, the signal development component 280 may or may not be bypassed (e.g., by applying a write signal via the bypass line 270).

The circuit 200, including the sense amplifier 290, the cell selection component 230, the signal development component 280, or the reference component 285, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., the source terminal and a drain terminal).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In some examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching, and selective conductivity across the transistor may also be a function of varying source and drain voltages. For example, the applied voltage at the gate terminal may have a particular voltage level (e.g., a clamping voltage) that is used to enable conductivity between the source terminal and the drain terminal when the source terminal voltage is below a certain level (e.g., below the gate terminal voltage minus the threshold voltage). When the voltage of the source terminal voltage or drain terminal voltage rises above the certain level, the n-type transistor may be deactivated such that the conductive path between the source terminal and drain terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., the source terminal and a drain terminal).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In some examples where a p-type transistor is employed as a switching component, the voltage of a logical signal applied to the gate terminal may be selected to operate the transistor at a particular working point (e.g., in a saturation region or in an active region).

In some examples, the behavior of a p-type transistor may be more complex than a logical switching by the gate voltage, and selective conductivity across the transistor may also be a function of varying source and drain voltages. For example, the applied voltage at the gate terminal may have a particular voltage level that is used to enable conductivity between the source terminal and the drain terminal so long as the source terminal voltage is above a certain level (e.g., above the gate terminal voltage plus the threshold voltage). When the voltage of the source terminal voltage falls below the certain level, the p-type transistor may be deactivated such that the conductive path between the source terminal and drain terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In some examples, the transistor(s) may be formed on a substrate that is dedicated to a particular component of the circuit 200 (e.g., a substrate for the sense amplifier 290, a substrate for the signal development component 280, a substrate for the memory cell 105-$a$), or the transistor(s) may be formed on a substrate that is common for particular components of the circuit 200 (e.g., a substrate that is common for the sense amplifier 290, the signal development component 280, and the memory cell 105-$a$). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

In some examples in accordance with the present disclosure, an access operation may be performed on a selected memory cell 105 other than the memory cell 105-$a$ that is coupled with the digit line 210. In such an example, the memory cell 105-$a$ may be referred to as a non-selected memory cell. The access operation may be associated with biasing the digit line 210 and the plate line 215. Although the cell selection component 230 of the non-selected memory cells 105-$a$ may be deactivated, leakage charge may flow through the cell selection component 230 (e.g., via the digit line 210). Such a leakage charge may accumulate on the non-selected memory cell 105-$a$, or may cause a bias (e.g., a non-zero voltage) to accumulate across at least some of the non-selected memory cell 105-$a$ which, in some examples, may cause a loss of data stored in at least some of the non-selected memory cells 105.

In accordance with examples of the present disclosure, operations may be performed after an access operation on a selected memory cell 105 to encourage or otherwise support the dissipation of accumulated leakage charge or bias from the non-selected memory cell 105-a. For example, after an access operation on a selected memory cell 105 (not shown), the cell selection component 230 may be activated (e.g., by activating the word line 205). While the cell selection component 230 is activated, the digit line 210 and the plate line 215 may be coupled with voltage sources that support the dissipation of accumulated leakage charge or bias. For example, the digit line 210 and the plate line 215 may be coupled with a same voltage source, or coupled with voltage sources having the same voltage, or coupled with voltage sources having voltages that otherwise support the dissipation of leakage charge or bias accumulated at non-selected memory cell 105-a.

In some examples, the described operations associated with such a dissipation of leakage charge or bias may be referred to as a dissipation operation or an equalization operation. By performing the dissipation or equalization operations described herein, leakage charge or bias accumulated at a non-selected memory cell 105-a may be dissipated after an access operation on a selected memory cell 105, which may mitigate or prevent the accumulation of leakage charge or bias across successive access operations and improve the ability of the memory device 100 to maintain stored data.

Figure 3:
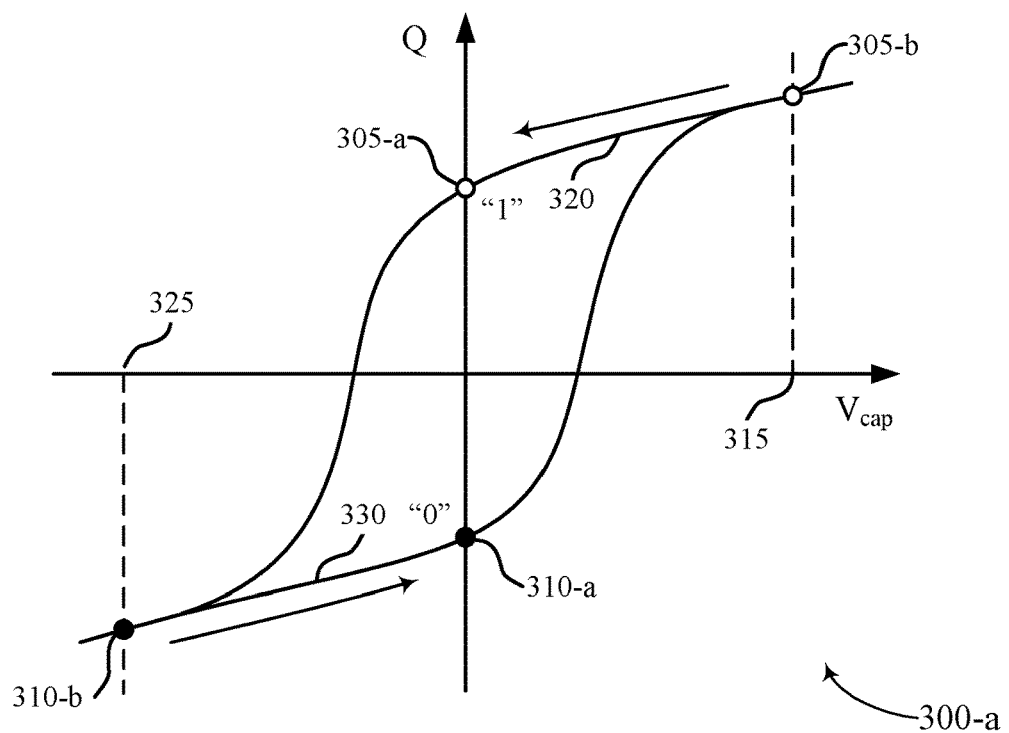
FIG. 3 illustrates an example of non-linear electrical properties with hysteresis plots for a memory cell that supports access schemes for protecting stored data in a memory device in accordance with examples of the present disclosure.
Figure 3:
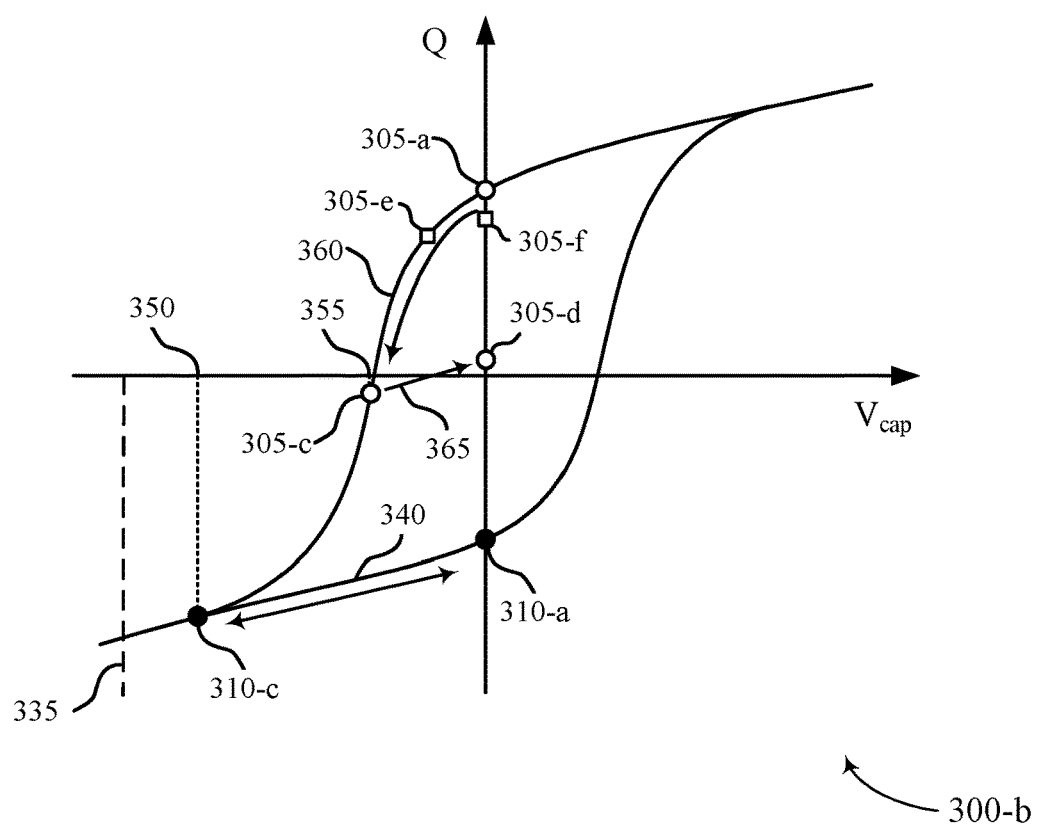

FIG. 3 illustrates an example of non-linear electrical properties with hysteresis plots 300-a and 300-b for a memory cell 105 that supports access schemes for protecting stored data in a memory device in accordance with various embodiments of the present disclosure. The hysteresis plots 300-a and 300-b may illustrate an example writing process and reading process, respectively, for a memory cell 105 employing a ferroelectric capacitor 220 as described with reference to FIG. 2. The hysteresis plots 300-a and 300-b depict the charge, Q, stored on the ferroelectric capacitor 220 as a function of a voltage difference $V_{cap}$, between the terminals of the ferroelectric capacitor 220 (e.g., when charge is permitted to flow into or out of the ferroelectric capacitor 220 according to the voltage difference $V_{cap}$). For example, the voltage difference $V_{cap}$ may represent the difference in voltage between a digit line side of the capacitor 220 and a plate line side of the capacitor 220 (e.g., $V_{bottom} - V_{plate}$).

A ferroelectric material is characterized by a spontaneous electric polarization, where the material may maintain a non-zero electric charge in the absence of an electric field. Examples of ferroelectric materials include barium titanate (BaTiO3), lead titanate (PbTiO3), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors without ferroelectric properties such as those used in conventional DRAM arrays. Employing ferroelectric materials may reduce the need to perform refresh operations as described above for some DRAM architectures, such that maintaining logic states of an FeRAM architecture may be associated with substantially lower power consumption than maintaining logic states of a DRAM architecture.

The hysteresis plots 300-a and 300-b may be understood from the perspective of a single terminal of a ferroelectric capacitor 220. By way of example, if the ferroelectric material has a negative polarization, positive charge accumulates at the associated terminal of the ferroelectric capacitor 220. Likewise, if the ferroelectric material has a positive polarization, a negative charge accumulates at the associated terminal of the ferroelectric capacitor 220.

Additionally, it should be understood that the voltages in the hysteresis plots 300-a and 300-b represent a voltage difference across the capacitor (e.g., an electric potential between the terminals of the ferroelectric capacitor 220) and are directional. For example, a positive voltage may be realized by applying a positive voltage to the perspective terminal (e.g., a cell bottom 222) and maintaining the reference terminal (e.g., a cell plate 221) at ground or virtual ground (or approximately zero volts (0V)). In some examples, a negative voltage may be applied by maintaining the perspective terminal at ground and applying a positive voltage to the reference terminal (e.g., cell plate 221). In other words, positive voltages may be applied to arrive at a negative voltage difference $V_{cap}$ across the ferroelectric capacitor 220 and thereby negatively polarize the terminal in question. Similarly, two positive voltages, two negative voltages, or any combination of positive and negative voltages may be applied to the appropriate capacitor terminals to generate the voltage difference $V_{cap}$ shown in the hysteresis plots 300-a and 300-b.

As depicted in the hysteresis plot 300-a, a ferroelectric material used in a ferroelectric capacitor 220 may maintain a positive or negative polarization when there is no net voltage difference between the terminals of the ferroelectric capacitor 220. For example, the hysteresis plot 300-a illustrates two possible polarization states, a charge state 305-a and a charge state 310-b, which may represent a positively saturated polarization state and a negatively saturated polarization state, respectively. The charge states 305-a and 310-a may be at a physical condition illustrating remnant polarization (Pr) values, which may refer to the polarization (or charge) that remains upon removing the external bias (e.g., voltage). The coercive voltage is the voltage at which the charge or polarization is zero. According to the example of the hysteresis plot 300-a, the charge state 305-a may represent a logic 1 when no voltage difference is applied across the ferroelectric capacitor 220, and the charge state 310-a may represent a logic 0 when no voltage difference is applied across the ferroelectric capacitor 220. In some examples, the logic values of the respective charge states may be reversed to accommodate other schemes for operating a memory cell 105.

A logic 0 or 1 may be written to the memory cell by controlling the electric polarization of the ferroelectric material, and thus the charge on the capacitor terminals, by applying a net voltage difference across the ferroelectric capacitor 220. For example, the voltage 315 may be a voltage equal to or greater than a positive saturation voltage, and applying the voltage 315 across the ferroelectric capacitor 220 may result in charge accumulation until the charge state 305-b is reached (e.g., writing a logic 1). Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between the charge state 305-*b* and the charge state 305-*a* at zero voltage across the capacitor. In other words, charge state 305-*a* may represent a logic 1 state at an equalized voltage across a ferroelectric capacitor 220 that has been positively saturated.

Similarly, voltage 325 may be a voltage equal to or lesser than a negative saturation voltage, and applying the voltage 325 across the ferroelectric capacitor 220 may result in charge accumulation until the charge state 310-*b* is reached (e.g., writing a logic 0). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between the charge state 310-*b* and the charge state 310-*a* at zero voltage across the capacitor. In other words, charge state 310-*a* may represent a logic 0 state at an equalized voltage across a ferroelectric capacitor 220 that has been negatively saturated. In some examples, the voltage 315 and the voltage 325, representing saturation voltages, may have the same magnitude, but opposite polarity across the ferroelectric capacitor 220.

To read, or sense, the stored state of a ferroelectric capacitor 220, a voltage may also be applied across the ferroelectric capacitor 220. In response to the applied voltage, the subsequent charge Q stored by the ferroelectric capacitor changes, and the degree of the change may depend on the initial polarization state, the applied voltages, intrinsic capacitance on access lines, and other factors. In other words, the charge state resulting from a read operation may depend on whether the charge state 305-*a*, or the charge state 310-*a*, or some other charge state was initially stored, among other factors.

The hysteresis plot 300-*b* illustrates an example of access operations for reading stored charge states 305-*a* and 310-*a*. A read voltage 335 may be applied, for example, as a voltage difference via a digit line 210 and a plate line 215 as described with reference to FIG. 2. The hysteresis plot 300-*b* may illustrate read operations where the read voltage 335 is negative voltage difference $V_{cap}$ (e.g., where $V_{bottom}$-$V_{plate}$ is negative). A negative read voltage across the ferroelectric capacitor 220 may be referred to as a "plate high" read operation, where a plate line 215 is taken initially to a high voltage, and a digit line 210 is initially at a low voltage (e.g., a ground voltage). Although the read voltage 335 is shown as a negative voltage across the ferroelectric capacitor 220, in alternative access operations a read voltage may be a positive voltage across the ferroelectric capacitor 220, which may be referred to as a "plate low" read operation.

The read voltage 335 may be applied across the ferroelectric capacitor 220 when a memory cell 105 is selected (e.g., by activating a cell selection component 230 via a word line 205 as described with reference to FIG. 2). Upon applying the read voltage 335 to the ferroelectric capacitor 220, charge may flow into or out of the ferroelectric capacitor 220 via the associated digit line 210 and plate line 215, and different charge states may result depending on whether the ferroelectric capacitor 220 was at the charge state 305-*a* (e.g., a logic 1) or at the charge state 310-*a* (e.g., a logic 0), or some other charge state.

When performing a read operation on a ferroelectric capacitor 220 at the charge state 310-*a* (e.g., a logic 0), additional negative charge may accumulate across the ferroelectric capacitor 220, and the charge state may follow path 340 until reaching the charge and voltage of the charge state 310-*c*. The amount of charge flowing through the capacitor 220 may be related to the intrinsic capacitance of the digit line 210 (e.g., intrinsic capacitance 240 described with reference to FIG. 2).

Accordingly, as shown by the transition between the charge state 310-*a* and the charge state 310-*c*, the resulting voltage 350 across the ferroelectric capacitor 220 may be a relatively large negative value due to the relatively large change in voltage for the given change in charge. Thus, upon reading a logic 0 in a "plate high" read operation, the digit line voltage, equal to the sum of $V_{PL}$ and the value of ($V_{bottom}$-$V_{plate}$) at the charge state 310-*c*, may be a relatively low voltage. Such a read operation may not change the remnant polarization of the ferroelectric capacitor 220 that stored the charge state 310-*a*, and thus after performing the read operation the ferroelectric capacitor 220 may return to the charge state 310-*a* via path 340 when the read voltage 335 is removed (e.g., by applying a zero net voltage across the ferroelectric capacitor 220, by equalizing the voltage across the ferroelectric capacitor 220). Thus, performing a read operation with a negative read voltage on a ferroelectric capacitor 220 with a charge state 310-*a* may be considered a non-destructive read process.

When performing the read operation on the ferroelectric capacitor 220 at the charge state 305-*a* (e.g., a logic 1), the stored charge may reverse polarity as a net negative charge accumulates across the ferroelectric capacitor 220, and the charge state may follow the path 360 until reaching the charge and voltage of the charge state 305-*c*. The amount of charge flowing through the ferroelectric capacitor 220 may again be related to the intrinsic capacitance of the digit line 210 (e.g., intrinsic capacitance 240 described with reference to FIG. 2). Accordingly, as shown by the transition between the charge state 305-*a* and the charge state 305-*c*, the resulting voltage 355 may, in some cases, be a relatively small negative value due to the relatively small change in voltage for the given change in charge. Thus, upon reading a logic 1 in a "plate high" read operation, the digit line voltage, equal to plate, the sum of $V_{PL}$ and the value of ($V_{bottom}$-$V_{plate}$) at the charge state 305-*c*, may be a relatively high voltage.

In some examples, a read operation with a negative read voltage (e.g., read voltage 335) may result in a reduction or a reversal of remnant polarization of the capacitor 220 that stored the charge state 305-*a*. In other words, according to the properties of the ferroelectric material, after performing the read operation the ferroelectric capacitor 220 may not return to the charge state 305-*a* when the read voltage 335 is removed (e.g., by applying a zero net voltage across the ferroelectric capacitor 220, by equalizing the voltage across the ferroelectric capacitor 220). Rather, when applying a zero net voltage across the ferroelectric capacitor 220 after a read operation with read voltage 335, the charge state may follow path 365 from the charge state 305-*c* to the charge state 305-*d*, illustrating a net reduction in polarization magnitude (e.g., a less positively polarized charge state than initial charge state 305-*a*, illustrated by the difference in charge between the charge state 305-*a* and the charge state 305-*d*). Thus, performing a read operation with a negative read voltage on a ferroelectric capacitor 220 with a charge state 305-*a* may be described as a destructive read process. However, in some sensing schemes, a reduced remnant polarization may still be read as the same stored logic state as a saturated remnant polarization state (e.g., supporting detection of a logic 1 from both the charge state 305-*a* and the charge state 305-*d*), thereby providing a degree of non-volatility for a memory cell 105 with respect to read operations.

The transition from the charge state 305-*a* to the charge state 305-*d* may be illustrative of a sensing operation that is associated with a partial reduction and/or partial reversal in polarization of a ferroelectric capacitor 220 of a memory cell 105 (e.g., a reduction in the magnitude of charge Q from the charge state 305-*a* to the charge state 305-*d*). In some examples, the amount of change in polarization of a ferroelectric capacitor 220 of a memory cell 105 as a result of a sensing operation may be selected according to a particular sensing scheme. In some examples, sensing operations having a greater change in polarization of a ferroelectric capacitor 220 of a memory cell 105 may be associated with relatively greater robustness in detecting a logic state of a memory cell 105. In some sensing schemes, sensing a logic 0 of a ferroelectric capacitor 220 at the charge state 305-*a* may result in a full reversal of polarization, with the ferroelectric capacitor 220 transitioning from the charge state 305-*a* to the charge state 310-*a* after the sensing operation.

The position of the charge state 305-*c* and the charge state 310-*c* after initiating a read operation may depend on a number of factors, including the specific sensing scheme and circuitry. In some cases, the final charge may depend on the net capacitance of the digit line 210 coupled with the memory cell 105, which may include an intrinsic capacitance 240, integrator capacitors, and others. For example, if a ferroelectric capacitor 220 is electrically coupled with digit line 210 at 0V and the read voltage 335 is applied to the plate line, the voltage of the digit line 210 may rise when the memory cell 105 is selected due to charge flowing from the ferroelectric capacitor 220 to the net capacitance of the digit line 210. Thus, a voltage measured at a sense component 150 may not be equal to the read voltage 335, or the resulting voltages 350 or 355, and instead may depend on the voltage of the digit line 210 following a period of charge sharing.

The position of the charge state 305-*c* and the charge state 310-*c* on hysteresis plot 300-*b* upon initiating a read operation may depend on the net capacitance of the digit line 210 and may be determined through a load-line analysis. In other words, the charge states 305-*c* and 310-*c* may be defined with respect to the net capacitance of the digit line 210. As a result, the voltage of the ferroelectric capacitor 220 after initiating a read operation (e.g., voltage 350 when reading the ferroelectric capacitor 220 that stored the charge state 310-*a*, voltage 355 when reading the ferroelectric capacitor 220 that stored the charge state 305-*a*), may be different and may depend on the initial state of the ferroelectric capacitor 220.

The initial state of the ferroelectric capacitor 220 may be determined by comparing the voltage of a digit line 210 (or signal line 260, where applicable) resulting from the read operation with a reference voltage (e.g., via a reference line 265 as described with reference to FIG. 2, or via a common access line). In some examples, the digit line voltage may be the sum of the plate line voltage and the final voltage across the ferroelectric capacitor 220 (e.g., voltage 350 when reading the ferroelectric capacitor 220 having a stored the charge state 310-*a,* or voltage 355 when reading the ferroelectric capacitor 220 having a stored the charge state 305-*a*). In some examples, the digit line voltage may be the difference between the read voltage 335 and the final voltage across the capacitor 220 (e.g., (read voltage 335-voltage 350) when reading the ferroelectric capacitor 220 having a stored the charge state 310-*a,* (read voltage 335-voltage 355) when reading the ferroelectric capacitor 220 having a stored the charge state 305-*a*).

In some sensing schemes, a reference voltage may be generated such that the reference voltage is between the possible voltages that may result from reading different logic states. For example, a reference voltage may be selected to be lower than the resulting digit line voltage when reading a logic 1, and higher than the resulting digit line voltage when reading a logic 0. In other examples, a comparison may be made at a portion of a sense component 150 that is different from a portion where a digit line is coupled, and therefore a reference voltage may be selected to be lower than the resulting voltage at the comparison portion of the sense component 150 when reading a logic 1, and higher than the resulting voltage at the comparison portion of the sense component 150 when reading a logic 0. During comparison by the sense component 150, the voltage based on the sensing may be determined to be higher or lower than the reference voltage, and the stored logic state of the memory cell 105 (e.g., a logic 0, a logic 1) may thus be determined.

During a sensing operation, the resulting signals from reading various memory cells 105 may be a function of manufacturing or operational variations between the various memory cells 105. For example, capacitors of various memory cells 105 may have different levels of capacitance or saturation polarization, so that a logic 1 may be associated with different levels of charge from one memory cell to the next, and a logic 0 may be associated with different levels of charge from one memory cell to the next. Further, intrinsic capacitance (e.g., intrinsic capacitance 240 described with reference to FIG. 2) may vary from one digit line 210 to the next digit line 210 in a memory device, and may also vary within a digit line 210 from the perspective of one memory cell 105 to the next memory cell 105 on the same digit line. Thus, for these and other reasons, reading a logic 1 may be associated with different levels of digit line voltage from one memory cell to the next (e.g., resulting voltage 350 may vary from reading one memory cell 105 to the next), and reading a logic 0 may be associated with different levels of digit line voltage from one memory cell to the next (e.g., resulting voltage 355 may vary from reading one memory cell 105 to the next).

In some examples, a reference voltage may be provided between a statistical average of voltages associated with reading a logic 1 and a statistical average of voltages associated with reading a logic 0, but the reference voltage may be relatively closer to the resulting voltage of reading one of the logic states for any given memory cell 105. The minimum difference between a resulting voltage of reading a particular logic state (e.g., as a statistical value for reading a plurality of memory cells 105 of a memory device) and an associated level of a reference voltage may be referred to as a "minimum read voltage difference," and having a low minimum read voltage difference may be associated with difficulties in reliably sensing the logic states of memory cells in a given memory device.

In some examples, a sense component 150 may be designed to employ self-referencing techniques, where a memory cell 105 itself is involved in providing a reference signal when reading the memory cell 105. However, when using the same memory cell 105 for providing both a sense signal and a reference signal, the sense signal and the reference signal may be substantially identical when performing access operations that do not change a state stored by the memory cell 105. For example, when performing a self-referencing read operation on a memory cell 105 storing a logic 1 (e.g., storing a charge state 310-*a*), a first access operation that may include applying the read voltage 335 may follow path 340, and a second operation that may also include applying the read voltage 335 may also follow path 340, and the first and second access operations may result in substantially the same access signals (e.g., from the perspective of the memory cell 105). In such cases, when employing a sense component 150 that relies on a difference between a sense signal and a reference signal to detect a logic state stored by the memory cell 105, some other portion of a memory device may provide such a difference in the event that access operations might provide substantially equal sense and reference signals.

In some examples in accordance with the present disclosure, a cell selection component of a non-selected memory cell 105 may be deactivated, but leakage charge may nonetheless flow through the deactivated cell selection components during an access operation associated with a different, selected memory cell 105. In an example of a ferroelectric memory cell 105, the leakage charge or bias may accumulate at a ferroelectric capacitor 220 of the non-selected memory cell 105, which may alter the polarization of the ferroelectric capacitor 220.

For example, when the ferroelectric capacitor 220 of a non-selected memory cell 105 is at a charge state 305-*a* (e.g., storing a logic 1), leakage charge associated with an access operation on a selected memory cell 105 (e.g., a plate high read operation for a selected memory cell 105, a write operation associated with writing a logic 0 on a selected memory cell 105) may cause the charge state of the non-selected memory cell 105 to follow at least a portion of the path 360. In some examples, a first access operation on a selected memory cell may cause the ferroelectric capacitor 220 of a non-selected memory cell to reach the charge state 305-*e* (e.g., accumulating leakage charge illustrated by the change in charge Q from charge state 305-*a* to charge state 305-*e*, accumulating a bias illustrated by the change in voltage $V_{cap}$ from charge state 305-*a* to charge state 305-*e*). However, in the event that the non-selected memory cell 105 remains as non-selected for subsequent access operations for selected memory cells (e.g., a same selected memory cell, one or more different selected memory cells), the non-selected memory cell 105 may continue along the path 360 as leakage charge or bias continues to accumulate, until reaching charge state 305-*c*, for example.

The charge state 305-*c* may represent a substantial loss of polarization, which may be represented by the difference in stored charge between the charge state 305-*a* and the charge state 305-*d*. In other words, if the voltage across the non-selected memory cell 105 is equalized after a set of access operations for selected memory cells other than the non-selected memory cell 105, the non-selected memory cell 105 may follow the path 365 to the charge state 305-*d*, illustrating a substantially lower polarization or charge than the charge state 305-*a*. In some examples, this loss of charge or polarization may be associated with a charge state that is indeterminate regarding one logic state or another. In some examples, a charge state may become indeterminate if a polarization has decreased more than 30% from a saturated polarization state (e.g., less than 70% of the charge Q associated with the charge state 305-*a*). Thus, in some examples, the transition between charge state 305-*a* and charge state 305-*d* (e.g., via charge state 305-*c*) as a result of an accumulation of leakage charge or bias may represent a loss of data from such leakage charge.

In accordance with examples of the present disclosure, operations may be performed after an access operation on a selected memory cell 105 to encourage or otherwise support the dissipation of leakage charge or bias from non-selected memory cells 105, which may reduce or eliminate data loss that may otherwise result from an accumulation of leakage charge or bias. For example, after a first access operation on a selected memory cell 105, the charge state of the non-selected memory cell 105 may follow the path 360 from the charge state 305-*a* to the charge state 305-*e* as a result of leakage charge caused by the first access operation. Following the first access operation, a cell selection component 230 of the non-selected memory cells 105 may be activated (e.g., by activating a word line 205 associated with the non-selected memory cell 105).

While the cell selection component 230 of the non-selected memory cell 105 is activated, the associated digit line 210 and plate line 215 may be coupled with voltage sources that support the dissipation of accumulated leakage charge or bias. For example, the associated digit line 210 and plate line 215 may be coupled with a same voltage source, or coupled with voltage sources having the same voltage, or coupled with voltage sources having voltages that otherwise support the dissipation of leakage charge or bias accumulated at non-selected memory cells 105. In other words, in some examples, a zero voltage or equalized voltage may be applied across the non-selected memory cell 105, which may cause the non-selected memory cell 105 to transition from the charge state 305-*e* to the charge state 305-*f* (e.g., at a zero capacitor voltage $V_{cap}$).

The charge state 305-*f* may represent a relatively small loss of polarization, which may be represented by the difference in stored charge between the charge state 305-*a* and the charge state 305-*f*. In some examples, this relatively small loss of charge or polarization may be associated with a charge state that remains determinate as to whether the associated memory cell stores one logic state or another. In other words, in some examples, a logic 1 may be detected for a ferroelectric capacitor 220 at the charge state 305-*a* or 305-*f*. Thus, in some examples, the transition between charge state 305-*a* and charge state 305-*f* as a result of an accumulation of leakage charge or bias from the first access operation may represent data being maintained despite such leakage charge or bias. In some examples, a charge state may be determinate (e.g., may still represent a state that is detectible for a particular logic state) so long as the polarization is within 30% of a saturated polarization state.

In some examples, subsequent access operations may be performed in which the non-selected memory cell 105 stores the charge state 305-*f*. In such examples, the non-selected memory cell 105-*a* may alternate between the charge states 305-*f* and 305-*e* as a result of a subsequent access operation on a selected memory cell 105, and a subsequent equalization or discharge operation, respectively. Accordingly, by performing the dissipation or equalization operations described herein, leakage charge or bias accumulated at a non-selected memory cell 105 may be dissipated after various access operation on a selected memory cell 105. Such dissipation or equalization may mitigate or prevent the accumulation of leakage charge or bias across successive access operations and improve the ability of the memory device 100 to maintain stored data.

Figure 4:
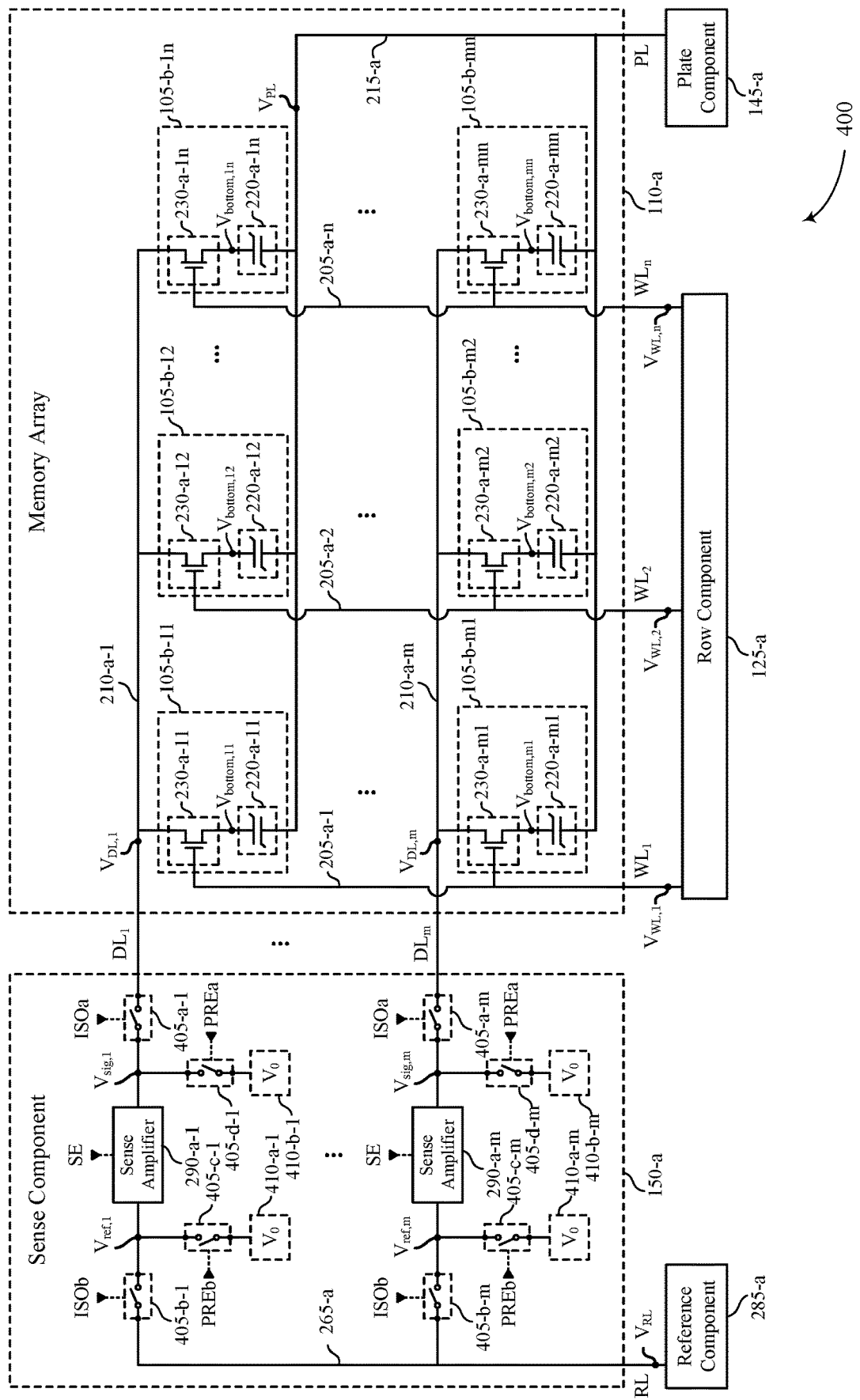
FIG. 4 illustrates an example of a circuit that supports access schemes for protecting stored data in a memory device in accordance with examples of the present disclosure.

FIG. 4 illustrates an example of a circuit 400 that supports access schemes for protecting stored data in a memory device in accordance with various embodiments of the present disclosure. Components of the circuit 400 may be examples of the corresponding components described with reference to FIGS. 1 through 3.

The circuit 400 may include a memory array 110-*a* including a set of memory cells 105-*b* (e.g., memory cells 105-*b*-11 through 105-*b*-*mn*). Each of the memory cells 105-*b* may be coupled with a word line 205-*a* (e.g., one of word lines 205-*a*-1 through 205-*a*-*n*), a digit line 210 (e.g., one of digit lines 210-*a*-1 through 210-*a*-*m*), and a plate line 215-*a*. Although illustrated as including a common plate line 215-*a*, some examples of a circuit 400 may include a separate plate line 215-*a* for each row of memory cells 105-*b* (e.g., an independently accessible plate line 215-*a* associated with each of the word lines 205-*a*) or separate plate lines 215-*a* for each column of memory cells 105-*b* (e.g., an independently accessible plate line 215-*a* associated with each of the digit lines 210-*a*). According to an example illustrated by circuit 400, memory cells 105-*b*-11 through 105-*b*-1*n* may represent a set of memory cells 105 coupled with or between a digit line (e.g., digit line 210-*a*-1) and a plate line (e.g., plate line 215-*a*). According to another example illustrated by circuit 400, memory cells 105-*b*-*m*1 through 105-*b*-*mn* may represent a set of memory cells 105 coupled with or between a different digit line (e.g., digit line 210-*a*-*m*) and a plate line (e.g., plate line 215-*a*)

Each of the word lines 205-*a* (e.g., each of the word lines $WL_1$ through $WL_n$) may be associated with a respective word line voltage $V_{WL}$ as illustrated, and may be coupled with a row component 125-*a*. The row component 125-*a* may couple one or more of the word lines 205-*a* with various voltage sources (not shown). In one example, the row component 125-*a* may selectively couple one or more of the word lines 205-*a* with a voltage source having a relatively high voltage (e.g., a selection voltage, which may be a voltage greater than 0V) or a voltage source having a relatively low voltage (e.g., a deselection voltage, which may be a ground voltage of 0V, or a negative voltage). In another example, the row component 125-*a* may couple one or more of the word lines 205-*a* with one of three voltage sources. In some examples, a first voltage source may have an idle or standby voltage (e.g., a ground voltage, a relatively small positive voltage), a second voltage source may have a selection voltage (e.g., a positive voltage greater than a ground voltage, a relatively large positive voltage), and a third voltage source may have a deselection voltage (e.g., a ground voltage, a negative voltage). Some examples may further include a word line equalization voltage source to support various operations, which may be a fourth voltage source. Other examples are possible in accordance with the present disclosure.

Each of the digit lines 210-*a* (e.g., each of the digit lines $DL_1$ through $DL_m$) may be associated with a respective digit line voltage $V_{DL}$ as illustrated, and may be coupled with a sense component 150-*a*. In the example of circuit 400, each of the digit lines 210-*a* are illustrated as direct connections between the memory array 110-*a* and the sense component 150-*a* (e.g., directly coupling the memory array 110-*a* with the sense component 150-*a*). In other examples of circuits that support the described access schemes for protecting stored data in a memory device, additional components or elements may be coupled with or between the memory array 110-*a* and the sense component 150-*a*, including an intrinsic capacitance 240, one or more signal development components 280, or one or more bypass lines 270, as described with reference to FIG. 2. In some examples, the circuit 400 may also include a set of signal lines $SL_1$ through $SL_m$, as described with reference to FIG. 2.

Each of the one or more plate lines 215-*a* (e.g., plate line PL) may associated with a respective plate line voltage $V_{PL}$ as illustrated, and may be coupled with a plate component 145-*a*. The plate component 145-*a* may couple one or more plate lines 215-*a* with various voltage sources (not shown). In one example, the plate component 145-*a* may selectively couple one or more plate lines 215-*a* with a voltage source having a relatively high voltage (e.g., a plate high voltage, which may be a voltage greater than 0V) or a voltage source having a relatively low voltage (e.g., a plate low voltage, which may be a ground voltage of 0V, or a negative voltage).

The row component 125-*a*, the sense component 150-*a*, and the plate component 145-*a* may be configured to support various access operations (e.g., read operations, write operations, rewrite operations, refresh operations, dissipation operations, equalization operations). For example, the row component 125-*a* may be configured to activate or otherwise apply a voltage to particular word lines 205-*a*. In some examples, activating a word line 205-*a* may activate the cell selection component 230-*a* for one or more of the memory cells 105-*b* that are coupled with the respective word line 205-*a*. The sense component 150-*a* may include a set of sense amplifiers 290-*a* configured to detect a logic state stored by the memory cells 105-*b*. In some examples, the sense amplifiers 290-*a* may detect a logic state stored by comparing a respective digit line voltage $V_{DL}$ with a reference line voltage $V_{RL}$, which may be provided to the sense component 150-*a* by a reference component 285-*a*. The plate component 145-*a* may be configured to activate or otherwise apply a voltage to particular one or more of the plate lines 215-*a*. In some examples, operations associated with the row component 125-*a*, the sense component 150-*a*, the plate component 145-*a*, or the reference component 285-*a* may be controlled at least in part by a memory controller 170 (not shown).

In the example of circuit 400, each of the memory cells 105-*b* may include a respective capacitor 220-*a* and a respective cell selection component 230-*a*. A voltage at a point (e.g., a node, a terminal) between the respective capacitor 220-*a* and the respective cell selection component 230-*a* may be identified as a respective $V_{bottom}$, as illustrated throughout the circuit 400. In some examples, one or more of the capacitors 220-*a* may be ferroelectric capacitors 220 as described herein.

In the example of circuit 400, the sense component 150-*a* may include a separate sense amplifier 290-*a* associated with each of the digit lines 210-*a*. Each of the sense amplifiers 290-*a* may be coupled with other portions of a memory device, such as a column component 135, an input/output component 160, or a memory controller 170 (e.g., via one or more I/O lines 295, not shown). Each of the sense amplifiers 290-*a* may be associated with a respective signal voltage $V_{sig}$ and a respective reference voltage $V_{ref}$, as illustrated. Each of the sense amplifiers 290-*a* may be coupled with a first sense amplifier voltage source (e.g., having a voltage of $V_L$, which may be a ground voltage substantially equal to $V_0$ or a negative voltage), and coupled with a second sense amplifier voltage source (e.g., having a voltage of $V_H$, which may be greater than the voltage of $V_L$), as described with reference to FIG. 2

The sense component 150-*a* may, in some examples, be used to latch signals associated with a read operation when detecting a logic state stored by memory cells 105-*b*. Electrical signals associated with such latching may be communicated between the sense component 150-*a* (e.g., a sense amplifier 290-*a*) and an input/output component 160, for example, via I/O lines 295 (not shown). In some examples, the sense component 150-*a* may be in electronic communication with a memory controller (not shown), such as a memory controller 170 described with reference to FIG. 1, which may control various operations of the sense component 150-*a*. In some examples, activating logical signal SE may be referred to as "enabling" or "activating" the sense component 150-*a*. In some examples, activating logical signal SE may be referred to, or be part of an operation known as "latching" the result of accessing memory cells 105.

In the example of circuit 400, each of the sense amplifiers 290-a may be selectively coupled or decoupled with various portions of the circuit 400 by various switching components 405. In some examples, each of the sense amplifiers 290-a may include a switching component 405-a, which may be used to selectively couple or decouple the respective sense amplifier 290-a and a respective digit line 210-a (e.g., by activating or deactivating a logical signal ISOa). In some examples, each of the sense amplifiers 290-a may include a switching component 405-b, which may be used to selectively couple or decouple the respective sense amplifier 290-a and a reference source, such as the reference component 285-a (e.g., by activating or deactivating a logical signal ISOb).

In some examples, each of the sense amplifiers 290-a may include a switching component 405-c, which may be used to selectively couple or decouple the respective sense amplifier 290-a and a respective equalization voltage source 410-a (e.g., by activating or deactivating a logical signal PREb). In some examples, each of the sense amplifiers 290-a may include a switching component 405-d, which may be used to selectively couple or decouple the respective sense amplifier 290-a and a respective equalization voltage source 410-b (e.g., by activating or deactivating a logical signal PREa). In some examples, the voltage sources 410-a or 410-b may represent a common grounding point (e.g., a chassis ground, a neutral point), which may be associated with a common reference voltage having a voltage $V_0$, from which other voltages are defined. Although each of the equalization voltage sources 410-a and 410-b are illustrated as having the same voltage (e.g., $V_0$), in other examples, the voltage of any one or more of the voltage sources 410-a or 410-b may be different.

Any one or more of the logical signals (e.g., ISOa, ISOb, PRE, or SE) illustrated in circuit 400 may be provided by a memory controller (not shown), such as a memory controller 170 described with reference to FIG. 1. Although certain switching components 405 are illustrated as sharing common logical signals, any of the switching components 405 may be activated or deactivated by a logical signal that is specific to a given switching component 405 (e.g., a logical signal specific to a particular one of the digit lines 210-a).

In some examples, each of the switching components 405-a may be activated or deactivated by a same logical signal (e.g., ISOa), or any one or more of the switching components 405-a may be activated or deactivated by a logical signal that is different from another of the switching components 405-a. In some examples, each of the switching components 405-b may be activated or deactivated by the same logical signal (e.g., ISOb), or any one or more of the switching components 405-b may be activated or deactivated by a logical signal that is different from another of the switching components 405-b.

In some examples, each of the switching components 405-c may be activated or deactivated by the same logical signal (e.g., PREb), or any one or more of the switching components 405-c may be activated or deactivated by a logical signal that is different from another of the switching components 405-c. In some examples, each of the switching components 405-d may be activated or deactivated by the same logical signal (e.g., PREa), or any one or more of the switching components 405-d may be activated or deactivated by a logical signal that is different from another of the switching components 405-d.

Although circuit 400 is illustrated with a separate reference voltage source (e.g., reference component 285-a), other embodiments or configurations that support the described access schemes for protecting stored data in a memory device may employ a self-referencing access scheme, where a reference voltage for reading a respective memory cell 105-b may be provided at least in part by accessing the respective memory cell 105-b (e.g., in a subsequent operation). In such examples, the memory cell 105-b may be coupled with a reference node of the respective sense amplifier 290-a. In other words, to support a self-referencing scheme, in some examples, a respective digit line 210-a may be coupled with both a respective switching component 405-a and a respective switching component 405-b of the sense component 150-a.

Although the memory array 110-a and the sense component 150-a are illustrated with respective dashed lines as reflecting particular boundaries, such boundaries are shown for illustrative purposes only. In other words, one or both of the memory array 110-a and the sense component 150-a in accordance with the present disclosure may have boundaries different than the dashed boundaries shown in the circuit 400, and accordingly may include more or fewer components than illustrated in the example of FIG. 4. In some cases, although voltage sources 410-a or 410-b may be coupled with common voltage supplies and/or grounding points, the voltage at each of the voltage sources 410-a or 410-b coupled with a common voltage supply or common grounding point may be different due to various differences in the circuit 400 (e.g., conductor length, conductor width, conductor resistance, conductor or other capacitance) between the respective voltage sources 410-a or 410-b and the associated common voltage supply or common grounding point.

The circuit 400 may be illustrative of components that may support various access schemes for protecting stored data in a memory device. For example, the circuit 400 may be operated according to any one or more of the timing diagrams 500, 600, or 700 described with reference to FIGS. 5, 6, and 7.

Figure 5:
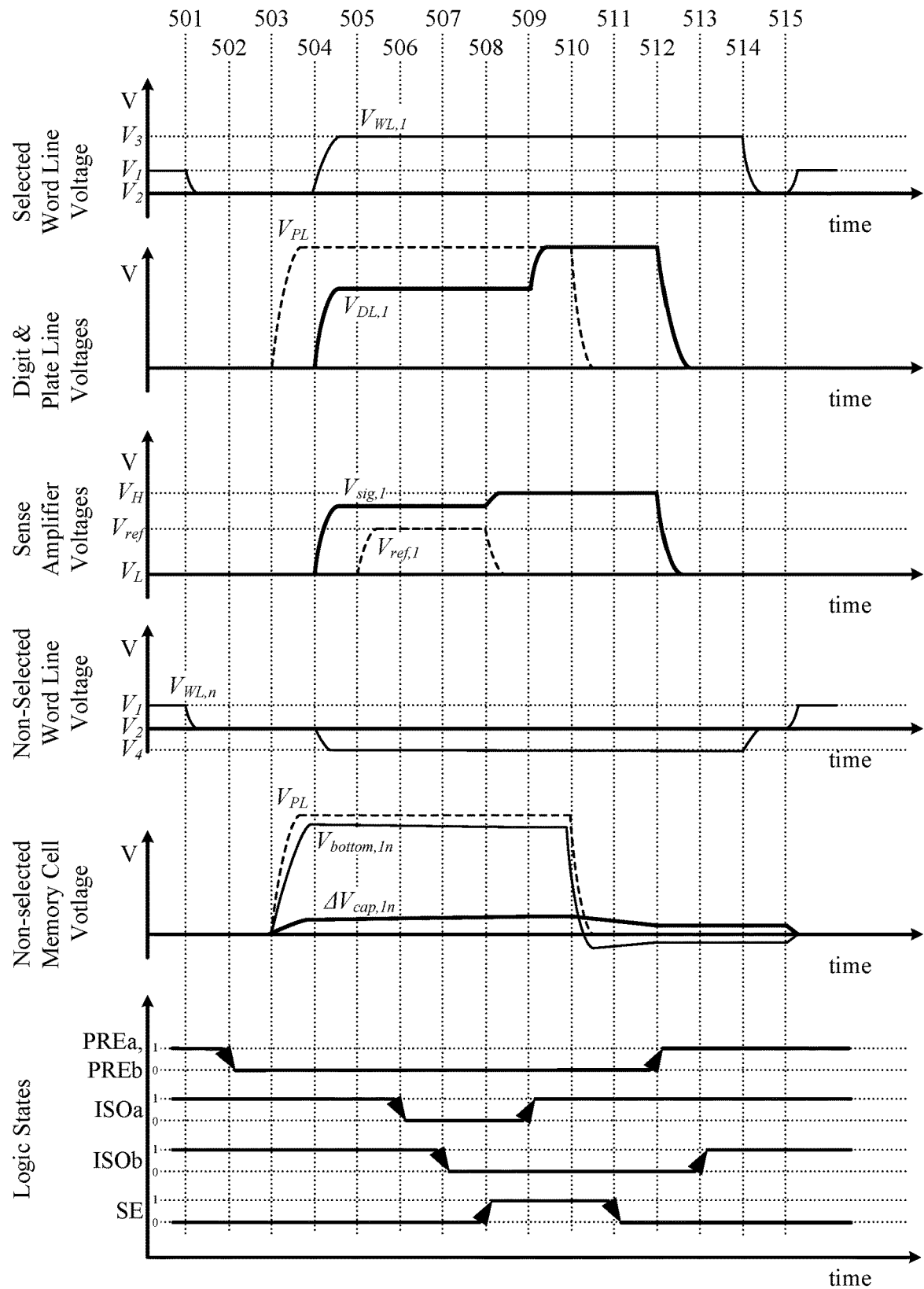
FIGS. 5 through 7 show timing diagrams illustrating operations of example access schemes for protecting stored data in a memory device in accordance with various embodiments of the present disclosure.

FIG. 5 shows a timing diagram 500 illustrating operations of an example access scheme for protecting stored data in a memory device in accordance with aspects of the present disclosure. The timing diagram 500 is described with reference to components of the example circuit 400 of FIG. 4, but may be illustrative of operations that may be performed with different circuit arrangements as well.

In the example of timing diagram 500, the memory cell 105-b-11 may be a selected memory cell 105. In other words, prior to or during the operations of timing diagram 500, the memory cell 105-b-11 may be selected or otherwise identified (e.g., by a memory controller 170) for an access operation (e.g., a read operation, which in some examples may include or be followed by a rewrite operation). Other memory cells 105 (e.g., memory cells 105-b-12 through 105-b-1n) may be non-selected memory cells 105 in the example of timing diagram 500. In the example of timing diagram 500, the selected memory cell 105-b-11 may initially store a logic 1 state as described herein (e.g., with reference to FIG. 3). In the example of timing diagram 500, the non-selected memory cell 105-b-1n may also initially store a logic 1 state as described herein (e.g., with reference to FIG. 3).

In some examples, prior to initiating the operations of timing diagram 500 (e.g., during an idle period, an idle interval, a standby period, a standby interval), the digit lines 210-a and the plate line 215-a may be biased at the same voltage. Matching the voltage of digit lines 210-*a* and plate lines 215-*a* may minimize charge leakage in the memory array 110-*a*. For example, in the example of timing diagram 500, the digit lines 210-*a* and the plate line 215-*a* may have an initial voltage of 0V, which may be provided by various voltage sources (e.g., via the sense component 150-*a*, via the plate component 145-*a*, via a column component 135, via a signal development component 280). In other examples, the digit lines 210-*a* and the plate line 215-*a* may be biased at different voltages, which may or may not be equal between the digit lines 210-*a* and the plate line 215-*a*.

The timing diagram 500 may illustrate an access scheme in which the row component 125-*a* is configured to apply (e.g., bias) to each of the word lines 205-*a* one of four voltages to support the various operations described herein (e.g., for activating, deactivating, equalizing particular word lines 205-*a*). To support the operations of the timing diagram 500, the row component 125-*a* may include various configurations of voltage sources, voltage supplies, switching components, selection components, amplifiers, or voltage conversion components to apply a particular voltage to a particular one of the word lines 205-*a*.

A first voltage, $V_1$, may represent a word line idle or standby voltage. According to the example of timing diagram 500, the first voltage may, in some cases, be a relatively small positive voltage, and may have a magnitude large enough to activate a cell selection component 230-*a* under certain conditions (e.g., for equalization operations, for dissipation operations, during idle conditions). In some examples, the first voltage may be selected to have a relatively small magnitude in order to support equalization or dissipation operations or states with relatively low power consumption (e.g., as compared with using a higher voltage for equalization or dissipation operations). In some examples, the first voltage may have a value of 1.0V, and may be referred to as VPWL.

A second voltage, $V_2$, may represent a word line equalization voltage. According to the example of timing diagram 500, the second voltage may, in some cases, be a ground or virtual ground voltage, and may be provided by a same voltage source as one or more of the voltage sources 410-*a* or 410-*b*, or may be coupled with a same voltage supply or chassis ground as one or more of the voltage sources 410-*a* or 410-*b*. The second voltage may have a value associated with deactivating a cell selection component 230-*a* under certain conditions. In some examples, the first voltage may have a value of 0V, and may be referred to as VSS.

A third voltage, $V_3$, may represent a cell selection word line voltage. According to the example of timing diagram 500, the third voltage may, in some cases, be a relatively large positive voltage, and may have a magnitude large enough to activate a cell selection component 230-*a* under certain conditions (e.g., for read operations, for write operations, for rewrite operations, for refresh operations). In some examples, the third voltage may be selected to have a relatively large magnitude in order to support relatively fast access operations (e.g., as compared with using a lower voltage for selecting a memory cell 105-*b* for a read operation, write operation, rewrite operation, refresh operation). In some examples, the third voltage may have a value of 3.1V, and may be referred to as VCCP.

A fourth voltage, $V_4$, may represent a cell deselection word line voltage. According to the example of timing diagram 500, the fourth voltage may, in some cases, be a negative voltage, and may be associated with deactivating a cell selection component 230-*a* (e.g., while another memory cell 105-*b* is selected for an access operation). In some examples, the fourth voltage may be selected to have a negative voltage in order to limit or reduce an amount of leakage charge flowing through a cell selection component 230-*a* as compared with a ground voltage (e.g., to increase the resistance of a cell selection component 230-*a* to leakage charge). In some examples, the fourth voltage may have a value of −0.2V, and may be referred to as VNWL.

At 501, the operations may include equalizing each of the word lines 205-*a*-1 through 205-*a*-*n*. For example, at 501, the row decoder may change from each of the word lines 205-*a* being biased at the first voltage (e.g., $V_1$, a word line idle or standby voltage) to being biased at the second voltage (e.g., $V_2$, a word line equalization voltage). In some examples, the operations of 501 may be associated with selectively decoupling each of the ferroelectric capacitors 220-*a* from the respective digit lines 210-*a*. In some examples, prior to 501, each of the digit lines 210-*a* and the plate line 215-*a* may have been biased at a same voltage (e.g., a ground voltage). Thus, prior to 501, each of the ferroelectric capacitors 220-*a* may have been equalized (e.g., because the respective cell selection components 230-*a* were activated by the word line idle or standby voltage), thereby dissipating any accumulated leakage charge or bias across the ferroelectric capacitors 220-*a*. Accordingly, after the operations of 501, each of the ferroelectric capacitors 220-*a* may remain in an equalized state (e.g., having a respective capacitor voltage $V_{cap}$=0V). The operations of 501 may be an example of biasing a plurality of word lines of a memory device to a first voltage.

At 502, the operations may include decoupling one or more of the sense amplifiers 290-*a* from equalization voltage sources. For example, at 502, the operations may include deactivating the switching components 405-*c* and 405-*d* (e.g., by deactivating logical signals PREa and PREb), which may selectively decouple the sense amplifiers 290-*a* from respective equalization voltage sources 410-*a* and 410-*b*. Thus, at 502, the respective signal voltages $V_{sig}$ and reference voltages $V_{ref}$ for the sense amplifiers 290-*a* may remain at zero volts.

At 503, the operations may include raising the voltage of the plate line 215-*a*. For example, at 503, the plate component 145-*a* may couple the plate line 215-*a* with a voltage source having a relatively high voltage (e.g., a plate high voltage). In some examples, at 503, the plate component 145-*a* may decouple the plate line 215-*a* from a plate low voltage source (e.g., a ground voltage source, an idle plate line voltage source, a standby plate line voltage source) prior to coupling the plate line 215-*a* with the voltage source having the relatively high voltage. Thus, at 503, the plate line voltage may increase from the voltage prior to 503.

In some examples, the operations of 503 may be associated with driving a leakage charge into or out of non-selected memory cells 105. For example, due to the difference in the voltage of the plate line 215-*a* and the digit line 210-*a*-1 (e.g., $V_{PL}$-$V_{DL,1}$), leakage charge may flow across one or more of the cell selection components 230-*a*-12 through 230-*a*-1*n* associated with the memory cells 105-*b*-12 through 105-*b*-1*n*. Accordingly, leakage charge may flow into or out of one or more of the capacitors 220-*a*-12 through 220-*a*-1*n*, which may alter the charge state or logic state stored by one or more of the non-selected memory cells 105-*b*-12 through 105-*b*-1*n*. For example, as compared with the charge state 305-*a* described with reference to FIG. 3, the operations of 503 may cause a ferroelectric capacitor 220-*a* of a non-selected memory cell (e.g., of one or more of the memory cells 105-*b*-12 through 105-*b*-1*n*) to move along the path 360 (e.g., to charge state 305-*e*), which may represent a partial loss of polarization of one or more of the non-selected memory cells 105-*b*-12 through 105-*b*-1*n*.

The leakage charge associated with such operations may be illustrated by the voltage behavior of the non-selected memory cells 105-*b* (e.g., any one or more of the memory cells 105-*b*-12 through 105-*b*-1*n*, coupled with the digit line 210-*a*-1). For example, in the absence of charge leakage, the cell bottom voltages $V_{bottom,1}$ of non-selected memory cells 105-*b*-12 through 105-*b*-1*n*, coupled with the digit line 210-*a*-1, would generally follow the plate line voltage $V_{PL}$. However, in the example of timing diagram 500, the cell bottom voltage $V_{bottom,1-n}$ associated with the memory cell 105-*b*-1*n* (e.g., storing a logic 1) may not rise as high as the applied voltage $V_{PL}$, due to charge leakage from the cell bottom of the ferroelectric capacitor 220-*a*-1*n* through the cell selection component 230-*a*-1*n* to the digit line 210-*a*-1. Thus, the ferroelectric capacitor 220-*a*-1*n* (or the capacitor 220-*a* of any of the other non-selected memory cells 105-*b*-12 through 105-*b*-1*n*) may experience a change in voltage (e.g., an accumulated non-zero bias), illustrated by ΔVcap, 1-*n*, which may be associated with a change in charge state of the ferroelectric capacitor 220-*a*-1*n* (e.g. a transition from a charge state 305-*a* to a charge state 305-*e*).

In some examples, leakage charge or bias may continue to accumulate after 503, (e.g., until the voltage of the plate line 215-*a* and the digit line 210-*a*-1 are equalized after 509, until the difference in voltage of the plate line 215-*a* and the digit line 210-*a*-1 is equal to a capacitor voltage $V_{cap}$ of a ferroelectric capacitor 220-*a* of a respective memory cell 105-*a*). The change in voltage of the ferroelectric capacitor 220-*a*-1*n* may continue to be illustrated by the voltage ΔVcap,1-*n* throughout the operations of the timing diagram 500.

At 504, the operations may include a word line selection operation. For example, at 504, the row decoder may change the word line 205-*a*-1 associated with the selected memory cell 105-*b*-11 (e.g., the selected word line 205-*a*) from being biased at the second voltage (e.g., $V_2$, the word line equalization voltage) to being biased at the third voltage (e.g., $V_3$, a cell selection word line voltage). In other words, the operations of 504 may be associated with activating or selecting the word line 205-*a*-1, which may include causing or initiating a transition in the bias applied to the word line 205-*a*-1. In some examples, the operations of 504 may be accompanied by determining to access the memory cell 105-*b*-11 (e.g., a determination by a memory controller 170), or otherwise identifying the memory cell 105-*b*-11 for performing an access operation. In some examples, the operations of 504 may be associated with selectively coupling the ferroelectric capacitor 220-*a*-11 with the digit lines 210-*a*-1. In some examples, the operations of 504 may be referred to as selecting the memory cell 105-*b*-11.

Because the word line 205-*a*-1 is coupled with the cell selection component 230-*a*-11, the cell selection component 230-*a*-11 may be activated as a result of the operations of 504. In other words, as a result of the operations of 504, the capacitor 220-*a*-11 may be selectively coupled with the digit line 210-*a*-1. Thus, charge may flow between the memory cell 105-*b*-11 and the digit line 210-*a*-1 based on the logic state stored by the memory cell 105-*b*-11 (e.g., based on a polarization state of the capacitor 220-*a*-11).

Accordingly, in the example of the timing diagram 500, the voltage of the digit line 210-*a*-1 (e.g., $V_{DL,1}$) may rise as charge is shared with the digit line 210-*a*-1. Because the switching component 405-*a*-1 is activated at 504 (e.g., because the logical signal ISOa is activated), the signal voltage at the sense amplifier 290-*a*-1 (e.g., $V_{sig,1}$) may also rise and may be equal to $V_{DL,1}$ after 504. The operations of 504 may be an example of performing an access operation on the selected memory cell 105-*b*-11 by causing row component 125-*a* (e.g., a row decoder) to activate the word line 205-*a*-1.

In some examples, the operations of 504 may be accompanied by a word line deselection operation. For example, at 504, the row decoder may change one or more of the word lines 205-*a*-2 through 205-*a*-*n* that are not associated with the selected memory cell 105-*b*-11 (e.g., non-selected word lines 205-*a*) from being biased at the second voltage (e.g., $V_2$, the word line equalization voltage) to being biased at the fourth voltage (e.g., $V_4$, a cell deselection word line voltage). In other words, the operations of 504 may be also be associated with deactivating or deselecting one or more of the word lines 205-*a*-2 through 205-*a*-*n*, which may include causing or initiating a transition in the bias applied to the word line one or more of the word lines 205-*a*-2 through 205-*a*-*n*. In some examples, the operations of 504 may be associated with selectively decoupling one or more of the ferroelectric capacitors 220-*a*-12 through 220-*a*-1*n* with the digit lines 210-*a*-1. In some examples, the operations of 504 may be referred to as deselecting one or more of the memory cells 105-*b*-12 through 105-*b*-1*n*. These operations are illustrated by the transition of non-selected word line voltage $V_{WL,n}$ from $V_2$ to $V_4$, but it should be understood that such a voltage may be applied to any one or more of word lines 205-*a*-2 through 205-*a*-*n*.

In some examples, the word line deselection operation of 504 may be associated with increasing a resistance to an accumulation of leakage charge on deselected memory cells 105 (e.g., as compared with operations that maintain non-selected word lines 205-*a* at the second voltage). In some examples, the operations of one or more of 501 through 504 may refer to operations occurring in a first interval (e.g., a first time interval, a first duration), though the operations of timing diagram 500 may be described according to different definitions of intervals. Although deactivating the word line 205-*a*-*n* and activating the word line 205-*a*-1 are illustrated as being performed simultaneously at 504, in some examples, deactivating the word line 205-*a*-*n* may be performed before or after activating the word line 205-*a*-1.

At 505, the operations may include providing a reference voltage to the sense component 150-*a*. For example, at 505, the reference component 285-*a* may couple the reference line 265-*a* with a voltage source providing a reference voltage. The reference voltage may, in some cases, be selected as a value (e.g., an average) between the signal voltage generated when reading a memory cell 105-*b* that stores a logic 0 (e.g., $V_{sig}$ when reading a logic 0) and the signal voltage generated when reading a memory cell 105-*b* that stores a logic 1 (e.g., $V_{sig}$ when reading a logic 1). In some examples, at 505, the access operation may include the reference component 285-*a* decoupling the reference line 265-*a* from a ground voltage source prior to coupling the reference line 265-*a* with the voltage source providing the reference voltage. Thus, at 505, the voltage of the reference line 265-*a* (e.g., $V_{RL}$) may increase from the voltage prior to 505 (e.g., an idle or standby reference line voltage). Because the switching component 405-*b*-1 is activated at 505 (e.g., because the logical signal ISOb is activated), the reference voltage at the sense amplifier 290-*a*-1 (e.g., $V_{ref,1}$) may also rise and may be equal to $V_{RL}$ after the operations of 505. In other examples of access schemes that support self-referencing read operations (not shown), the illustrated operations at 505 may be replaced with one or more operations that develop a reference signal using the memory cell 105-b-11.

At 506, the operations may include isolating (e.g., decoupling) the sense amplifier 290-a-1 from the memory array 110-a. For example, at 506, the access operation may include deactivating the switching component 405-a-1 (e.g., by deactivating logical signal ISOa), which may isolate a signal node 291 of the sense amplifier 290-a-1 from the memory cell 105-b-11.

At 507, the operations may include isolating (e.g., decoupling) the sense amplifiers 290-a from the reference component 285-a. For example, at 507, the access operation may include deactivating the switching component 405-b-1 (e.g., by deactivating logical signal ISOb), which may isolate a reference node 292 of the sense amplifier 290-a-1 from the reference component 285-a.

At 508, the operations may include latching the result of detecting the logic state stored by the memory cell 105-b-11. For example, at 508, the sense amplifiers 290-a may be activated (e.g., by activating logical signal SE), which may couple the sense amplifier 290-a-1 with a high sense amplifier voltage source (e.g., a voltage source at a voltage $V_H$) and may couple the sense amplifier 290-a-1 with a low sense amplifier voltage source (e.g., a voltage source at a voltage $V_L$). Thus, in the example of timing diagram 500, where $V_{sig,1}$ is greater than $V_{ref,1}$ at 508, the $V_{sig,1}$ may rise to the voltage $V_H$ and $V_{ref,1}$ may fall to the voltage $V_L$ as a result of the operations of 508. The voltages of $V_{sig,1}$ or $V_{ref,1}$ (e.g., $V_H$ or $V_L$) may be provided as an output of the sense component 150-a (e.g., to a column component 135, to an input/output component 160, to a memory controller 170). In some examples, any one or more of the operations of 502 through 508 may be referred to as a read operation.

At 509, the operations may include coupling the sense amplifier 290-a-1 with the memory array 110-a. For example, at 509, the operations may include activating the switching component 405-a-1 (e.g., by activating logical signal ISOa), which may couple a signal node 291 of the sense amplifier 290-a-1 with the memory cell 105-b-11. Accordingly, the voltage of the digit line 210-a-1 (e.g., $V_{DL,1}$) may rise to voltage of the high sense amplifier voltage source (e.g., $V_H$), which in some examples may also be the voltage of the plate line high voltage source (e.g., as activated at 503).

At 510, the operations may include lowering the voltage of the plate line 215-a. For example, at 510, the plate component 145-a may couple the plate line 215-a with a voltage source having a relatively low voltage (e.g., a plate line low voltage, a ground voltage, a virtual ground voltage). In some examples, at 510, the plate component 145-a may decouple the plate line 215-a from a voltage source having a relatively high voltage prior to coupling the plate line 215-a with the voltage source having the relatively low voltage. Thus, at 510, the plate line voltage may drop from the voltage prior to 510 (e.g., returning to an idle or standby plate line voltage).

In some examples, the operations of 510 may be referred to as a rewrite operation, or be otherwise included in a rewrite operation of the memory cell 105-b-11. For example, at 510, the voltage applied across the ferroelectric capacitor 220-a-11 (e.g., $V_{cap}$) may be equal to the difference between the voltage of the digit line 210-a-1 (e.g., $V_{DL,1}$) and the plate line 215-a (e.g., $V_{PL}$). In some examples, the voltage applied across the ferroelectric capacitor 220-a-11 may correspond to the voltage 315 described with reference to FIG. 3, which may correspond to a positive saturation voltage. In other words, the operations of 510 may be associated with rewriting the memory cell 105-b-11 with a logic 1 state (e.g., returning the memory cell 105-b-11 to the logic state stored prior to the operations of timing diagram 500). Thus, after the operations of 510, the ferroelectric capacitor 220-a-11 may be positively saturated. In other examples, the operations of any one or more of 502 through 510, including a rewrite operation, may be referred to as a single access operation (e.g., a "read-plus-rewrite" operation). In some examples, operations of 510 may be performed separately from a read operation, and may alternatively be referred to as a "write" operation.

In some examples, the operations of 510 may also be associated with driving a leakage charge into non-selected memory cells 105-b. For example, due to the difference in the voltage of the digit line 210-a-1 and the plate line 215-a (e.g., $V_{DL,1}$-$V_{PL}$), leakage charge may flow across one or more of the cell selection components 230-a-12 through 230-a-1n of the memory cells 105-b-12 through 105-b-1n. Accordingly, leakage charge may flow into or out of one or more of the capacitors 220-a-12 through 220-a-1n, which may alter the logic state stored by one or more of the non-selected memory cells 105-b-12 through 105-b-1n. In some examples, the leakage charge associated with the operations of 510 may flow in a direction opposite from a flow of leakage charge associated with the operations of 503. In other words, as compared with the charge state 305-e described with reference to FIG. 3, the operations of 510 may cause a ferroelectric capacitor 220-1 of a non-selected memory cell (e.g., one or more of the memory cells 105-b-12 through 105-b-1n) to move towards the charge state 305-f. In some examples, leakage charge or bias may continue to accumulate after 510, (e.g., until the voltage of the plate line 215-a and the digit line 210-a-1 are equalized after 512, until the difference in voltage of the plate line 215-a and the digit line 210-a-1 is equal to a capacitor voltage $V_{cap}$ of a respective memory cell 105-1).

At 511, the operations may include deactivating the sense component 150-a. For example, at 511, the sense amplifiers 290-a may be deactivated (e.g., by deactivating logical signal SE), which may decouple the sense amplifier 290-a-1 from a high sense amplifier voltage source (e.g., a voltage source at a voltage $V_H$) and may decouple the sense amplifier 290-a-1 from a low sense amplifier voltage source (e.g., a voltage source at a voltage $V_L$). In the example of timing diagram 500, the signal node voltage $V_{sig,1}$ and the reference node voltage $V_{ref,1}$ may hold at their respective values as a result of the operations of 511.

At 512, the operations may include equalizing the input nodes of the sense amplifiers 290-a. For example, at 512, the operations may include activating the switching components 405-c and 405-d (e.g., by activating logical signals PREa and PREb), which may selectively couple the sense amplifiers 290-a with respective equalization voltage sources 410-a and 410-b. Thus, at 512, the signal voltages $V_{sig}$ and reference voltages $V_{ref}$ for the sense amplifiers 290-a may be biased at zero volts.

At 513, the operations may include coupling the sense amplifiers 290-a with the reference component 285-a. For example, at 513, the operations may include activating the switching component 405-b-1 (e.g., by activating logical signal ISOb), which may couple a reference node 292 of the sense amplifier 290-a-1 with the reference component 285-a. In some examples, at 513, the reference component 285-a may couple the reference line 265-a with a ground voltage source (e.g., having a voltage equal to the equalization voltage sources 410-a) prior to coupling the sense amplifiers 290-a with the reference component 285-a. In some examples, the operations of one or more of 505 through 513 may refer to operations occurring in a second interval (e.g., a second time interval, a second duration), though the operations of timing diagram 500 may be described according to different definitions of intervals. As a result of the word line 205-a-n being biased at the third voltage during such operations, the biasing of the word line 205-a-n may be considered an example of biasing (e.g., by the row component 125-a), during an interval for performing an access operation (e.g., a second interval), a non-selected word line 205-a to a third voltage.

At 514, the operations may include equalizing each of the word lines 205-a-1 through 205-a-n. For example, at 514, the row component 125-a may change the selected word line 205-a-1 from being biased at the third voltage (e.g., $V_3$, the cell selection word line voltage) to being biased at the second voltage (e.g., $V_2$, a word line equalization voltage), and the row component 125-a may also change one or more of the non-selected word line 205-a-2 through 205-a-n from being biased at the fourth voltage (e.g., $V_4$, the cell deselection word line voltage) to being biased at the second voltage (e.g., $V_2$, a word line equalization voltage).

As the non-selected word line 205-a-n is biased at a higher voltage at 514, the operations of 514 may be an example of adjusting, during an interval, the non-selected word line 205-a-n to a voltage that is higher than a voltage during a preceding interval.

As illustrated by the cell bottom voltage of a non-selected memory cell 105-b (e.g., $V_{bottom,1n}$) after 514, a cell selection component 230-a of non-selected memory cells 105-a (e.g., one or more of the memory cells 105-b-12 through 105-b-1n) may be deactivated, but leakage charge may nonetheless flow through the respective deactivated cell selection components 230-a during an access operation associated with the selected memory cell 105-b-11 (e.g., during the operations of any one or more of 501 through 514). In the example of ferroelectric memory cells 105-b, the leakage charge or bias may accumulate at the ferroelectric capacitors 220-a of the non-selected memory cells 105-b, which may alter the polarization of the ferroelectric capacitors 220-a (e.g., as illustrated by the non-zero value of $\Delta V_{cap,1n}$ after 514).

For example, when the ferroelectric capacitor 220-a-1n of non-selected memory cell 105-b-1n is at a charge state 305-a (e.g., storing a logic 1), leakage charge or bias associated with an access operation on the selected memory cell 105-b-11 may cause the charge state of the non-selected memory cell 105-b-1n to follow at least a portion of the path 360 described with reference to FIG. 3. In some examples, a first access operation (e.g., one or more of the operations of 501 through 514) on the selected memory cell 105-b-11 may cause the ferroelectric capacitor 220-a-1n the memory cell 105-b-1n to reach the charge state 305-e described with reference to FIG. 3, which may correspond to the level of the voltage $\Delta V_{cap,1n}$.

In the event that non-selected memory cell 105-b-1n remains as non-selected for subsequent access operations (e.g., following the operations of 514) for selected memory cells, the charge state of memory cell 105-b-1n may continue along the path 360 as leakage charge or bias continues to accumulate, until reaching charge state 305-c described with reference to FIG. 3, for example (e.g., accumulating a larger $\leftarrow V_{cap}$). The charge state 305-c may illustrate a substantial loss of polarization, which may illustrate a loss of data at the memory cell 105-b-1n from such accumulated leakage charge or bias. However, operations may be performed after an access operation on the selected memory cell 105-b-11 (e.g., after the operations of one or more of 501 through 514) to encourage or otherwise support the dissipation of leakage charge or bias from the non-selected memory cells 105-b-1n, which may reduce or eliminate data loss that may otherwise result from an accumulation of leakage charge or bias.

At 515, the operations may include idling each of the word lines 205-a-1 through 205-a-n. For example, at 515, the row component 125-a may change from each of the word lines 205-a being biased at the second voltage (e.g., $V_2$, a word line equalization voltage) to being biased at the first voltage (e.g., $V_1$, a word line idle or standby voltage). In some examples, the operations of 515 may be associated with selectively coupling each of the ferroelectric capacitors 220-a with the respective digit lines 210-a (e.g., with a relatively low magnitude selection voltage).

In some examples, each of the digit lines 210-a and the plate line 215-a may be biased at a same voltage (e.g., a ground voltage). Thus, as a result of the operations of 515, each of the ferroelectric capacitors 220-a may be equalized (e.g., because the respective cell selection components 230-a were activated by the word line idle or standby voltage). Thus, the operations of 515 may be an example of performing an equalization operation or dissipation operation on one or more of the memory cells 105-b-11 through 105-b-1n by causing row component 125-1 (e.g., a row decoder) to activate one or more of the word lines 205-a (e.g., dissipating any accumulated leakage charge or bias). Accordingly, after the operations of 515, each of the ferroelectric capacitors 220-a may be returned to an equalized state (e.g., having a respective capacitor voltage $V_{cap}=0V$). In some examples, the operations of one or both of 514 and 515 may refer to operations occurring in a third interval (e.g., a third time interval, a third duration), though the operations of timing diagram 500 may be described according to different definitions of intervals. As the non-selected word line 205-a-n is biased at a higher voltage at 515, the operations of 515 may be another example of adjusting, during an interval, the non-selected word line 205-a-n to a voltage that is higher than a voltage during a preceding interval.

As illustrated by the cell bottom voltage of the non-selected memory cells 105-b after 515, an accumulated leakage charge or bias (e.g., at the non-selected memory cell 105-b-1n) may be dissipated (e.g., as illustrated by the zero value of $\Delta V_{cap,1-n}$ at the end of the timing diagram 500). Thus, as illustrated by the example of timing diagram 500, operations may be performed after an access operation on a selected memory cell 105 (e.g., any one or more of the operations 501 through 514) to encourage or otherwise support the dissipation of leakage charge from non-selected memory cells 105, which may reduce or eliminate data loss that may otherwise result from an accumulation of leakage charge or bias.

Although illustrated as separate operations occurring at different times, certain operations may occur simultaneously, or in a different order. In some examples, various operations may be advantageously initiated simultaneously to reduce the amount of time for sensing a logic state of the memory cell 105-b. For example, any two or more of raising the voltage of the plate line 215-a at 503, activating the word line 205-a-1 at 504, deactivating the word line 205-a-n at 504, or providing a reference voltage to the sense component 150-a at 505, may occur in a different relative order, occur during overlapping durations, or occur simultaneously. Additionally or alternatively, isolating the sense amplifier 290-a-1 from the memory array 110-a at 506 and isolating the sense amplifiers 290-a from the reference component 285-a at 507 may occur in a different order, occur during overlapping durations, or occur simultaneously. Additionally or alternatively, coupling the sense amplifier 290-a-1 with the memory array 110-a at 509 and lowering the voltage of the plate line 215-a at 510 may occur in a different order, occur during overlapping durations, or occur simultaneously. Additionally or alternatively, any two or more of equalizing the input nodes of the sense amplifiers 290-a at 512, coupling the sense amplifiers 290-a with the reference component 285-a at 513, or equalizing the word lines 205-a at 514 may occur in a different relative order, occur during overlapping durations, or occur simultaneously.

Figure 6:
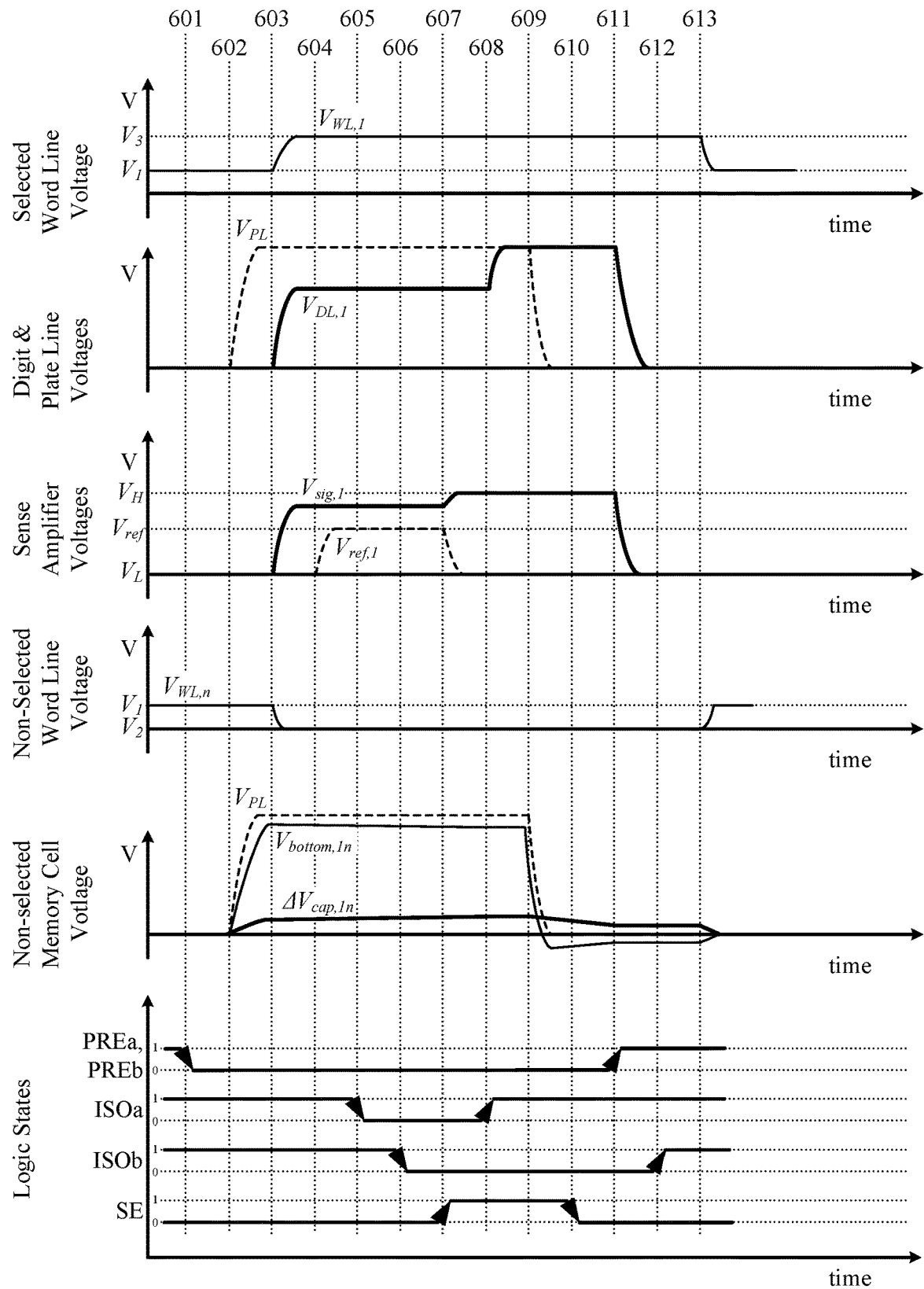

FIG. 6 shows a timing diagram 600 illustrating operations of an example access scheme for protecting stored data in a memory device in accordance with aspects of the present disclosure. The timing diagram 600 is described with reference to components of the example circuit 400 of FIG. 4, but may be illustrative of operations that may be performed with different circuit arrangements as well.

In the example of timing diagram 600, the memory cell 105-b-11 may be a selected memory cell 105. In other words, prior to or during the operations of timing diagram 600, the memory cell 105-b-11 may be selected or otherwise identified (e.g., by a memory controller 170) for an access operation (e.g., a read operation, which in some examples may include or be followed by a rewrite operation). Other memory cells 105-b (e.g., memory cells 105-b-12 through 105-b-1n) may be non-selected memory cells 105 in the example of timing diagram 600. In the example of timing diagram 600, the memory cell 105-b-11 may initially store a logic 1 state as described herein (e.g., with reference to FIG. 3). In the example of timing diagram 600, the non-selected memory cell 105-b-1n may also initially store a logic 1 state as described herein (e.g., with reference to FIG. 3).

In some examples, prior to initiating the operations of timing diagram 600 (e.g., during an idle period, an idle interval, a standby period, a standby interval), the digit lines 210-a and the plate line 215-a may be biased at the same voltage. Matching the voltage of digit lines 210-a and plate lines 215-a may minimize charge leakage in the memory array 110-a. For example, in the example of timing diagram 600, the digit lines 210-a and the plate line 215-a may have an initial voltage of 0V, which may be provided by various voltage sources (e.g., via the sense component 150-a, via the plate component 145-a, via a column component 135, via a signal development component 280). In other examples, the digit lines 210-a and the plate line 215-a may be biased at different voltages, which may or may not be equal between the digit lines 210-a and the plate line 215-a.

The timing diagram 600 may illustrate an access scheme in which the row component 125-a is configured to apply (e.g., bias) to each of the word lines 205-a one of three voltages to support the various operations described herein (e.g., for activating, deactivating, equalizing particular word lines 205-a). To support the operations of the timing diagram 600, the row component 125-a may include various configurations of voltage sources, voltage supplies, switching components, selection components, amplifiers, or voltage conversion components to apply a particular voltage to a particular one of the word lines 205-a.

A first voltage, $V_1$, may represent a word line idle or standby voltage. According to the example of timing diagram 600, the first voltage may, in some cases, be a relatively small positive voltage, and may have a magnitude large enough to activate a cell selection component 230-a under certain conditions (e.g., for equalization operations, for dissipation operations). In some examples, the first voltage may be selected to have a relatively small magnitude in order to support equalization or dissipation operations or states with relatively low power consumption (e.g., as compared with using a higher voltage for equalization or dissipation operations). In some examples, the first voltage may have a value of 1.0V, and may be referred to as VPWL.

A second voltage, $V_2$, may represent a word line equalization voltage, which may also represent a word line deselection voltage. According to the example of timing diagram 600, the second voltage may, in some cases, be a ground or virtual ground voltage, and may be provided by a same voltage source as one or more of the voltage sources 410-a or 410-b, or may be coupled with a same voltage supply or chassis ground as one or more of the voltage sources 410-a or 410-b. The second voltage may have a value associated with deactivating a cell selection component 230-a under certain conditions. In some examples, the second voltage may have a value of 0V, and may be referred to as VSS.

A third voltage, $V_3$, may represent a cell selection word line voltage. According to the example of timing diagram 600, the third voltage may, in some cases, be a relatively large positive voltage, and may have a magnitude large enough to activate a cell selection component 230-a under certain conditions (e.g., for read operations, for write operations, for rewrite operations, for refresh operations). In some examples, the third voltage may be selected to have a relatively large magnitude in order to support relatively fast access operations (e.g., as compared with using a lower voltage for selecting a memory cell 105-b for a read operation, write operation, rewrite operation, refresh operation). In some examples, the third voltage may have a value of 3.1V, and may be referred to as VCCP.

At 601, the operations may include decoupling one or more of the sense amplifiers 290-a from equalization voltage sources. For example, at 601, the operations may include deactivating the switching components 405-c and 405-d (e.g., by deactivating logical signals PREa and PREb), which may selectively decouple the sense amplifiers 290-a from respective equalization voltage sources 410-a and 410-b. Thus, at 601, the respective signal voltages $V_{sig}$ and reference voltages $V_{ref}$ for the sense amplifiers 290-a may remain at zero volts.

At 602, the operations may include raising the voltage of the plate line 215-a. For example, at 602, the plate component 145-a may couple the plate line 215-a with a voltage source having a relatively high voltage (e.g., a plate high voltage). In some examples, at 602, the plate component 145-a may decouple the plate line 215-a from a plate low voltage source (e.g., a ground voltage source, an idle plate line voltage source, a standby plate line voltage source) prior to coupling the plate line 215-a with the voltage source having the relatively high voltage. Thus, at 602, the plate line voltage may increase from the voltage prior to 602.

In some examples, the operations of 602 may be associated with driving a leakage charge into or out of non-selected memory cells 105-b. For example, due to the difference in the voltage of the plate line 215-a and the digit line 210-a-1 (e.g., $V_{PL}-V_{DL,1}$), leakage charge may flow across one or more of the cell selection components 230-a-12 through 230-a-1n associated with the memory cells 105-b-12 through 105-b-1n. Accordingly, leakage charge may flow into or out of one or more of the capacitors 220-a-12 through 220-a-1n, which may alter the charge state or logic state stored by one or more of the non-selected memory cells 105-*b*-12 through 105-*b*-1*n*. For example, as compared with the charge state 305-*a* described with reference to FIG. 3, the operations of 602 may cause a ferroelectric capacitor 220-1 of a non-selected memory cell (e.g., one or more of the memory cells 105-*b*-12 through 105-*b*-1*n*) to move along the path 360 (e.g., to charge state 305-*e*), which may represent a partial loss of polarization of one or more of the non-selected memory cells 105-*b*-12 through 105-*b*-1*n*.

The leakage charge associated with such operations may be illustrated by the voltage behavior of the non-selected memory cells 105-*b* (e.g., any one or more of the memory cells 105-*b*-12 through 105-*b*-1*n*, coupled with the digit line 210-*a*-1). For example, in the absence of charge leakage, the cell bottom voltages $V_{bottom,1}$ of non-selected memory cells 105-*b*-12 through 105-*b*-1*n*, coupled with the digit line 210-*a*-1, would generally follow the plate line voltage $V_{PL}$. However, in the example of timing diagram 600, the cell bottom voltage $V_{bottom,1-n}$ associated with the memory cell 105-*b*-1*n* (e.g., storing a logic 1) may not rise as high as the applied voltage $V_{PL}$, due to charge leakage from the cell bottom of the ferroelectric capacitor 220-*a*-1*n* through the cell selection component 230-*a*-1*n* to the digit line 210-*a*-1. Thus, the ferroelectric capacitor 220-*a*-1*n* (or the capacitor 220-*a* of any of the other non-selected memory cells 105-*b*-12 through 105-*b*-1*n*) may experience a change in voltage (e.g., an accumulated non-zero bias), illustrated by ΔVcap, 1*n*, which may be associated with a change in charge state of the ferroelectric capacitor 220-*a*-1*n* (e.g. a transition from a charge state 305-*a* to a charge state 305-*e*).

In some examples, leakage charge or bias may continue to accumulate after 602, (e.g., until the voltage of the plate line 215-*a* and the digit line 210-*a*-1 are equalized after 608, until the difference in voltage of the plate line 215-*a* and the digit line 210-*a*-1 is equal to a capacitor voltage $V_{cap}$ of a ferroelectric capacitor 220-*a* of a respective memory cell 105-*a*). The change in voltage of the ferroelectric capacitor 220-*a*-1*n* may continue to be illustrated by the voltage ΔVcap,1-*n* throughout the operations of the timing diagram 600.

At 603, the operations may include a word line selection operation. For example, at 603, the row decoder may change the word line 205-*a*-1 associated with the selected memory cell 105-*b*-11 (e.g., the selected word line 205-*a*) from being biased at the first voltage (e.g., $V_1$, a word line idle or standby voltage) to being biased at the third voltage (e.g., $V_3$, a cell selection word line voltage). In other words, the operations of 603 may be associated with activating or selecting the word line 205-*a*-1, which may include causing or initiating a transition in the bias applied to the word line 205-*a*-1. In some examples, the operations of 603 may be accompanied by determining to access the memory cell 105-*b*-11 (e.g., a determination by a memory controller 170), or otherwise identifying the memory cell 105-*b*-11 for performing an access operation. In some examples, the operations of 603 may be associated with selectively coupling the ferroelectric capacitor 220-*a*-11 with the digit lines 210-*a*-1. In some examples, the operations of 603 may be referred to as selecting the memory cell 105-*b*-11.

Because the word line 205-*a*-1 is coupled with the cell selection component 230-*a*-11, the cell selection component 230-*a*-11 may be activated as a result of the operations of 603. In other words, as a result of the operations of 603, the capacitor 220-*a*-11 may be selectively coupled with the digit line 210-*a*-1. Thus, charge may flow between the memory cell 105-*b*-11 and the digit line 210-*a*-1 based on the logic state stored by the memory cell 105-*b*-11 (e.g., based on a polarization state of the capacitor 220-*a*-11). Accordingly, in the example of the timing diagram 600, the voltage of the digit line 210-*a*-1 (e.g., $V_{DL,1}$) may rise as charge is shared with the digit line 210-*a*-1. Because the switching component 405-*a*-1 is activated at 603 (e.g., because the logical signal ISOa is activated), the signal voltage at the sense amplifier 290-*a*-1 (e.g., $V_{sig,1}$) may also rise and may be equal to $V_{DL,1}$ after 603. Thus, the operations of 603 may be an example of performing an access operation on the selected memory cell 105-*b*-11 by causing row component 125-*a* (e.g., a row decoder) to activate the word line 205-*a*-1.

In some examples, the operations of 603 may be accompanied by a word line deselection operation. For example, at 603, the row decoder may change one or more of the word lines 205-*a*-2 through 205-*a*-*n* that are not associated with the selected memory cell 105-*b*-11 (e.g., non-selected word lines 205-*a*) from being biased at the first voltage (e.g., $V_1$, a word line idle or standby voltage) to being biased at the second voltage (e.g., $V_2$, a word line equalization voltage, a word line deselection voltage). In other words, the operations of 603 may be also be associated with deactivating or deselecting one or more of the word lines 205-*a*-2 through 205-*a*-*n*. In some examples, the operations of 603 may be associated with selectively decoupling one or more of the ferroelectric capacitors 220-*a*-12 through 220-*a*-1*n* with the digit lines 210-*a*-1. In some examples, the operations of 603 may be referred to as deselecting one or more of the memory cells 105-*b*-12 through 105-*b*-1*n*.

The described operations are illustrated by the transition of non-selected word line voltage $V_{WL,n}$ from $V_1$ to $V_2$, but it should be understood that such a voltage may be applied to any one or more of word lines 205-*a*-2 through 205-*a*-*n*. In some examples, the operations of one or more of 601 through 603 may refer to operations occurring in a first interval (e.g., a first time interval, a first duration), though the operations of timing diagram 600 may be described according to different definitions of intervals. Although deactivating the word line 205-*a*-*n* and activating the word line 205-*a*-1 are illustrated as being performed simultaneously, in some examples, deactivating the word line 205-*a*-*n* may be performed before or after activating the word line 205-*a*-1.

At 604, the operations may include providing a reference voltage to the sense component 150-*a*. For example, at 604, the reference component 285-*a* may couple the reference line 265-*a* with a voltage source providing a reference voltage. The reference voltage may, in some cases, be selected as a value (e.g., an average) between the signal voltage generated when reading a memory cell 105-*b* that stores a logic 0 (e.g., $V_{sig}$ when reading a logic 0) and the signal voltage generated when reading a memory cell 105-*b* that stores a logic 1 (e.g., $V_{sig}$ when reading a logic 1). In some examples, at 604, the access operation may include the reference component 285-*a* decoupling the reference line 265-*a* from a ground voltage source prior to coupling the reference line 265-*a* with the voltage source providing the reference voltage. Thus, at 604, the voltage of the reference line 265-*a* (e.g., $V_{RL}$) may increase from the voltage prior to 604 (e.g., an idle or standby reference line voltage). Because the switching component 405-*b*-1 is activated at 604 (e.g., because the logical signal ISOb is activated), the reference voltage at the sense amplifier 290-*a*-1 (e.g., $V_{ref,1}$) may also rise and may be equal to $V_{RL}$ after 604. In other examples of access schemes that support self-referencing read operations (not shown), the illustrated operations at 604 may be replaced with one or more operations that develop a reference signal using the memory cell 105-*b*-11.

At 605, the operations may include isolating (e.g., decoupling) the sense amplifier 290-*a*-1 from the memory array 110-*a*. For example, at 605, the access operation may include deactivating the switching component 405-*a*-1 (e.g., by deactivating logical signal ISOa), which may isolate a signal node 291 of the sense amplifier 290-*a*-1 from the memory cell 105-*b*-11.

At 606, the operations may include isolating (e.g., decoupling) the sense amplifiers 290-*a* from the reference component 285-*a*. For example, at 606, the access operation may include deactivating the switching component 405-*b*-1 (e.g., by deactivating logical signal ISOb), which may isolate a reference node 292 of the sense amplifier 290-*a*-1 from the reference component 285-*a*.

At 607, the operations may include latching the result of detecting the logic state stored by the memory cell 105-*b*-11. For example, at 607, the sense amplifiers 290-*a* may be activated (e.g., by activating logical signal SE), which may couple the sense amplifier 290-*a*-1 with a high sense amplifier voltage source (e.g., a voltage source at a voltage $V_H$) and may couple the sense amplifier 290-*a*-1 with a low sense amplifier voltage source (e.g., a voltage source at a voltage $V_L$). Thus, in the example of timing diagram 600, where $V_{sig,1}$ is greater than $V_{ref,1}$ at 607, the $V_{sig,1}$ may rise to the voltage $V_H$ and $V_{ref,1}$ may fall to the voltage $V_L$. as a result of the operations of 607. The voltages of $V_{sig,1}$ or $V_{ref,1}$ (e.g., $V_H$ or $V_L$) may be provided as an output of the sense component 150-*a* (e.g., to a column component 135, to an input/output component 160, to a memory controller 170). In some examples, any one or more of the operations of 601 through 607 may be referred to as a read operation.

At 608, the operations may include coupling the sense amplifier 290-*a*-1 with the memory array 110-*a*. For example, at 608, the operations may include activating the switching component 405-*a*-1 (e.g., by activating logical signal ISOa), which may couple a signal node 291 of the sense amplifier 290-*a*-1 with the memory cell 105-*b*-11. Accordingly, the voltage of the digit line 210-*a*-1 (e.g., $V_{DL,1}$) may rise to voltage of the high sense amplifier voltage source (e.g., $V_H$), which in some examples may also be the voltage of the plate line high voltage source (e.g., as activated at 602).

At 609, the operations may include lowering the voltage of the plate line 215-*a*. For example, at 609, the plate component 145-*a* may couple the plate line 215-*a* with a voltage source having a relatively low voltage (e.g., a plate line low voltage, a ground voltage, a virtual ground voltage). In some examples, at 609, the plate component 145-*a* may decouple the plate line 215-*a* from a voltage source having a relatively high voltage prior to coupling the plate line 215-*a* with the voltage source having the relatively low voltage. Thus, at 609, the plate line voltage may drop from the voltage prior to 609 (e.g., returning to an idle or standby plate line voltage).

In some examples, the operations of 609 may be referred to as a rewrite operation, or be otherwise include in a rewrite operation of the memory cell 105-*b*-11. For example, at 609, the voltage applied across the ferroelectric capacitor 220-*a*-11 (e.g., $V_{cap}$) may be equal to the difference between the voltage of the digit line 210-*a*-1 (e.g., $V_{DL,1}$) and the plate line 215-*a* (e.g., $V_{PL}$). In some examples, the voltage applied across the ferroelectric capacitor 220-*a*-11 may correspond to the voltage 315 described with reference to FIG. 3, which may correspond to a positive saturation voltage. In other words, the operations of 609 may be associated with rewriting the memory cell 105-*b*-11 with a logic 1 state (e.g., returning the memory cell 105-*b*-11 to the logic state stored prior to the operations of timing diagram 600). Thus, after the operations of 609, the ferroelectric capacitor 220-*a*-11 may be positively saturated. In other examples, the operations of any one or more of 601 through 609, including a rewrite operation, may be referred to as a single access operation (e.g., a "read-plus-rewrite" operation). In some examples, operations of 609 may be performed separately from a read operation, and may alternatively be referred to as a "write" operation.

In some examples, the operations of 609 may also be associated with driving a leakage charge into non-selected memory cells 105. For example, due to the difference in the voltage of the digit line 210-*a*-1 and the plate line 215-*a* (e.g., $V_{DL,1}$-$V_{PL}$), leakage charge may flow across one or more of the cell selection components 230-*a*-12 through 230-*a*-1*n* of the memory cells 105-*b*-12 through 105-*b*-1*n*. Accordingly, leakage charge may flow into one or more of the capacitors 220-*a*-12 through 220-*a*-1*n*, which may alter the logic state stored by one or more of the non-selected memory cells 105-*b*-12 through 105-*b*-1*n*. In some examples, the leakage charge associated with the operations of 609 may flow in a direction opposite from a flow of leakage charge associated with the operations of 602. In other words, as compared with the charge state 305-*e* described with reference to FIG. 3, the operations of 609 may cause a ferroelectric capacitor 220-1 of a non-selected memory cell (e.g., one or more of the memory cells 105-*b*-12 through 105-*b*-1*n*) to move towards the charge state 305-*f*. In some examples, leakage charge or bias may continue to accumulate after 609, (e.g., until the voltage of the plate line 215-*a* and the digit line 210-*a*-1 are equalized after 611, until the difference in voltage of the plate line 215-*a* and the digit line 210-*a*-1 is equal to a capacitor voltage $V_{ref,1}$ of a respective memory cell 105-*b*).

At 610, the operations may include deactivating the sense component 150-*a*. For example, at 610, the sense amplifiers 290-*a* may be deactivated (e.g., by deactivating logical signal SE), which may decouple the sense amplifier 290-*a*-1 from a high sense amplifier voltage source (e.g., a voltage source at a voltage $V_H$) and may decouple the sense amplifier 290-*a*-1 from a low sense amplifier voltage source (e.g., a voltage source at a voltage $V_L$). In the example of timing diagram 600, the signal node voltage $V_{sig,1}$ and the reference node voltage $V_{ref,1}$ may hold at their respective values as a result of the operations of 610.

At 611, the operations may include equalizing the input nodes of the sense amplifiers 290-*a*. For example, at 611, the operations may include activating the switching components 405-*c* and 405-*d* (e.g., by activating logical signals PREa and PREb), which may selectively couple the sense amplifiers 290-*a* with respective equalization voltage sources 410-*a* and 410-*b*. Thus, at 611, the signal voltages $V_{sig}$ and reference voltages $V_{ref}$ for the sense amplifiers 290-*a* may be biased at zero volts.

At 612, the operations may include coupling the sense amplifiers 290-*a* with the reference component 285-*a*. For example, at 612, the operations may include activating the switching component 405-*b*-1 (e.g., by activating logical signal ISOb), which may couple a reference node 292 of the sense amplifier 290-*a*-1 with the reference component 285-*a*. In some examples, at 612, the reference component 285-*a* may couple the reference line 265-*a* with a ground voltage source (e.g., having a voltage equal to the equalization voltage sources 410-*a*) prior to coupling the sense amplifiers 290-*a* with the reference component 285-*a*. In some examples, the operations of one or more of 604 through 612 may refer to operations occurring in a second interval (e.g., a second time interval, a second duration), though the operations of timing diagram 600 may be described according to different definitions of intervals. As a result of the word line 205-*a*-*n* being biased at the third voltage during such operations, the biasing of the word line 205-*a*-*n* may be considered an example of biasing, during an interval for performing an access operation (e.g., a second interval), a non-selected word line 205-*a* to a third voltage.

As illustrated by the cell bottom voltage of a non-selected memory cell 105-*b* (e.g., $V_{bottom,1n}$) after 612, a cell selection component 230-*a* of non-selected memory cells 105-*a* (e.g., one or more of the memory cells 105-*b*-12 through 105-*b*-1*n*) may be deactivated, but leakage charge may nonetheless flow through the respective deactivated cell selection components 230-*a* during an access operation associated with the selected memory cell 105-*b*-11 (e.g., during the operations of any one or more of 601 through 612). In the example of ferroelectric memory cells 105-*b*, the leakage charge or bias may accumulate at the ferroelectric capacitors 220-*a* of the non-selected memory cells 105-*b*, which may alter the polarization of the ferroelectric capacitors 220-*a* (e.g., as illustrated by the non-zero value of $\Delta V_{cap,1n}$ after 612).

For example, when the ferroelectric capacitor 220-*a*-1*n* of non-selected memory cell 105-*b*-1*n* is at a charge state 305-*a* (e.g., storing a logic 1), leakage charge or bias associated with an access operation on the selected memory cell 105-*b*-11 may cause the charge state of the non-selected memory cell 105-*b*-1*n* to follow at least a portion of the path 360 described with reference to FIG. 3. In some examples, a first access operation (e.g., one or more of the operations of 601 through 612) on the selected memory cell 105-*b*-11 may cause the ferroelectric capacitor 220-*a*-1*n* the memory cell 105-*b*-1*n* to reach the charge state 305-*e* described with reference to FIG. 3, which may correspond to the level of the voltage $\Delta V_{cap,1n}$.

In the event that non-selected memory cell 105-*b*-1*n* remains as non-selected for subsequent access operations (e.g., following the operations of 612) for selected memory cells, the charge state of memory cell 105-*b*-1*n* may continue along the path 360 as leakage charge or bias continues to accumulate, until reaching charge state 305-*c* described with reference to FIG. 3, for example (e.g., accumulating a larger $\Delta V_{cap}$). The charge state 305-*c* may illustrate a substantial loss of polarization, which may illustrate a loss of data at the memory cell 105-*b*-1*n* from such accumulated leakage charge or bias. However, operations may be performed after an access operation on the selected memory cell 105-*b*-11 (e.g., after the operations of one or more of 601 through 612) to encourage or otherwise support the dissipation of leakage charge or bias from the non-selected memory cells 105-*b*-1*n*, which may reduce or eliminate data loss that may otherwise result from an accumulation of leakage charge or bias.

At 613, the operations may include idling each of the word lines 205-*a*-1 through 205-*a*-*n*. For example, at 613, the row component 125-*a* may change the selected word line 205-*a*-1 from being biased at the third voltage (e.g., $V_3$, the cell selection word line voltage) to being biased at the first voltage (e.g., $V_1$, a word line idle or standby voltage), and the row component 125-*a* may also change one or more of the non-selected word line 205-*a*-2 through 205-*a*-*n* from being biased at the second voltage (e.g., $V_2$, a word line equalization or deselection voltage) to being biased at the first voltage (e.g., $V_1$, a word line idle or standby voltage).

In some examples, the operations of 613 may be associated with selectively coupling each of the ferroelectric capacitors 220-*a* with the respective digit lines 210-*a* (e.g., with a relatively low magnitude selection voltage).

In some examples, each of the digit lines 210-*a* and the plate line 215-*a* may be biased at a same voltage (e.g., a ground voltage). Thus, as a result of the operations of 613, each of the ferroelectric capacitors 220-*a* may be equalized (e.g., because the respective cell selection components 230-*a* were activated by the word line idle or standby voltage). Thus, the operations of 613 may be an example of performing an equalization operation or dissipation operation on one or more of the memory cells 105-*b*-11 through 105-*b*-1*n* by causing a row component 125 (e.g., a row decoder) to activate one or more of the word lines 205-*a* (e.g., dissipating any accumulated leakage charge or bias). Accordingly, after the operations of 613, each of the ferroelectric capacitors 220-*a* may be returned to an equalized state (e.g., having a respective capacitor voltage $V_{cap}=0V$).

As the non-selected word line 205-*a*-*n* is biased at a higher voltage at 613, the operations of 613 may be an example of adjusting, during an interval, the non-selected word line 205-*a*-*n* to a voltage that is higher than a voltage during a preceding interval. In some examples, the operations of 613 may refer to operations occurring in a third interval (e.g., a third time interval, a third duration), though the operations of timing diagram 600 may be described according to different definitions of intervals.

As illustrated by the cell bottom voltage of the non-selected memory cells 105-*b* after 613, an accumulated leakage charge or bias (e.g., at the non-selected memory cell 105-*b*-1*n*) may be dissipated (e.g., as illustrated by the zero value of $\Delta V_{cap,1-n}$ at the end of the timing diagram 600). Thus, as illustrated by the example of timing diagram 600, operations may be performed after an access operation on a selected memory cell 105 (e.g., any one or more of the operations 601 through 512) to encourage or otherwise support the dissipation of leakage charge from non-selected memory cells 105, which may reduce or eliminate data loss that may otherwise result from an accumulation of leakage charge or bias.

Although illustrated as separate operations occurring at different times, certain operations may occur simultaneously, or in a different order. In some examples, various operations may be advantageously initiated simultaneously to reduce the amount of time for sensing a logic state of the memory cell 105-*b*. For example, any two or more of raising the voltage of the plate line 215-*a* at 602, activating the word line 205-*a*-1 at 603, deactivating the word line 205-*a*-*n* at 603, or providing a reference voltage to the sense component 150-*a* at 604, may occur in a different relative order, occur during overlapping durations, or occur simultaneously. Additionally or alternatively, isolating the sense amplifier 290-*a*-1 from the memory array 110-*a* at 605 and isolating the sense amplifiers 290-*a* from the reference component 285-*a* at 606 may occur in a different order, occur during overlapping durations, or occur simultaneously. Additionally or alternatively, coupling the sense amplifier 290-*a*-1 with the memory array 110-*a* at 608 and lowering the voltage of the plate line 215-*a* at 609 may occur in a different order, occur during overlapping durations, or occur simultaneously.

Additionally or alternatively, any two or more of equalizing the input nodes of the sense amplifiers 290-*a* at 611, coupling the sense amplifiers 290-*a* with the reference component 285-*a* at 612, or idling the word lines 205-*a* at 613 may occur in a different relative order, occur during overlapping durations, or occur simultaneously.

Figure 7:
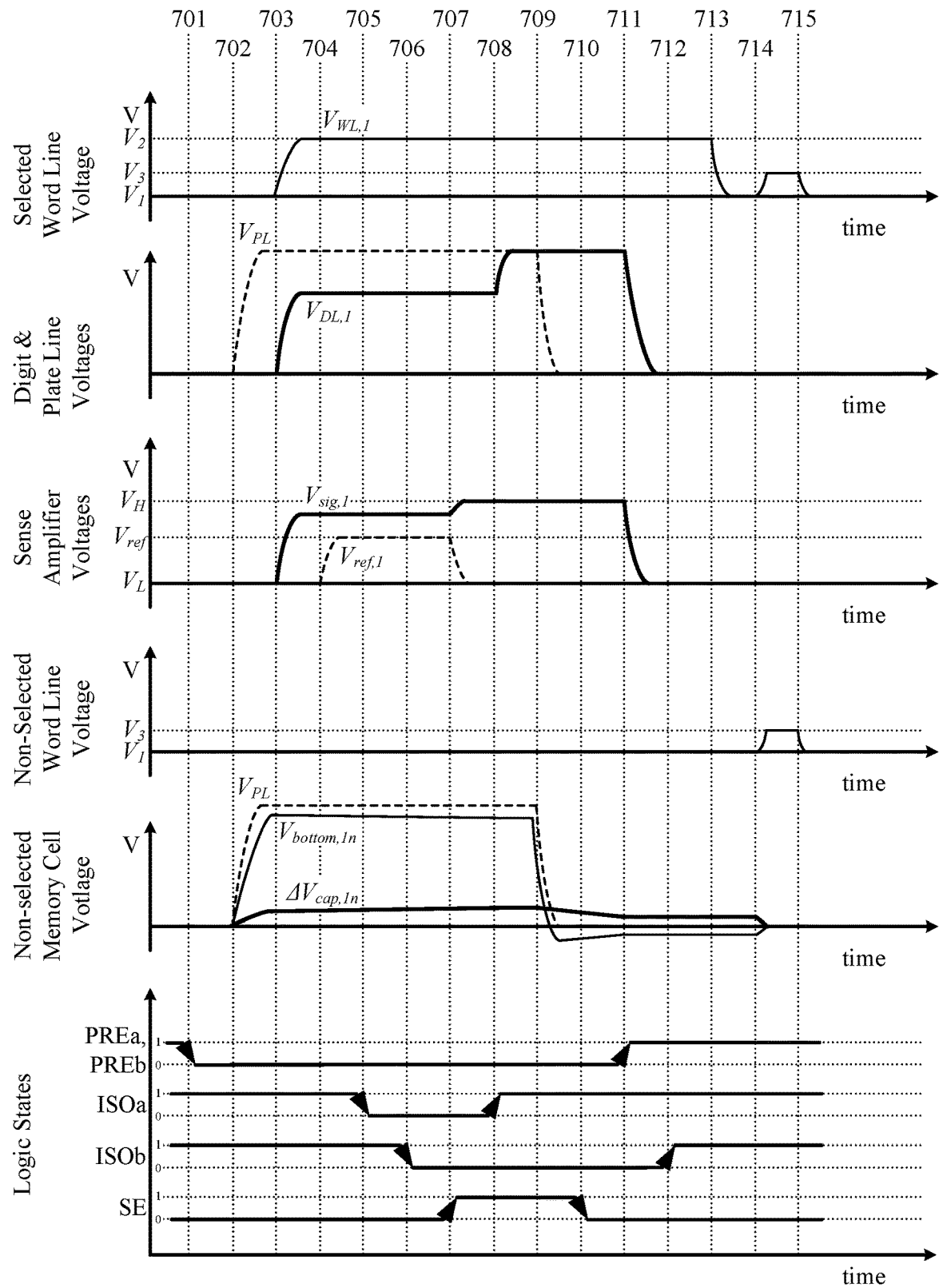

FIG. 7 shows a timing diagram 700 illustrating operations of an example access scheme for protecting stored data in a memory device in accordance with aspects of the present disclosure. The timing diagram 700 is described with reference to components of the example circuit 400 of FIG. 4, but may be illustrative of operations that may be performed with different circuit arrangements as well.

In the example of timing diagram 700, the memory cell 105-b-11 may be a selected memory cell 105. In other words, prior to or during the operations of timing diagram 700, the memory cell 105-b-11 may be selected or otherwise identified (e.g., by a memory controller 170) for an access operation (e.g., a read operation, which in some examples may include or be followed by a rewrite operation). Other memory cells 105-b (e.g., memory cells 105-b-12 through 105-b-1n) may be non-selected memory cells 105 in the example of timing diagram 700. In the example of timing diagram 700, the memory cell 105-b-11 may initially store a logic 1 state as described herein (e.g., with reference to FIG. 3). In the example of timing diagram 700, the non-selected memory cell 105-b-1n may also initially store a logic 1 state as described herein (e.g., with reference to FIG. 3).

In some examples, prior to initiating the operations of timing diagram 700 (e.g., during an idle period, an idle interval, a standby period, a standby interval), the digit lines 210-a and the plate line 215-a may be biased at the same voltage. Matching the voltage of digit lines 210-a and plate lines 215-a may minimize charge leakage in the memory array 110-a. For example, in the example of timing diagram 700, the digit lines 210-a and the plate line 215-a may have an initial voltage of 0V, which may be provided by various voltage sources (e.g., via the sense component 150-a, via the plate component 145-a, via a column component 135, via a signal development component 280). In other examples, the digit lines 210-a and the plate line 215-a may be biased at different voltages, which may or may not be equal between the digit lines 210-a and the plate line 215-a.

The timing diagram 700 may illustrate an access scheme in which the row component 125-a is configured to apply (e.g., bias) to each of the word lines 205-a one of three voltages to support the various operations described herein (e.g., for activating, deactivating, equalizing particular word lines 205-a). To support the operations of the timing diagram 700, the row component 125-a may include various configurations of voltage sources, voltage supplies, switching components, selection components, amplifiers, or voltage conversion components to apply a particular voltage to a particular one of the word lines 205-a.

A first voltage, $V_1$, may represent a word line idle or standby voltage. According to the example of timing diagram 700, the first voltage may, in some cases, be a ground or virtual ground voltage, and may be provided by a same voltage source as one or more of the voltage sources 410-a or 410-b, or may be coupled with a same voltage supply or chassis ground as one or more of the voltage sources 410-a or 410-b. The first voltage may have a value associated with deactivating a cell selection component 230-a under certain conditions. In some examples, the first voltage may have a value of 0V, and may be referred to as VSS.

A second voltage, $V_2$, may represent a cell access word line voltage. According to the example of timing diagram 700, the third voltage may, in some cases, be a relatively large positive voltage, and may have a magnitude large enough to activate a cell selection component 230-a under certain conditions (e.g., for read operations, for write operations, for rewrite operations, for refresh operations). In some examples, the second voltage may be selected to have a relatively large magnitude in order to support relatively fast access operations (e.g., as compared with using a lower voltage for selecting a memory cell 105-b for a read operation, write operation, rewrite operation, refresh operation). In some examples, the second voltage may have a value of 3.1V, and may be referred to as VCCP.

A third voltage, $V_3$, may represent a cell equalization or dissipation word line voltage. According to the example of timing diagram 700, the third voltage may, in some cases, be a relatively small positive voltage, and may have a magnitude large enough to activate a cell selection component 230-a under certain conditions (e.g., for equalization operations, for dissipation operations). In some examples, the third voltage may be selected to have a relatively small magnitude in order to support equalization or dissipation operations or states with relatively low power consumption (e.g., as compared with using a higher voltage for equalization or dissipation operations). In some examples, the third voltage may have a value of 1.0V, and may be referred to as VPWL.

At 701, the access operation may include decoupling one or more of the sense amplifiers 290-a from equalization voltage sources. For example, at 701, the access operation may include deactivating the switching components 405-c and 405-d (e.g., by deactivating logical signals PREa and PREb), which may selectively decouple the sense amplifiers 290-a from respective equalization voltage sources 410-a and 410-b. Thus, at 701, the respective signal voltages $V_{sig}$ and reference voltages $V_{ref}$ for the sense amplifiers 290-a may remain at zero volts.

At 702, the access operation may include raising the voltage of the plate line 215-a. For example, at 702, the plate component 145-a may couple the plate line 215-a with a voltage source having a relatively high voltage (e.g., a plate high voltage). In some examples, at 702, the plate component 145-a may decouple the plate line 215-a from a plate low voltage source (e.g., a ground voltage source, an idle plate line voltage source, a standby plate line voltage source) prior to coupling the plate line 215-a with the voltage source having the relatively high voltage. Thus, at 702, the plate line voltage may increase from the voltage prior to 702.

In some examples, the operations of 702 may be associated with driving a leakage charge into or out of non-selected memory cells 105-b. For example, due to the difference in the voltage of the plate line 215-a and the digit line 210-a-1 (e.g., $V_{PL}-V_{DL,1}$), leakage charge may flow across one or more of the cell selection components 230-a-12 through 230-a-1n associated with the memory cells 105-b-12 through 105-b-1n. Accordingly, leakage charge may flow into or out of one or more of the capacitors 220-a-12 through 220-a-1n, which may alter the charge state or logic state stored by one or more of the non-selected memory cells 105-b-12 through 105-b-1n. For example, as compared with the charge state 305-a described with reference to FIG. 3, the operations of 702 may cause a ferroelectric capacitor 220-1 of a non-selected memory cell (e.g., one or more of the memory cells 105-b-12 through 105-b-1n) to move along the path 360 (e.g., to charge state 305-e), which may represent a partial loss of polarization of one or more of the non-selected memory cells 105-b-12 through 105-b-1n.

The leakage charge associated with such operations may be illustrated by the voltage behavior of the non-selected memory cells 105-b (e.g., any one or more of the memory cells 105-b-12 through 105-b-1n, coupled with the digit line 210-a-1). For example, in the absence of charge leakage, the cell bottom voltages $V_{bottom,1}$ of non-selected memory cells 105-b-12 through 105-b-1n, coupled with the digit line 210-a-1, would generally follow the plate line voltage $V_{PL}$. However, in the example of timing diagram 700, the cell bottom voltage $V_{bottom,1-n}$ associated with the memory cell 105-b-1n (e.g., storing a logic 1) may not rise as high as the applied voltage $V_{PL}$, due to charge leakage from the cell bottom of the ferroelectric capacitor 220-a-1n through the cell selection component 230-a-1n to the digit line 210-a-1. Thus, the ferroelectric capacitor 220-a-1n (or the capacitor 220-a of any of the other non-selected memory cells 105-b-12 through 105-b-1n) may experience a change in voltage (e.g., an accumulated non-zero bias), illustrated by ΔVcap, 1-n, which may be associated with a change in charge state of the ferroelectric capacitor 220-a-1n (e.g. a transition from a charge state 305-a to a charge state 305-e).

In some examples, leakage charge may continue to flow after 702, (e.g., until the voltage of the plate line 215-a and the digit line 210-a-1 are equalized after 708, until the difference in voltage of the plate line 215-a and the digit line 210-a-1 is equal to a capacitor voltage $V_{cap}$ of a ferroelectric capacitor 220-a of a respective memory cell 105-a). The change in voltage of the ferroelectric capacitor 220-a-1n may continue to be illustrated by the voltage $\Delta V_{cap,1-n}$ throughout the operations of the timing diagram 700.

At 703, the operations may include a word line selection operation. For example, at 703, the row decoder may change the word line 205-a-1 associated with the selected memory cell 105-b-11 (e.g., the selected word line 205-a) from being biased at the first voltage (e.g., $V_1$, a word line idle or standby voltage) to being biased at the second voltage (e.g., $V_2$, a cell access word line voltage). In other words, the operations of 703 may be associated with activating or selecting the word line 205-a-1, which may include causing or initiating a transition in the bias applied to the word line 205-a-1. In some examples, the operations of 703 may be accompanied by determining to access the memory cell 105-b-11 (e.g., a determination by a memory controller 170), or otherwise identifying the memory cell 105-b-11 for performing an access operation. In some examples, the operations of 703 may be associated with selectively coupling the ferroelectric capacitor 220-a-11 with the digit lines 210-a-1. In some examples, the operations of 703 may be referred to as selecting the memory cell 105-b-11.

Because the word line 205-a-1 is coupled with the cell selection component 230-a-11, the cell selection component 230-a-11 may be activated as a result of the operations of 703. In other words, as a result of the operations of 703, the capacitor 220-a-11 may be selectively coupled with the digit line 210-a-1. Thus, charge may flow between the memory cell 105-b-11 and the digit line 210-a-1 based on the logic state stored by the memory cell 105-b-11 (e.g., based on a polarization state of the capacitor 220-a-11). Accordingly, in the example of the timing diagram 700, the voltage of the digit line 210-a-1 (e.g., $V_{DL,1}$) may rise as charge is shared with the digit line 210-a-1. Because the switching component 405-a-1 is activated at 703 (e.g., because the logical signal ISOa is activated), the signal voltage at the sense amplifier 290-a-1 (e.g., $V_{sig,1}$) may also rise and may be equal to $V_{DL,1}$ after 703. Thus, the operations of 703 may be an example of performing an access operation on the selected memory cell 105-b-11 by causing row component 125-a (e.g., a row decoder) to activate the word line 205-a-1.

At 704, the operations may include providing a reference voltage to the sense component 150-a. For example, at 704, the reference component 285-a may couple the reference line 265-a with a voltage source providing a reference voltage. The reference voltage may, in some cases, be selected as a value (e.g., an average) between the signal voltage generated when reading a memory cell 105-b that stores a logic 0 (e.g., $V_{sig}$ when reading a logic 0) and the signal voltage generated when reading a memory cell 105-b that stores a logic 1 (e.g., $V_{sig}$ when reading a logic 1). In some examples, at 704, the access operation may include the reference component 285-a decoupling the reference line 265-a from a ground voltage source prior to coupling the reference line 265-a with the voltage source providing the reference voltage. Thus, at 704, the voltage of the reference line 265-a (e.g., $V_{RL}$) may increase from the voltage prior to 704 (e.g., an idle or standby reference line voltage). Because the switching component 405-b-1 is activated at 704 (e.g., because the logical signal ISOb is activated), the reference voltage at the sense amplifier 290-a-1 (e.g., $V_{ref,1}$) may also rise and may be equal to $V_{RL}$ after 704. In other examples of access schemes that support self-referencing read operations (not shown), the illustrated operations at 704 may be replaced with one or more operations that develop a reference signal using the memory cell 105-b-11.

At 705, the operations may include isolating (e.g., decoupling) the sense amplifier 290-a-1 from the memory array 110-a. For example, at 705, the access operation may include deactivating the switching component 405-a-1 (e.g., by deactivating logical signal ISOa), which may isolate a signal node 291 of the sense amplifier 290-a-1 from the memory cell 105-b-11.

At 706, the operations may include isolating (e.g., decoupling) the sense amplifiers 290-a from the reference component 285-a. For example, at 706, the access operation may include deactivating the switching component 405-b-1 (e.g., by deactivating logical signal ISOb), which may isolate a reference node 292 of the sense amplifier 290-a-1 from the reference component 285-a.

At 707, the operations may include latching the result of detecting the logic state stored by the memory cell 105-b-11. For example, at 707, the sense amplifiers 290-a may be activated (e.g., by activating logical signal SE), which may couple the sense amplifier 290-a-1 with a high sense amplifier voltage source (e.g., a voltage source at a voltage $V_H$) and may couple the sense amplifier 290-a-1 with a low sense amplifier voltage source (e.g., a voltage source at a voltage $V_L$). Thus, in the example of timing diagram 700, where $V_{sig,1}$ is greater than $V_{ref,1}$ at 707, the $V_{sig,1}$ may rise to the voltage $V_H$ and $V_{ref,1}$ may fall to the voltage $V_L$ as a result of the operations of 707. The voltages of $V_{sig,1}$ or $V_{ref,1}$ (e.g., $V_H$ or $V_L$) may be provided as an output of the sense component 150-a (e.g., to a column component 135, to an input/output component 160, to a memory controller 170). In some examples, any one or more of the operations of 701 through 707 may be referred to as a read operation.

At 708, the operations may include coupling the sense amplifier 290-a-1 with the memory array 110-a. For example, at 708, the operations may include activating the switching component 405-a-1 (e.g., by activating logical signal ISOa), which may couple a signal node 291 of the sense amplifier 290-a-1 with the memory cell 105-b-11. Accordingly, the voltage of the digit line 210-a-1 (e.g., $V_{DL,1}$) may rise to voltage of the high sense amplifier voltage source (e.g., $V_H$), which in some examples may also be the voltage of the plate line high voltage source (e.g., as activated at 702).

At 709, the operations may include lowering the voltage of the plate line 215-a. For example, at 709, the plate component 145-*a* may couple the plate line 215-*a* with a voltage source having a relatively low voltage (e.g., a plate line low voltage, a ground voltage, a virtual ground voltage). In some examples, at 709, the plate component 145-*a* may decouple the plate line 215-*a* from a voltage source having a relatively high voltage prior to coupling the plate line 215-*a* with the voltage source having the relatively low voltage. Thus, at 709, the plate line voltage may drop from the voltage prior to 709 (e.g., returning to an idle or standby plate line voltage).

In some examples, the operations of 709 may be referred to as a rewrite operation, or be otherwise include in a rewrite operation of the memory cell 105-*b*-11. For example, at 709, the voltage applied across the ferroelectric capacitor 220-*a*-11 (e.g., $V_{cap}$) may be equal to the difference between the voltage of the digit line 210-*a*-1 (e.g., $V_{DL,1}$) and the plate line 215-*a* (e.g., $V_{PL}$). In some examples, the voltage applied across the ferroelectric capacitor 220-*a*-11 may correspond to the voltage 315 described with reference to FIG. 3, which may correspond to a positive saturation voltage. In other words, the operations of 709 may be associated with rewriting the memory cell 105-*b*-11 with a logic 1 state (e.g., returning the memory cell 105-*b*-11 to the logic state stored prior to the operations of timing diagram 700). Thus, after the operations of 709, the ferroelectric capacitor 220-*a*-11 may be positively saturated. In other examples, the operations of any one or more of 701 through 709, including a rewrite operation, may be referred to as a single access operation (e.g., a "read-plus-rewrite" operation). In some examples, operations of 709 may be performed separately from a read operation, and may alternatively be referred to as a "write" operation.

In some examples, the operations of 709 may also be associated with driving a leakage charge into non-selected memory cells 105. For example, due to the difference in the voltage of the digit line 210-*a*-1 and the plate line 215-*a* (e.g., $V_{DL,1}$-$V_{PL}$), leakage charge may flow across one or more of the cell selection components 230-*a*-12 through 230-*a*-1*n* of the memory cells 105-*b*-12 through 105-*b*-1*n*. Accordingly, leakage charge may flow into one or more of the capacitors 220-*a*-12 through 220-*a*-1*n*, which may alter the logic state stored by one or more of the non-selected memory cells 105-*b*-12 through 105-*b*-1*n*.

In some examples, the leakage charge associated with the operations of 709 may flow in a direction opposite from a flow of leakage charge associated with the operations of 702. In other words, as compared with the charge state 305-*e* described with reference to FIG. 3, the operations of 709 may cause a ferroelectric capacitor 220-1 of a non-selected memory cell (e.g., one or more of the memory cells 105-*b*-12 through 105-*b*-1*n*) to move towards the charge state 305-*f*. In some examples, leakage charge or bias may continue to accumulate after 709, (e.g., until the voltage of the plate line 215-*a* and the digit line 210-*a*-1 are equalized after 711, until the difference in voltage of the plate line 215-*a* and the digit line 210-*a*-1 is equal to a capacitor voltage $V_{cap}$ of a respective memory cell 105-*b*).

At 710, the operations may include deactivating the sense component 150-*a*. For example, at 710, the sense amplifiers 290-*a* may be deactivated (e.g., by deactivating logical signal SE), which may decouple the sense amplifier 290-*a*-1 from a high sense amplifier voltage source (e.g., a voltage source at a voltage $V_H$) and may decouple the sense amplifier 290-*a*-1 from a low sense amplifier voltage source (e.g., a voltage source at a voltage $V_L$). In the example of timing diagram 700, the signal node voltage $V_{sig,1}$ and the reference node voltage $V_{ref,1}$ may hold at their respective values as a result of the operations of 710.

At 711, the operations may include equalizing the input nodes of the sense amplifiers 290-*a*. For example, at 711, the operations may include activating the switching components 405-*c* and 405-*d* (e.g., by activating logical signals PREa and PREb), which may selectively couple the sense amplifiers 290-*a* with respective equalization voltage sources 410-*a* and 410-*b*. Thus, at 711, the signal voltages $V_{sig}$ and reference voltages $V_{ref}$ for the sense amplifiers 290-*a* may be biased at zero volts.

At 712, the operations may include coupling the sense amplifiers 290-*a* with the reference component 285-*a*. For example, at 712, the operations may include activating the switching component 405-*b*-1 (e.g., by activating logical signal ISOb), which may couple a reference node 292 of the sense amplifier 290-*a*-1 with the reference component 285-*a*. In some examples, at 712, the reference component 285-*a* may couple the reference line 265-*a* with a ground voltage source (e.g., having a voltage equal to the equalization voltage sources 410-*a*) prior to coupling the sense amplifiers 290-*a* with the reference component 285-*a*. In some examples, the operations of one or more of 704 through 712 may refer to operations occurring in a second interval (e.g., a second time interval, a second duration), though the operations of timing diagram 700 may be described according to different definitions of intervals. As a result of the word line 205-*a*-*n* being biased at the third voltage during such operations, the biasing of the word line 205-*a*-*n* may be considered an example of biasing, during an interval for performing an access operation (e.g., a second interval), a non-selected word line 205-*a* to a third voltage.

At 713, the operations may include deactivating the selected word line 205-*a*-1. For example, at 713, the row component 125-*a* may change the selected word line 205-*a*-1 from being biased at the second voltage (e.g., $V_2$, the cell access word line voltage) to being biased at the first voltage (e.g., $V_1$, a word line idle or standby voltage). In some examples, the operations of 713 may be associated with selectively decoupling the ferroelectric capacitors 220-*a*-11 from the respective digit line 210-*a*-1.

As illustrated by the cell bottom voltage of a non-selected memory cell 105-*b* (e.g., $V_{bottom,1n}$) after 713, a cell selection component 230-*a* of non-selected memory cells 105-*a* (e.g., one or more of the memory cells 105-*b*-12 through 105-*b*-1*n*) may be deactivated, but leakage charge may nonetheless flow through the respective deactivated cell selection components 230-*a* during an access operation associated with the selected memory cell 105-*b*-11 (e.g., during the operations of any one or more of 701 through 713). In the example of ferroelectric memory cells 105-*b*, the leakage charge or bias may accumulate at the ferroelectric capacitors 220-*a* of the non-selected memory cells 105-*b*, which may alter the polarization of the ferroelectric capacitors 220-*a* (e.g., as illustrated by the non-zero value of $\Delta V_{cap,1n}$ after 713).

For example, when the ferroelectric capacitor 220-*a*-1*n* of non-selected memory cell 105-*b*-1*n* is at a charge state 305-*a* (e.g., storing a logic 1), leakage charge or bias associated with an access operation on the selected memory cell 105-*b*-11 may cause the charge state of the non-selected memory cell 105-*b*-1*n* to follow at least a portion of the path 360 described with reference to FIG. 3. In some examples, a first access operation (e.g., one or more of the operations of 701 through 719) on the selected memory cell 105-*b*-11 may cause the ferroelectric capacitor 220-*a*-1*n* the memory cell 105-b-1n to reach the charge state 305-e described with reference to FIG. 3, which may correspond to the level of the voltage $\Delta V_{cap,1n}$.

In the event that non-selected memory cell 105-b-1n remains as non-selected for subsequent access operations (e.g., following the operations of 713) for selected memory cells, the charge state of memory cell 105-b-1n may continue along the path 360 as leakage charge or bias continues to accumulate, until reaching charge state 305-c described with reference to FIG. 3, for example (e.g., accumulating a larger $\Delta V_{cap}$). The charge state 305-c may illustrate a substantial loss of polarization, which may illustrate a loss of data at the memory cell 105-b-1n from such accumulated leakage charge or bias. However, operations may be performed after an access operation on the selected memory cell 105-b-11 (e.g., after the operations of one or more of 701 through 713) to encourage or otherwise support the dissipation of leakage charge or bias from the non-selected memory cells 105-b-1n, which may reduce or eliminate data loss that may otherwise result from an accumulation of leakage charge or bias.

At 714, the operations may include activating each of the word lines 205-a-1 through 205-a-n (e.g., for an equalization operation, for a dissipation operation). For example, at 714, the row decoder may change from each of the word lines 205-a being biased at the first voltage (e.g., $V_1$, a word line idle or standby voltage) to being biased at the third voltage (e.g., $V_3$, a cell equalization or dissipation word line voltage). In some examples, the operations of 714 may be associated with selectively coupling each of the ferroelectric capacitors 220-a with the respective digit lines 210-a (e.g., with a relatively low magnitude selection voltage).

In some examples, each of the digit lines 210-a and the plate line 215-a may be biased at a same voltage (e.g., a ground voltage). Thus, as a result of the operations of 714, each of the ferroelectric capacitors 220-a may be equalized (e.g., because the respective cell selection components 230-a were activated by the word line idle or standby voltage). Thus, the operations of 714 may be an example of performing an equalization operation or dissipation operation on one or more of the memory cells 105-b-11 through 105-b-1n by causing a row component 125 (e.g., a row decoder) to activate one or more of the word lines 205-a (e.g., dissipating any accumulated leakage charge or bias). Accordingly, after the operations of 714, each of the ferroelectric capacitors 220-a may be returned to an equalized state (e.g., having a respective capacitor voltage $V_{cap}$=0V). In some examples, the operations of 714 may refer to operations occurring in a third interval (e.g., a third time interval, a third duration), though the operations of timing diagram 700 may be described according to different definitions of intervals. As the non-selected word line 205-a-n is biased at a higher voltage at 714, the operations of 714 may be an example of adjusting, during an interval, the non-selected word line 205-a-n to a voltage that is higher than a voltage during a preceding interval.

At 715, the operations may include idling each of the word lines 205-a-1 through 205-a-n. For example, at 715, the row decoder may change from each of the word lines 205-a being biased at the third voltage (e.g., $V_3$, a cell equalization or dissipation word line voltage) to being biased at the first voltage (e.g., $V_1$, a word line idle or standby voltage). In some examples, the operations of 715 may be associated with selectively decoupling each of the ferroelectric capacitors 220-a with the respective digit lines 210-a (e.g., with a relatively low magnitude selection voltage). In some examples, the operations of 714 and 715 may be referred to collectively as an equalization operation or a dissipation operation.

As illustrated by the cell bottom voltage of the non-selected memory cells 105-b after 715, an accumulated leakage charge or bias (e.g., at the non-selected memory cell 105-b-1n) may be dissipated (e.g., as illustrated by the zero value of $\Delta V_{cap,1-n}$ at the end of the timing diagram 700). Thus, as illustrated by the example of timing diagram 700, operations may be performed after an access operation on a selected memory cell 105 (e.g., any one or more of the operations 701 through 713) to encourage or otherwise support the dissipation of leakage charge from non-selected memory cells 105, which may reduce or eliminate data loss that may otherwise result from an accumulation of leakage charge or bias.

Although illustrated as separate operations occurring at different times, certain operations may occur simultaneously, or in a different order. In some examples, various operations may be advantageously initiated simultaneously to reduce the amount of time for sensing a logic state of the memory cell 105-b. For example, any two or more of raising the voltage of the plate line 215-a at 702, activating the word line 205-a-1 at 703, or providing a reference voltage to the sense component 150-a at 704, may occur in a different relative order, occur during overlapping durations, or occur simultaneously. Additionally or alternatively, isolating the sense amplifier 290-a-1 from the memory array 110-a at 705 and isolating the sense amplifiers 290-a from the reference component 285-a at 706 may occur in a different order, occur during overlapping durations, or occur simultaneously. Additionally or alternatively, coupling the sense amplifier 290-a-1 with the memory array 110-a at 708 and lowering the voltage of the plate line 215-a at 709 may occur in a different order, occur during overlapping durations, or occur simultaneously. Additionally or alternatively, any two or more of equalizing the input nodes of the sense amplifiers 290-a at 711, coupling the sense amplifiers 290-a with the reference component 285-a at 712, or deselecting the word line 205-a-1 at 713 may occur in a different relative order, occur during overlapping durations, or occur simultaneously. In some examples, the operations of 713 may be omitted, in which case the selected word line may transition directly from the second voltage $V_2$ to the third voltage $V_3$.

Although the described equalization or dissipation operations are illustrated in timing diagrams 500, 600, and 700 as occurring after an access operation (e.g., based on performing at least one access operation), in some examples, the described equalization operations or dissipation operations may occur at other intervals, be otherwise associated with other intervals or conditions (e.g., trigger conditions), and/or be based on other operations or conditions. For example, word lines 205 may be activated with an activation voltage that may be the same as a selection voltage associated with access operations (e.g., a voltage VCCP) or may be different from a selection voltage associated with access operations (e.g., VPWL, a lower voltage than a selection voltage associated with access operations). In various examples, during one or more equalization operations or dissipation operations, associated digit lines 210 or plate lines 215 may be equalized (e.g., biased with a ground voltage, biased with a virtual ground voltage), or may be biased with another voltage or combination of voltages that otherwise supports the dissipation of accumulated charge (e.g., a charge associated with a non-zero voltage across capacitors 220 of memory cells 105).

In one example, the operations of 714 and 715 (e.g., selecting and deselecting a plurality of word lines 205) described with reference to the timing diagram 700 may be triggered (e.g., repeated, performed separately from other access operations) based on a timer (e.g., an elapsed time since a prior access operation, an elapsed time since a prior equalization operation or dissipation operation, an elapsed time since a memory device was enabled or otherwise powered on). In some examples, performing the operations of 714 and 715 may dissipate charge accumulated from operations occurring since a prior equalization operation or dissipation operation. A duration of such a timer may be fixed (e.g., predetermined, preconfigured), or a duration of such a timer may be variable (e.g., dynamic, calculated based on operating conditions).

In another example, the operations of 514 and 515 (e.g., equalizing a plurality of word lines and selecting a plurality of word lines to return to a selected idle state) described with reference to the timing diagram 500 may be triggered based at least in part on a timer. In some examples, an interval between 514 and 515 may be used to reduce power consumption (e.g., power consumption associated with providing a selected idle state to a plurality of word lines). In some examples, an interval between 514 and 515 may be selected or calculated based on one or more operation conditions such as access rate, voltage states, logic states, or others, or some combination.

In some examples, equalization operations or dissipation operations may be scheduled to occur at intervals (e.g., periodic, aperiodic), but may be canceled or overridden if an access operation (e.g., one or more access operations using the word lines 205 associated with the equalization operation or dissipation operation) is being performed. In some examples, equalization operations or dissipation operations may be triggered based on one or more access operations, which may include: determining to perform an equalization operation or dissipation operation after a write operation, determining to perform an equalization operation or dissipation operation after a write operation, determining to perform an equalization operation or dissipation operation after a read operation associated with a particular logic state, and determining to perform an equalization operation or dissipation operation after a write operation associated with a particular logic state, among others. In some examples, equalization operations or dissipation operations may be triggered after a determined quantity of access operations (e.g., a quantity of a particular type of access operation, a quantity of a particular set of access operation types), such as after every other access operation, every third access operation, and so on.

The order of operations shown in the timing diagrams 500, 600, and 700 are for illustration only, and various other orders and combinations of steps may be performed in accordance with the present disclosure. Further, the timing of the operations of the timing diagrams 500, 600, and 700 are also for illustration purposes only, and are not meant to indicate a particular relative duration between one operation and another. Various operations may occur over a duration or time interval that is relatively shorter or relatively longer than illustrated in various embodiments of access schemes for protecting stored data in a memory device in accordance with the present disclosure.

The transitions of the logical signals of the timing diagrams 500, 600, and 700 are illustrative of transitions from one state to another, and generally reflect transitions between a disabled or deactivated state (e.g., state "0") and an enabled or activated state (e.g., state "1") as associated with a particular numbered operation. In some examples, the states may be associated with a particular voltage of the logical signal (e.g., a logical input voltage applied to a gate of a transistor operating as a switch), and the change in voltage from one state to another may not be instantaneous. Rather, in some examples, a voltage associated with a logical signal may follow a ramping behavior, or time-constant (e.g., logarithmic or exponential) behavior over time from one logical state to another.

In some examples, the transition of a component from one state to another may be based on characteristics of the associated logical signal, including the voltage level of the logical signal or the transition characteristics of the logical signal itself. Thus, the transitions shown in the timing diagrams 500, 600, and 700 are not necessarily indicative of an instantaneous transition. Further, the initial state of a logical signal associated with a transition at a numbered operation may have been arrived during various times preceding the numbered operation while still supporting the described transitions and associated operations. Although logical signals are shown as a transition between logical states, the voltage of a logical signal may be selected to operate a component at a particular working point (e.g., in an active region or in a saturation region), and may be the same as, or different from a voltage of other logical signals.

In some examples, the operations illustrated by timing diagrams 500, 600, and 700 may be selected for particular operating characteristics. For example, by employing a negative deselection voltage (e.g., as one of four voltages applied by a row component 125 to particular word lines), the operations of timing diagram 500 may be selected for minimizing leakage current or bias on a non-selected memory cell 105 during an access operation on a selected memory cell 105. In some examples, it may be beneficial to employ fewer voltage sources, so the operations of timing diagrams 600 or 700 may be selected to employ fewer voltage sources (e.g., three voltage sources, compared with the four voltage sources of timing diagram 500). In some examples, the operations of timing diagram 700 may be selected to avoid applying a separate deselection voltage being applied when a particular word line is selected, or to employ a ground or 0V idle voltage, or to perform an equalization operation or dissipation operation equally on all of a set of word lines 205 (e.g., all of word lines 205-*a*-1 through 205-*a*-*n*, as illustrated by the timing diagram 700). In some examples, the operations of timing diagram 600 may be selected so that cell selection components 230-*a* remain activated during an idle state, such that memory cells 105 may remain equalized between access operations. Additionally or alternatively, the operations of timing diagram 600 may be selected to reduce access operation duration (e.g., increase access operation speed), due to the relatively fewer operations of timing diagram 600 as compared with the number of operations of timing diagrams 500 or 700.

In some examples, a row component 125-*a* may be configured specifically to support the operations of one of the timing diagrams 500, 600, or 700. For example, a row component 125-*a* may be designed such that applying a positive selection voltage to a selected one of the word lines 205-*a* is explicitly accompanied by applying a negative deselection voltage to each of the non-selected word lines 205-*a* (e.g., with or without applying an intervening ground voltage before applying a selection or deselection voltage), which may support an example of the operations of timing diagram 500. Such a row component 125-*a* may be configured with four voltage sources as described with reference to FIG. 5. In another example, a row component 125-*a* may be designed such that applying a positive selection voltage to a selected one of the word lines 205-*a* is explicitly accompanied by applying a ground or 0V deselection voltage to each of the non-selected word lines 205-*a*, which may support an example of the operations of timing diagram 600. Such a row component 125-*a* may be configured with three voltage sources as described with reference to FIG. 6. In another example, a row component 125-*a* may be designed for applying a positive selection voltage to a single selected one of the word lines 205-*a*, without applying a deselection voltage to each of the non-selected word lines 205-*a*. Rather, such a row-component may separately apply a selection or other activation voltage to each of the word lines 205-*a*-1 through 205-*a*-*n* to perform an equalization operation or dissipation operation on each of the word lines, which may support an example of the operations of timing diagram 700. Such a row component 125-*a* may be configured with three voltage sources as described with reference to FIG. 7.

In other examples, a row component 125-*a* may be configured to support the operations of more than one of the timing diagrams 500, 600, or 700. Such a row component 125-*a* may be operated by selecting a particular mode of operation corresponding to one of the timing diagrams 500, 600, or 700 (e.g., for a first access operation on a selected memory cell), depending on desired operational characteristics for particular access operations. At a different time (e.g., for a second access operation on a selected memory cell), such a row component may be operated by selecting a different mode of operation corresponding to a different one of timing diagrams 500, 600, or 700.

Figure 8:
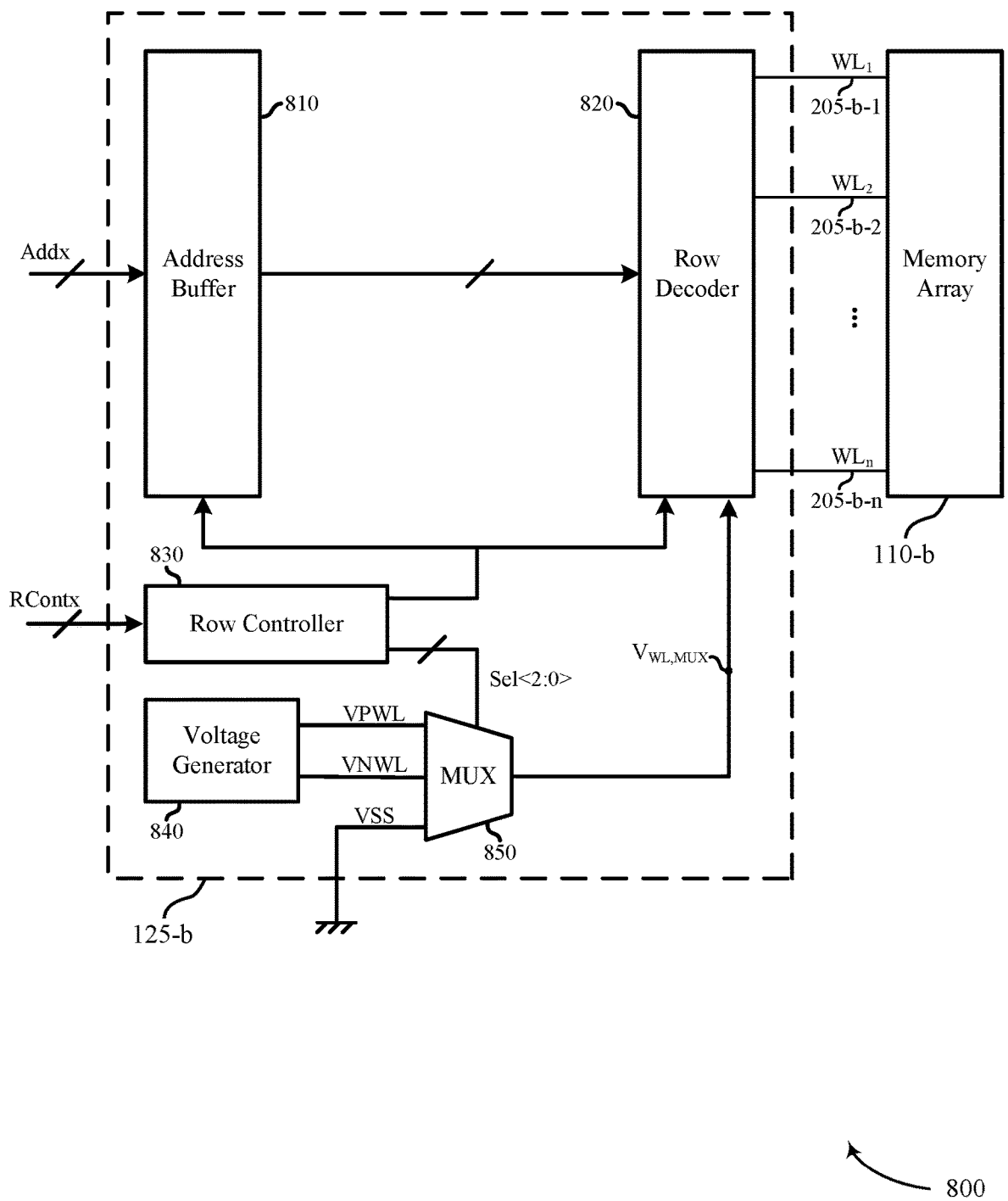
FIGS. 8 through 12 illustrate circuits including row components that support protecting stored data in a memory device in accordance with examples of the present disclosure.

FIG. 8 illustrates a circuit 800 including an example of a row component 125-*b* that supports protecting stored data in a memory device in accordance with examples of the present disclosure. In some examples, the circuit 800 may be included in a memory device, such as memory device 100 described with reference to FIG. 1. In some examples, the circuit 800 may be a component of another circuit, such as circuit 400 described with reference to FIG. 4.

The row component 125-*b* may receive control signals for various access operations, which may include one or more address signals (e.g., "Addx" signals) or row control signals (e.g., "RContx" signals). In some examples, the row component 125-*b* may receive control signals from a memory controller 170. The row component 125-*b* may be in communication with a memory array 110-*b*, which may be an example of the memory arrays 110 described herein. In the example of circuit 800, the row component 125-*b* may be in communication with the memory array 110-*b* via one or more of n word lines 205-*b* (e.g., one or more of word lines 205-*b*-1 through 205-*b*-*n*).

In the example of circuit 800, the row component 125-*b* may include an address buffer 810, a row decoder 820, a row controller 830, a voltage generator 840, and a voltage multiplexer (MUX) 850. Each of the described components of the row component 125-*b* may be in communication (e.g., in electronic communication) with components within the illustrative boundary of the row component 125-*b*, or with components outside the illustrative boundary of the row component 125-*b*, including the illustrated connections between components. However, other configurations are possible in accordance with the present disclosure.

The address buffer 810 may receive control signals (e.g., "Addx" signals) from another component of a memory device (e.g., a memory controller 170), or signals from another component of the row component 125-*b* (e.g., a row controller 830). The row decoder 820 may be in communication with the memory array 110-*b* (e.g., coupled with cell selection components 230 of a set of memory cells 105 of the memory array 110-*b*) for exchanging various signals with the memory array 110-*b* (e.g., via one or more of the word lines 205-*b*-1 through 205-*b*-*n*). For example, the row decoder 820 may support various examples of selecting a word line 205-*b*, activating a word line 205-*b*, deselecting a word line 205-*b*, deactivating a word line 205-*b*, equalizing a word line 205-*b*, performing equalization operations, performing dissipation operations, or others (e.g., as described with reference to timing diagrams 500, 600, and 700). In some examples, the row decoder 820 may receive signals (e.g., logical signals, voltages, currents, charge) from the address buffer 810, the row controller 830, the voltage multiplexer 850, or various combinations thereof, to support or control such operations.

In some examples, the row controller 830 may be configured to support the selection of certain voltages to be applied to one or more of the word lines 205-*b*-1 through 205-*b*-*n* (e.g., via the row decoder 820). For example, the row controller 830 may be in communication with a voltage multiplexer 850, which may support the selection of one of a set of voltage sources for biasing one or more of the word lines 205-*b*. The voltage multiplexer 850 may select from a set of voltages based on a received control signal (e.g., "Sel<2:0>" received from the row controller). The voltage multiplexer 850 may provide a selected voltage (e.g., $V_{WL, MUX}$) to the row decoder 820, and the row decoder may apply the selected voltage to one or more of the word lines 205-*b*-1 through 205-*b*-*n*.

In some examples, the voltage multiplexer 850 may be in communication with a voltage generator 840, which may represent a voltage supply that provides the voltage multiplexer 850 with one or more voltage sources (e.g., a positive word line voltage VPWL, a negative word line voltage VNWL, or others). In some examples, the voltage multiplexer 850 may also be in communication with a ground voltage source (e.g., VSS), which may be part of the voltage generator 840, part of another component of the row component 125-*b*, or provided from outside the row component 125-*b* as illustrated. Although shown within the illustrative boundary of the row component 125-*b*, in other examples, the voltage multiplexer 850, the voltage generator 840, or both, may be considered to be outside the illustrative boundary of the row component 125-*b* (e.g., may be considered to be part of another component of a memory device or part of another circuit of a memory device.)

Thus, the row component 125-*b* may be an example of a means for performing one or more of the described operations for protecting stored data in a memory device (e.g., one or more of the operations described with reference to the timing diagrams 500, 600, or 700). In some examples, the row component 125-*b* may be configured specifically to support the operations of one of the timing diagrams 500, 600, or 700. In other examples, the row component 125-*b* may be configured to support the operations of more than one of the timing diagrams 500, 600, or 700, and the row component 125-*b* may be operated by selecting (e.g., by a memory controller 170) a particular mode of operation corresponding to one of the timing diagrams 500, 600, or 700 (e.g., for a first access operation on a selected memory cell), depending on desired operational characteristics for particular access operations. At a different time (e.g., for a second access operation on a selected memory cell), the row component 125-*b* may be operated by selecting a different mode of operation corresponding to a different one of timing diagrams 500, 600, or 700.

Figure 9:
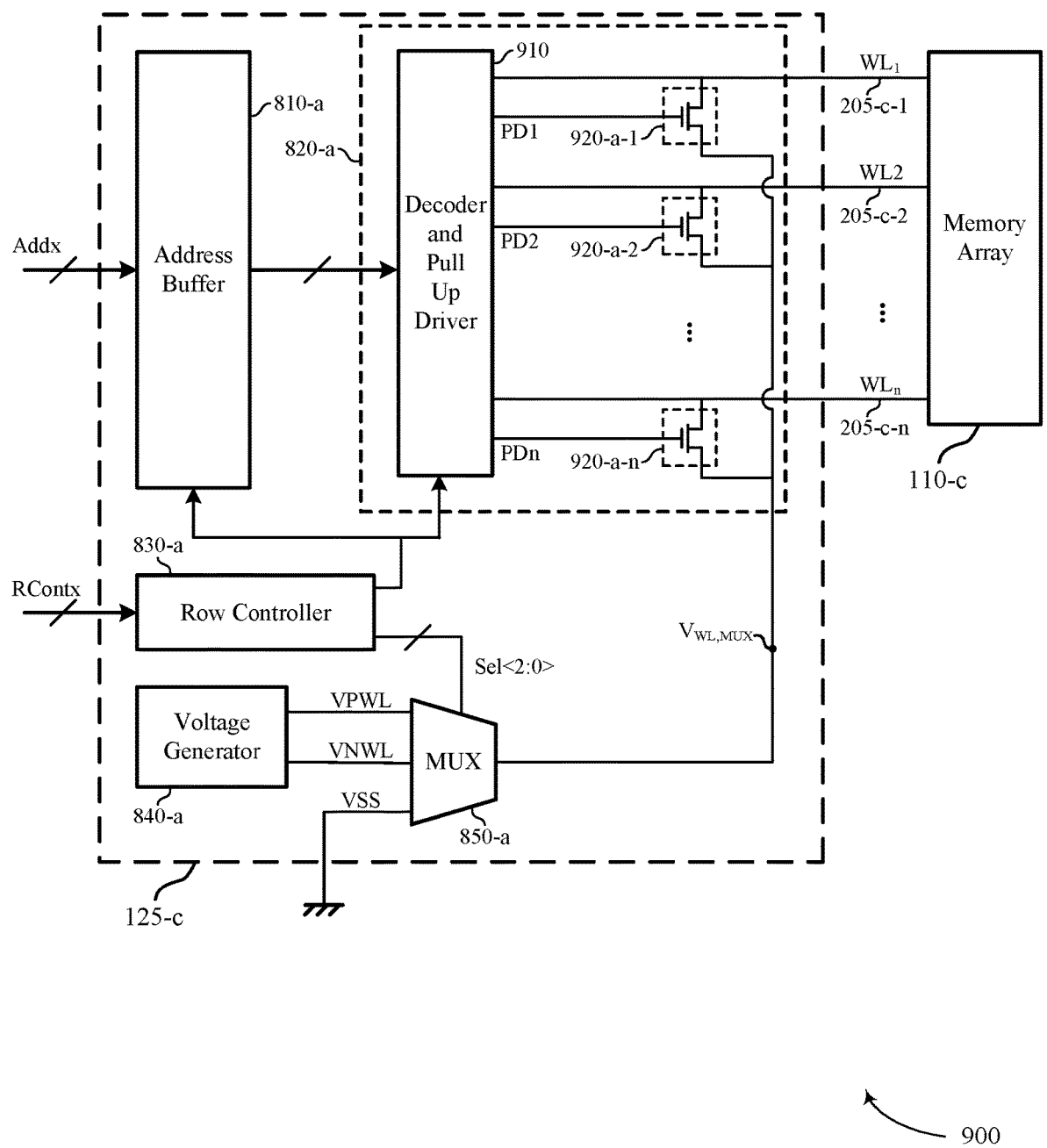

FIG. 9 illustrates a circuit 900 including an example of a row component 125-c that supports protecting stored data in a memory device in accordance with examples of the present disclosure. In some examples, the circuit 900 may be included in a memory device, such as memory device 100 described with reference to FIG. 1. In some examples, the circuit 900 may be a component of another circuit, such as circuit 400 described with reference to FIG. 4.

The row component 125-c may receive control signals for various access operations, which may include one or more address signals (e.g., "Addx" signals) or row control signals (e.g., "RContx" signals). In some examples, the row component 125-c may receive control signals from a memory controller 170. The row component 125-c may be in communication with a memory array 110-c, which may be an example of the memory arrays 110 described herein. In the example of circuit 900, the row component 125-c may be in communication with the memory array 110-c via one or more of n word lines 205-c (e.g., one or more of word lines 205-c-1 through 205-c-n).

In the example of circuit 900, the row component 125-c may include an address buffer 810-a, a row decoder 820-a, a row controller 830-a, a voltage generator 840-a, and a voltage multiplexer (MUX) 850-a. Each of the described components of the row component 125-c may be in communication (e.g., in electronic communication) with components within the illustrative boundary of the row component 125-c, or with components outside the illustrative boundary of the row component 125-c, including the illustrated connections between components. However, other configurations are possible in accordance with the present disclosure.

The address buffer 810-a may receive control signals (e.g., "Addx" signals) from another component of a memory device (e.g., a memory controller 170), or signals from another component of the row component 125-c (e.g., a row controller 830-a). The row decoder 820-a may be in communication with the memory array 110-c (e.g., coupled with cell selection components 230 of a set of memory cells 105 of the memory array 110-c) for exchanging various signals with the memory array 110-c (e.g., via one or more of the word lines 205-c-1 through 205-c-n). For example, the row decoder 820-a may support various examples of selecting a word line 205-c, activating a word line 205-c, deselecting a word line 205-c deactivating a word line 205-c, equalizing a word line 205-c, performing an equalization operation, performing a dissipation operation, or others (e.g., as described with reference to timing diagrams 500, 600, and 700). In some examples, the row decoder 820-a may receive signals (e.g., logical signals, voltages, currents, charge) from the address buffer 810-a, the row controller 830-a, the voltage multiplexer 850-a, or various combinations thereof, to support or control such operations.

In the example of row component 125-c, the row decoder 820-a may include a decoder and pull up driver 910 coupled with a set of transistors 920-a (e.g., n-type transistors). The decoder and pull up driver 910 may be coupled with a gate or control node of each of the transistors 920-a. A source or supply node of each of the transistors 920-a may be coupled with the output of the voltage multiplexer 850-a (e.g., applying or biasing the source or supply node with the selected voltage, $V_{WL,MUX}$). A drain or output node of each of the transistors 920-a may be coupled with respective ones of the word lines 205-c-1 through 205-c-n (e.g., coupled with the decoder and pull up driver 910 and the memory array 110-c). Although illustrated as including transistors 920-a, in other examples, a row decoder 820-a may employ other types of switching or selection components in place of the transistors 920-a.

In some examples, the decoder and pull up driver 910 may be configured to selectively couple or decouple the output of the voltage multiplexer 850-a, or other voltage supply, with one or more of the word lines 205-c-1 through 205-c-n (e.g., by activating or deactivating one or more of the logical signals PD1 through PDn). In some examples, the decoder and pull up driver 910 may support applying an idle or standby voltage (e.g., VPWL as described with reference to timing diagrams 500 or 600, VSS as described with reference to timing diagram 700) to one or more of the word lines 205-c, and the row component 125-c may be referred to as a "word-line high standby controller." In some examples, the decoder and pull up driver 910 may support applying a cell deselection voltage (e.g., VNWL as described with reference to timing diagram 500, VSS as described with reference to timing diagrams 600 or 700) to one or more of the word lines 205-c. In some examples, the decoder and pull up driver 910 may support applying a cell selection voltage (e.g., VCCP as described with reference to timing diagrams 500, 600, or 700) to one or more of the word lines 205-c.

In some examples, the decoder and pull up driver 910 may provide a bias directly to one or more of the word lines 205-c-1 through 205-c-n, which in some examples may correspond to the decoder and pull up driver 910 applying a cell selection bias or voltage to a selected one or more of the word lines 205-c (e.g., to access a selected memory cell 105). In some examples, a cell selection voltage (e.g., VCCP, as described with reference to timing diagrams 500, 600, or 700) may be provided by a voltage source separate from the voltage generator 840-a (e.g., via a pump circuit, not shown). In some examples, when one of the word lines 205-c is selected or activated, the corresponding PD signal may be deactivated (e.g., when word line 205-c-1 is selected or activated, the logical signal PD1 may be deactivated). In some examples, when one of the word lines 205-c is deselected or deactivated, the corresponding PD signal may be activated (e.g., when word line 205-c-n is deselected or deactivated, the logical signal PDn may be activated).

In some examples, the row controller 830-a may be configured to support the selection of certain voltages to be applied to one or more of the word lines 205-c-1 through 205-c-n (e.g., via the row decoder 820-a). For example, the row controller 830-a may be in communication with the decoder and pull up driver 910 and a voltage multiplexer 850-a, which may support the selection of one of a set of voltage sources for biasing one or more of the word lines 205-c. The voltage multiplexer 850-a may select from a set of voltages based on a received control signal (e.g., "Sel<2:0>" received from the row controller). The voltage multiplexer 850-a may provide a selected voltage (e.g., $V_{WL,MUX}$) to the row decoder 820-a, and the row decoder may apply the selected voltage to one or more of the word lines 205-c-1 through 205-c-n.

In some examples, the voltage multiplexer 850-a may be in communication with a voltage generator 840-a, which may represent a voltage supply that provides the voltage multiplexer 850-a with one or more voltage sources (e.g., a positive word line voltage VPWL, a negative word line voltage VNWL, or others). In some examples, the voltage multiplexer 850-a may also be in communication with a ground voltage source (e.g., VSS), which may be part of the voltage generator 840-a, part of another component of the row component 125-c, or provided from outside the row component 125-c as illustrated. Although shown within the illustrative boundary of the row component 125-*c,* in other examples, the voltage multiplexer 850-*a,* the voltage generator 840-*a,* or both, may be considered to be outside the illustrative boundary of the row component 125-*c* (e.g., may be considered to be part of another component of a memory device or part of another circuit of a memory device.)

Thus, the row component 125-*c* may be an example of a means for performing one or more of the described operations for protecting stored data in a memory device (e.g., one or more of the operations described with reference to the timing diagrams 500, 600, or 700). In some examples, the row component 125-*c* may be configured specifically to support the operations of one of the timing diagrams 500, 600, or 700. In other examples, the row component 125-*c* may be configured to support the operations of more than one of the timing diagrams 500, 600, or 700, and the row component 125-*c* may be operated by selecting (e.g., by a memory controller 170) a particular mode of operation corresponding to one of the timing diagrams 500, 600, or 700 (e.g., for a first access operation on a selected memory cell), depending on desired operational characteristics for particular access operations. At a different time (e.g., for a second access operation on a selected memory cell), the row component 125-*c* may be operated by selecting a different mode of operation corresponding to a different one of timing diagrams 500, 600, or 700.

Figure 10:
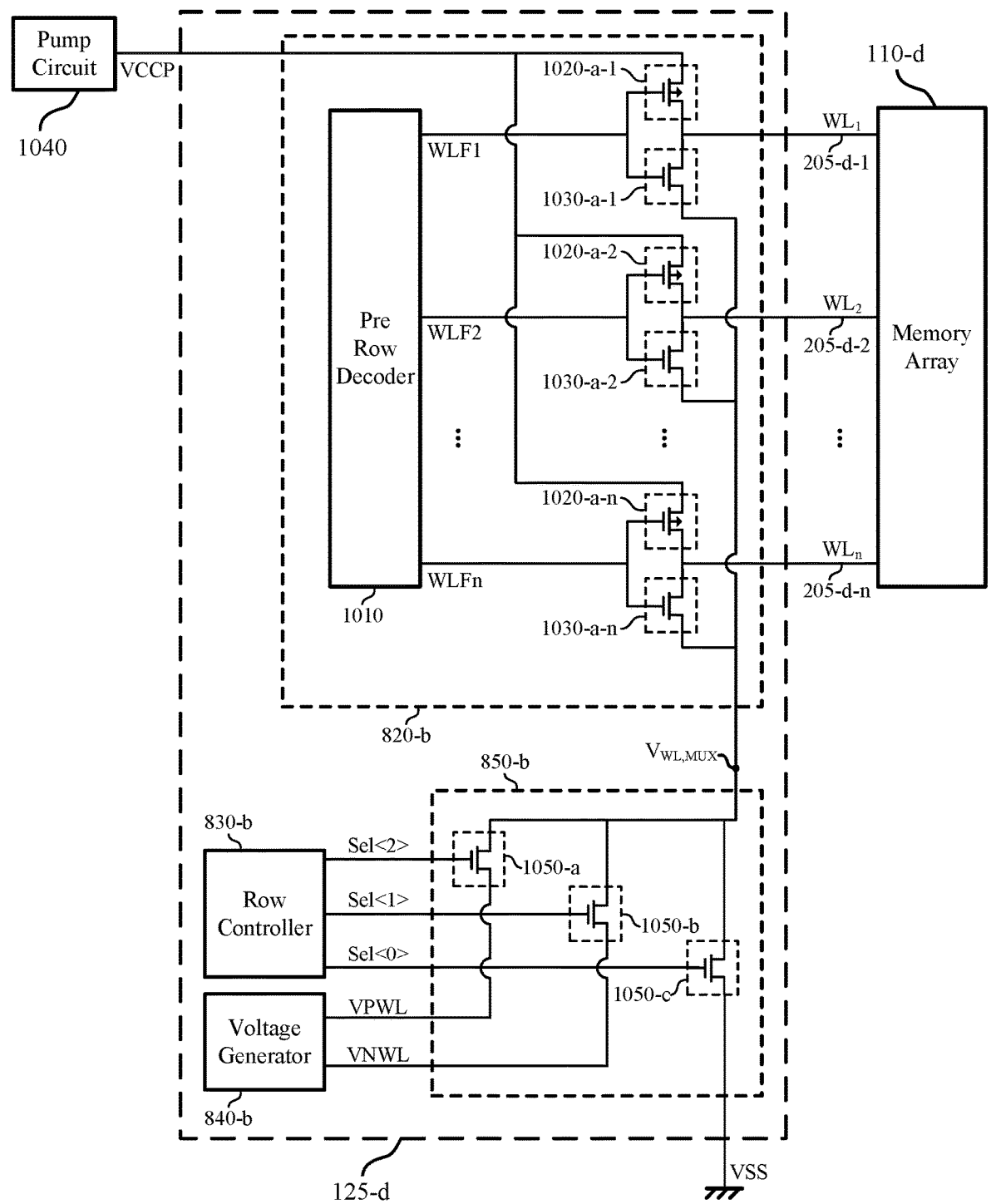

FIG. 10 illustrates a circuit 1000 including an example of a row component 125-*d* that supports protecting stored data in a memory device in accordance with examples of the present disclosure. In some examples, the circuit 1000 may be included in a memory device, such as memory device 100 described with reference to FIG. 1. In some examples, the circuit 1000 may be a component of another circuit, such as circuit 400 described with reference to FIG. 4.

The row component 125-*d* may receive control signals for various access operations, which may include one or more address signals or row control signals. In some examples, the row component 125-*d* may receive control signals from a memory controller 170. The row component 125-*d* may be in communication with a memory array 110-*d,* which may be an example of the memory arrays 110 described herein. In the example of circuit 1000, the row component 125-*d* may be in communication with the memory array 110-*d* via one or more of n word lines 205-*d* (e.g., one or more of word lines 205-*d*-1 through 205-*d*-*n*).

In the example of circuit 1000, the row component 125-*d* may include a row decoder 820-*b,* a row controller 830-*b,* a voltage generator 840-*b,* and a voltage multiplexer 850-*b.* Each of the described components of the row component 125-*d* may be in communication (e.g., in electronic communication) with components within the illustrative boundary of the row component 125-*d,* or with components outside the illustrative boundary of the row component 125-*d,* including the illustrated connections between components. However, other configurations are possible in accordance with the present disclosure.

The row decoder 820-*b* may be in communication with the memory array 110-*d* (e.g., coupled with cell selection components 230 of a set of memory cells 105 of the memory array 110-*d*) for exchanging various signals with the memory array 110-*d* (e.g., via one or more of the word lines 205-*d*-1 through 205-*d*-*n*). For example, the row decoder 820-*b* may support various examples of selecting a word line 205-*d,* activating a word line 205-*d,* deselecting a word line 205-*d* deactivating a word line 205-*d,* equalizing a word line 205-*d,* performing an equalization operation, performing a dissipation operation, or others (e.g., as described with reference to timing diagrams 500, 600, and 700). In some examples, the row decoder 820-*b* may receive signals (e.g., logical signals, voltages, currents, charge) from an address buffer 810 (not shown), the row controller 830-*b,* the voltage multiplexer 850-*b,* a pump circuit 1040, or various combinations thereof, to support or control such operations.

In the example of row component 125-*d,* the row decoder 820-*b* may include a pre row decoder 1010 coupled with a set of transistors 1020-*a* (e.g., p-type transistors) and a set of transistors 1030-*a* (e.g., n-type transistors). The pre row decoder 1010 may be coupled with a gate or control node of each of the transistors 1020-*a.* A source or supply node of each of the transistors 1020-*a* may be coupled with the output of a pump circuit 1040 (e.g., a cell selection voltage source, a voltage source providing a voltage VCCP as described with reference to timing diagrams 500, 600, or 700). A drain or output node of each of the transistors 1020-*a* may be coupled with respective ones of the word lines 205-*d*-1 through 205-*d*-*n* (e.g., coupled with the memory array 110-*d*). The pre row decoder 1010 may also be coupled with a gate or control node of each of the transistors 1030-*a.* A source or supply node of each of the transistors 1030-*a* may be coupled with the output of the voltage multiplexer 850-*b* (e.g., applying or biasing the source or supply node with the selected voltage, $V_{WL\_MUX}$). A drain or output node of each of the transistors 1030-*a* may be coupled with respective ones of the word lines 205-*d*-1 through 205-*d*-*n* (e.g., coupled with the memory array 110-*d*). Although illustrated as including transistors 1020-*a* and 1030-*a,* in other examples, a row decoder 820-*b* may employ other types of switching or selection components in place of the transistors 1020-*a* or 1030-*a.*

In some examples, the pre row decoder 1010 may be configured to selectively couple or decouple the output of the pump circuit 1040 or the voltage multiplexer 850-*b* with one or more of the word lines 205-*d*-1 through 205-*d*-*n* (e.g., by activating or deactivating one or more of the logical signals WLF1 through WLFn, for selecting a memory cell 105 of the memory array 110-*d*). In some examples, the pre row decoder 1010 may support applying an idle or standby voltage (e.g., VPWL as described with reference to timing diagrams 500 or 600, VSS as described with reference to timing diagram 700) to the word lines 205-*d.* In some examples, the pre row decoder 1010 may support applying a cell deselection voltage (e.g., VNWL as described with reference to timing diagram 500, VSS as described with reference to timing diagrams 600 or 700) to the word lines 205-*d.* In some examples, the pre row decoder may support applying a cell selection bias or voltage to a selected one or more of the word lines 205-*d* (e.g., to access a selected memory cell 105), which may be provided by the pump circuit 1040.

In some examples, when one of the word lines 205-*d* is selected or activated (e.g., by providing one of the logical signals WLF1 through WLFn with a negative selection voltage), the corresponding one of the transistors 1020-*a* may be activated. In other words, when a negative selection voltage or logical signal is applied to the control node of one of the transistors 1020-*a,* the corresponding word line 205-*d* may be selectively coupled with the pump circuit 1040 (e.g., when WLF1 is provided with a negative selection voltage, the word line 205-*d*-1 may be provided with the voltage VCCP).

In some examples, when one of the word lines 205-*d* is deselected or deactivated (e.g., by providing one of the logical signals WLF1 through WLFn with a positive selection voltage), the corresponding one of the transistors 1030-a may be activated. In other words, when a positive selection voltage or logical signal is applied to the control node of one of the transistors 1030-a, the corresponding word line 205-d may be selectively coupled with the output of the voltage multiplexer 850-b (e.g., when WLFn is provided with a negative selection voltage, the word line 205-d-n may be provided with the voltage $V_{WL,MUX}$). In other words, in some examples, a transistor 1020-a and a corresponding transistor 1030-a may operate together to perform the operations of a selection component (e.g., for selectively coupling a word line 205-d with either the pump circuit 1040 or the voltage multiplexer 850-b). In some examples, word lines 205-d may be operated with a deselected or deactivated state (e.g., by applying a positive logical signal WLF) or a selected or activated state (e.g., by applying a negative logical signal WLF). In other examples, the pre row decoder 1010 may support an intermediate state in which a logical signal WLF is equalized (e.g., grounded, neither positive nor negative).

In some examples, the row controller 830-b may be configured to support the selection of certain voltages to be applied to one or more of the word lines 205-d-1 through 205-d-n (e.g., via the row decoder 820-b). For example, the row controller 830-b may be in communication with a voltage multiplexer 850-b, which may support the selection of one of a set of voltage sources for biasing one or more of the word lines 205-d. The voltage multiplexer 850-b may select from a set of voltages based on a received control signal (e.g., "Sel<0>," "Sel<1>," or "Sel<2>" as received from the row controller 830-b). The control signals may be applied to the gate or control node of one of a set of transistors 1050, which may selectively couple the output of the voltage multiplexer 850-b with one of a set of voltage sources (e.g., VPWL, VNWL, or VSS). Thus, the voltage multiplexer 850-b may provide a selected voltage (e.g., $V_{WL,MUX}$) to the row decoder 820-b, and the row decoder may apply the selected voltage to one or more of the word lines 205-d-1 through 205-d-n. Although illustrated as including transistors 1050, in other examples, a voltage multiplexer 850-b may employ other types of switching or selection components in place of the transistors 1050.

In some examples, the voltage multiplexer 850-b may be in communication with a voltage generator 840-b, which may represent a voltage supply that provides the voltage multiplexer 850-b with one or more voltage sources (e.g., a positive word line voltage VPWL, a negative word line voltage VNWL, or others). In some examples, the voltage multiplexer 850-b may also be in communication with a ground voltage source (e.g., VSS), which may be part of the voltage generator 840-b, part of another component of the row component 125-d, or provided from outside the row component 125-d as illustrated. Although shown within the illustrative boundary of the row component 125-d, in other examples, the voltage multiplexer 850-b, the voltage generator 840-b, or both, may be considered to be outside the illustrative boundary of the row component 125-d (e.g., may be considered to be part of another component of a memory device or part of another circuit of a memory device.)

Thus, the row component 125-d may be an example of a means for performing one or more of the described operations for protecting stored data in a memory device (e.g., one or more of the operations described with reference to the timing diagrams 500, 600, or 700). In some examples, the row component 125-d may be configured specifically to support the operations of one of the timing diagrams 500, 600, or 700. In other examples, the row component 125-d may be configured to support the operations of more than one of the timing diagrams 500, 600, or 700, and the row component 125-d may be operated by selecting (e.g., by a memory controller) a particular mode of operation corresponding to one of the timing diagrams 500, 600, or 700 (e.g., for a first access operation on a selected memory cell), depending on desired operational characteristics for particular access operations. At a different time (e.g., for a second access operation on a selected memory cell), the row component 125-d may be operated by selecting a different mode of operation corresponding to a different one of timing diagrams 500, 600, or 700.

Figure 11:
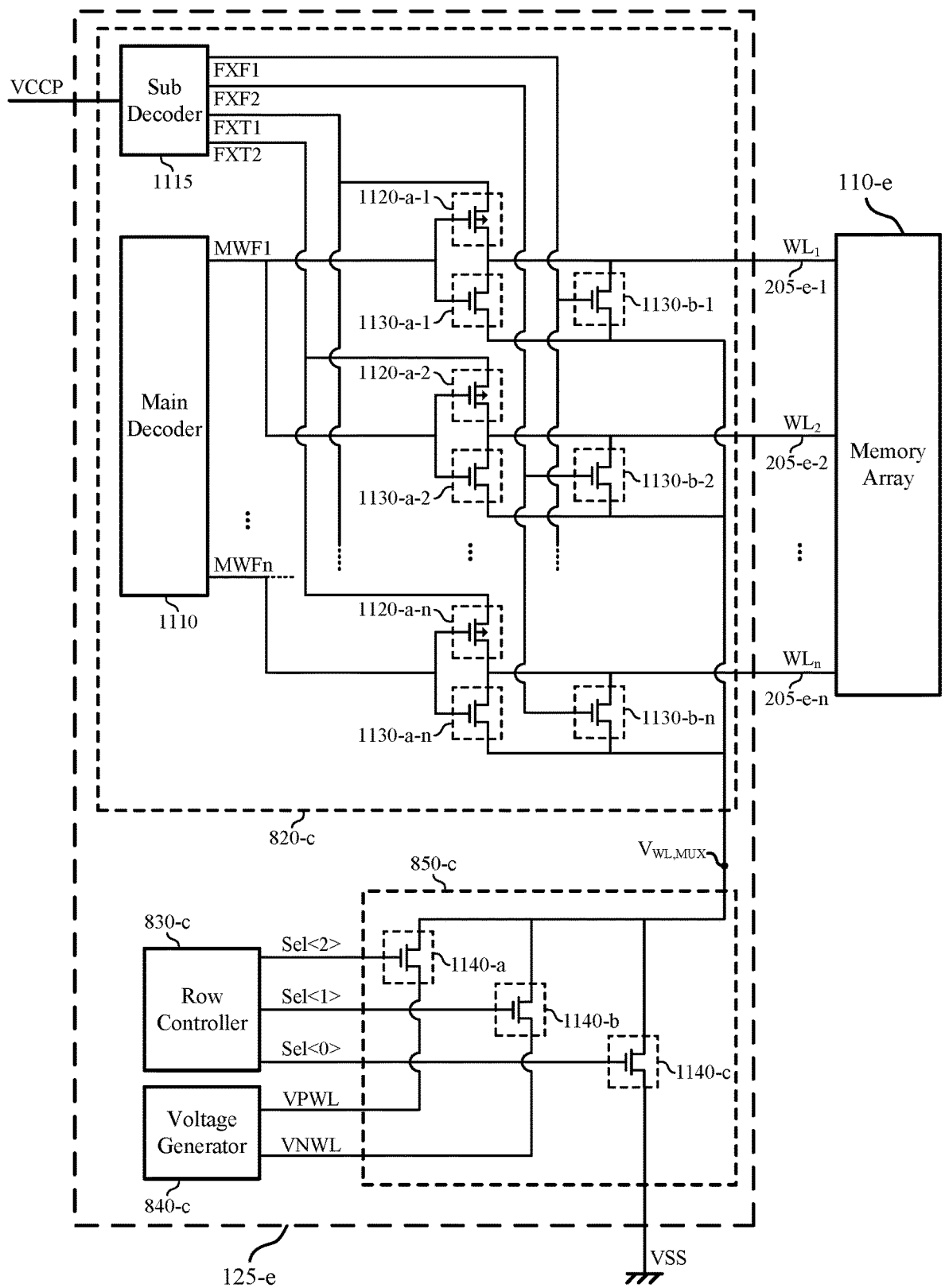

FIG. 11 illustrates a circuit 1100 including an example of a row component 125-e that supports protecting stored data in a memory device in accordance with examples of the present disclosure. In some examples, the circuit 1100 may be included in a memory device, such as memory device 100 described with reference to FIG. 1. In some examples, the circuit 1100 may be a component of another circuit, such as circuit 400 described with reference to FIG. 4.

The row component 125-e may receive control signals for various access operations, which may include one or more address signals or row control signals. In some examples, the row component 125-e may receive control signals from a memory controller 170. The row component 125-e may be in communication with a memory array 110-e, which may be an example of the memory arrays 110 described herein. In the example of circuit 1100, the row component 125-e may be in communication with the memory array 110-e via one or more of n word lines 205-e (e.g., one or more of word lines 205-e-1 through 205-e-n).

In the example of circuit 1100, the row component 125-e may include a row decoder 820-c, a row controller 830-c, a voltage generator 840-c, and a voltage multiplexer 850-c. Each of the described components of the row component 125-e may be in communication (e.g., in electronic communication) with components within the illustrative boundary of the row component 125-e, or with components outside the illustrative boundary of the row component 125-e, including the illustrated connections between components. However, other configurations are possible in accordance with the present disclosure.

The row decoder 820-c may be in communication with the memory array 110-e (e.g., coupled with cell selection components 230 of a set of memory cells 105 of the memory array 110-e) for exchanging various signals with the memory array 110-e (e.g., via one or more of the word lines 205-e-1 through 205-e-n). For example, the row decoder 820-c may support various examples of selecting a word line 205-e, activating a word line 205-e, deselecting a word line 205-e deactivating a word line 205-e, equalizing a word line 205-e, performing an equalization operation, performing a dissipation operation, or others (e.g., as described with reference to timing diagrams 500, 600, and 700). In some examples, the row decoder 820-c may receive signals (e.g., logical signals, voltages, currents, charge) from an address buffer 810 (not shown), the row controller 830-c, the voltage multiplexer 850-c, a pump circuit (not shown), or various combinations thereof, to support or control such operations.

In the example of row component 125-e, the row decoder 820-c may include a main decoder 1110 coupled with a set of transistors 1120-a (e.g., p-type transistors) and a set of transistors 1130-a (e.g., n-type transistors). The main decoder 1110 may be coupled with a gate or control node of each of the transistors 1120-a. A source or supply node of each of the transistors 1120-a may be coupled with the output of a sub decoder 1115, which in some cases may provide a cell selection voltage source (e.g., via signals FXT1 or FXT2), such as a signal providing a voltage VCCP as described with reference to timing diagrams 500, 600, or 700. A drain or output node of each of the transistors 1120-*a* may be coupled with respective ones of the word lines 205-*e*-1 through 205-*e*-*n* (e.g., coupled with the memory array 110-*e*). The main decoder 1110 may also be coupled with a gate or control node of each of the transistors 1130-*a*. A source or supply node of each of the transistors 1130-*a* may be coupled with the output of the voltage multiplexer 850-*c* (e.g., applying or biasing the source or supply node with the selected voltage, $V_{WL,MUX}$). A drain or output node of each of the transistors 1130-*a* may be coupled with respective ones of the word lines 205-*e*-1 through 205-*e*-*n* (e.g., coupled with the memory array 110-*e*). In other words, in some examples, a transistor 1120-*a* and a corresponding transistor 1130-*a* may operate together to perform the operations of a selection component (e.g., for selectively coupling a word line 205-*e* with either a voltage source providing the voltage VCCP or the voltage multiplexer 850-*c*).

In the example of row component 125-*e*, the row decoder 820-*c* may also include a sub decoder 1115 coupled with the set of transistors 1120-*a* (e.g., p-type transistors) and a set of transistors 1130-*b* (e.g., n-type transistors). The sub decoder 1115 may be coupled with the source or supply node of each of the transistors 1120-*a*. In the example of circuit 1100, the sub decoder 1115 may be coupled with the source or supply nodes of a first subset of the set of transistors 1120-*a* (e.g., odd transistors 1120-*a*, including transistor 1120-*a*-1, transistor 1120-*a*-3, and so on) via a first connection (e.g., as providing a signal FXT1). In the example of circuit 1100, the sub decoder 1115 may be coupled with the source or supply nodes of a second subset of the set of transistors 1120-*a* (e.g., even transistors 1120-*a*, including transistor 1120-*a*-2, transistor 1120-*a*-4, and so on) via a second connection (e.g., as providing a signal FXT2). In other examples, different arrangements of subsets of transistors 1120-*a*, including arrangements with more than two subsets, may be supported by a sub decoder 1115. The combination of the main decoder 1110 and the sub decoder 1115 may be referred to as a layered word driver configuration.

The sub decoder 1115 may also be coupled with a gate or control node of each of the transistors 1130-*b*. In the example of circuit 1100, the sub decoder 1115 may be coupled with the gate or control nodes of a first subset of the set of transistors 1130-*b* (e.g., odd transistors 1130-*b*, including transistor 1130-*b*-1, transistor 1130-*b*-2, and so on) via a third connection (e.g., as providing a signal FXF1). In the example of circuit 1100, the sub decoder 1115 may be coupled with the gate of control nodes of a second subset of the set of transistors 1130-*b* (e.g., even transistors 1130-*b*, including transistor 1130-*b*-2, transistor 1130-*b*-4, and so on) via a fourth connection (e.g., as providing a signal FXF2). In other examples, different arrangements of subsets of transistors 1130-*b*, including arrangements with more than two subsets, may be supported by a sub decoder 1115.

A source or supply node of each of the transistors 1130-*b* may be coupled with the output of the voltage multiplexer 850-*c* (e.g., applying or biasing the source or supply node to the selected voltage, $V_{WL,MUX}$). A drain or output node of each of the transistors 1130-*b* may be coupled with respective ones of the word lines 205-*e*-1 through 205-*e*-*n* (e.g., coupled with the memory array 110-*e*). Although illustrated as including transistors 1120-*a*, 1130-*a*, and 1130-*b*, in other examples, a row decoder 820-*c* may employ other types of switching or selection components in place of the transistors 1120-*a*, 1130-*a*, or 1130-*b*.

In some examples, the main decoder 1110 or the sub decoder 1115 may be configured to selectively couple or decouple the output of a pump circuit (e.g., VCCP) or the voltage multiplexer 850-*c* with one or more of the word lines 205-*e*-1 through 205-*e*-*n* (e.g., by activating or deactivating one or more of the logical signals MWF1 through MWFn, or signals FXF1, FXF2, FXT1, or FXT2). In some examples, the main decoder 1110 or the sub decoder 1115 may support applying an idle or standby voltage (e.g., VPWL as described with reference to timing diagrams 500 or 600, VSS as described with reference to timing diagram 700) to the word lines 205-*e*. In some examples, the main decoder 1110 or the sub decoder may support applying a cell deselection voltage (e.g., VNWL as described with reference to timing diagram 500, VSS as described with reference to timing diagrams 600 or 700) to the word lines 205-*e*. In some examples, the main decoder 1110 or the sub decoder 1115 may support applying a cell selection bias or voltage to a selected one or more of the word lines 205-*e* (e.g., to access a selected memory cell 105), which may be provided by a pump circuit 1040. In some examples, the main decoder 1110 or the sub decoder 1115 may support applying a cell selection voltage (e.g., VCCP as described with reference to timing diagrams 500, 600, or 700) to one or more of the word lines 205-*c*.

In some examples, when one of the word lines 205-*e* is selected or activated (e.g., by providing one of the logical signals MWF1 through MWFn with a negative selection voltage, by providing one of the signals FXT with a cell selection voltage), the corresponding one of the transistors 1120-*a* may be activated. In other words, when a negative selection voltage or logical signal is applied to the gate or control node of one of the transistors 1120-*a*, the corresponding word line 205-*e* may be selectively coupled with either a signal FXT1 or FXT2 (e.g., depending on whether the transistor 1120-*a* is an odd transistor 1120-*a* or an even transistor 1120-*a*). Thus, the selection of a particular one of the word lines 205-*e* may also depend on whether a signal FXT1 is provided with a cell selection voltage (e.g., VCCP), or signal FXT2 is provided with a cell selection voltage (e.g., VCCP). Thus, in the example of circuit 1100, the selection of a word line 205-*e* may depend on both a signal from the main decoder 1110 (e.g., one of MWF1 though MWFn being activated with a negative activation voltage) and a signal from a sub decoder 1115 (e.g., whether FXT1 or FXT2 is coupled with a pump circuit, whether FXT1 or FXT2 is provided with a cell selection voltage).

In some examples, when one of the FXT signals is activated (e.g., coupled with a pump circuit), the corresponding FXF signal may be deactivated. In other words, if signal FXT1 is activated, FXF1 may be deactivated. In some examples, the potential of an FXT signal and a corresponding FXF signal (e.g., FXT1 and FXF1) may have opposite polarities. Accordingly, when the source or supply nodes of the transistors 1120-*a* are coupled with a cell selection voltage, the gate or control nodes of the corresponding ones of the transistors 1130-*b* may be coupled with a deselection voltage. In other words, those word lines 205-*e* that may be selectively coupled with a cell selection voltage via transistors 1120-*a* may also be selectively decoupled from the voltage multiplexer 850-*c* via transistors 1130-*b*. Thus, the sub decoder 1115 may be employed to select a particular layer or subset of word lines 205-*e* or memory cells 105 of the memory array 110-*e*. Although the sub decoder 1115 is split into two subsets (e.g., FXF1 and FXT1, FXF2 and FXT2), a sub decoder 1115 may support any number of subsets including more than two subsets.

In some examples, when one of the word lines 205-*e* is deselected or deactivated (e.g., by providing one of the logical signals MWF1 through MWFn with a positive selection voltage), the corresponding one of the transistors 1130-*a* may be activated. In other words, when a positive selection voltage or logical signal is applied to the control node of one of the transistors 1130-*a*, the corresponding word line 205-*e* may be selectively coupled with the output of the voltage multiplexer 850-*b* (e.g., when WLFn is provided with a negative selection voltage, the word line 205-*e-n* may be provided with the voltage $V_{WL,MUX}$). Additionally or alternatively, in the example of circuit 1100, one of the word lines 205-*e* may also be deselected or deactivated when the gate or control node of the corresponding transistor 1130-*b* is provided with an activation signal (e.g., a positive voltage via signals FXF1 or FXF2.

In some examples, word lines 205-*e* may be operated in a deselected or deactivated state (e.g., by applying a positive logical signal MWF) or in a selected or activated state (e.g., by applying a negative logical signal MWF). In other examples, the main decoder 1110 may support an intermediate state in which a logical signal MWF is equalized (e.g., grounded, neither positive nor negative).

In some examples, the row controller 830-*c* may be configured to support the selection of certain voltages to be applied to one or more of the word lines 205-*e*-1 through 205-*e-n* (e.g., via the row decoder 820-*c*). For example, the row controller 830-*c* may be in communication with a voltage multiplexer 850-*c*, which may support the selection of one of a set of voltage sources for biasing one or more of the word lines 205-*e*. The voltage multiplexer 850-*c* may select from a set of voltages based on a received control signal (e.g., "Sel<0>," "Sel<1>," or "Sel<2>" as received from the row controller 830-*c*). The control signals may be applied to the gate or control node of one of a set of transistors 1140, which may selectively couple the output of the voltage multiplexer 850-*c* with one of a set of voltage sources (e.g., VPWL, VNWL, or VSS). Thus, the voltage multiplexer 850-*c* may provide a selected voltage (e.g., $V_{WL,MUX}$) to the row decoder 820-*c*, and the row decoder may apply the selected voltage to one or more of the word lines 205-*e*-1 through 205-*e-n*. Although illustrated as including transistors 1140, in other examples, a voltage multiplexer 850-*c* may employ other types of switching or selection components in place of the transistors 1140.

In some examples, the voltage multiplexer 850-*c* may be in communication with a voltage generator 840-*c*, which may represent a voltage supply that provides the voltage multiplexer 850-*c* with one or more voltage sources (e.g., a positive word line voltage VPWL, a negative word line voltage VNWL, or others). In some examples, the voltage multiplexer 850-*c* may also be in communication with a ground voltage source (e.g., VSS), which may be part of the voltage generator 840-*c*, part of another component of the row component 125-*e*, or provided from outside the row component 125-*e* as illustrated. Although shown within the illustrative boundary of the row component 125-*e*, in other examples, the voltage multiplexer 850-*c*, the voltage generator 840-*c*, or both, may be considered to be outside the illustrative boundary of the row component 125-*e* (e.g., may be considered to be part of another component of a memory device or part of another circuit of a memory device.)

Thus, the row component 125-*e* may be an example of a means for performing one or more of the described operations for protecting stored data in a memory device (e.g., one or more of the operations described with reference to the timing diagrams 500, 600, or 700). In some examples, the row component 125-*e* may be configured specifically to support the operations of one of the timing diagrams 500, 600, or 700. In other examples, the row component 125-*e* may be configured to support the operations of more than one of the timing diagrams 500, 600, or 700, and the row component 125-*e* may be operated by selecting (e.g., by a memory controller 170) a particular mode of operation corresponding to one of the timing diagrams 500, 600, or 700 (e.g., for a first access operation on a selected memory cell), depending on desired operational characteristics for particular access operations. At a different time (e.g., for a second access operation on a selected memory cell), the row component 125-*e* may be operated by selecting a different mode of operation corresponding to a different one of timing diagrams 500, 600, or 700.

Figure 12:
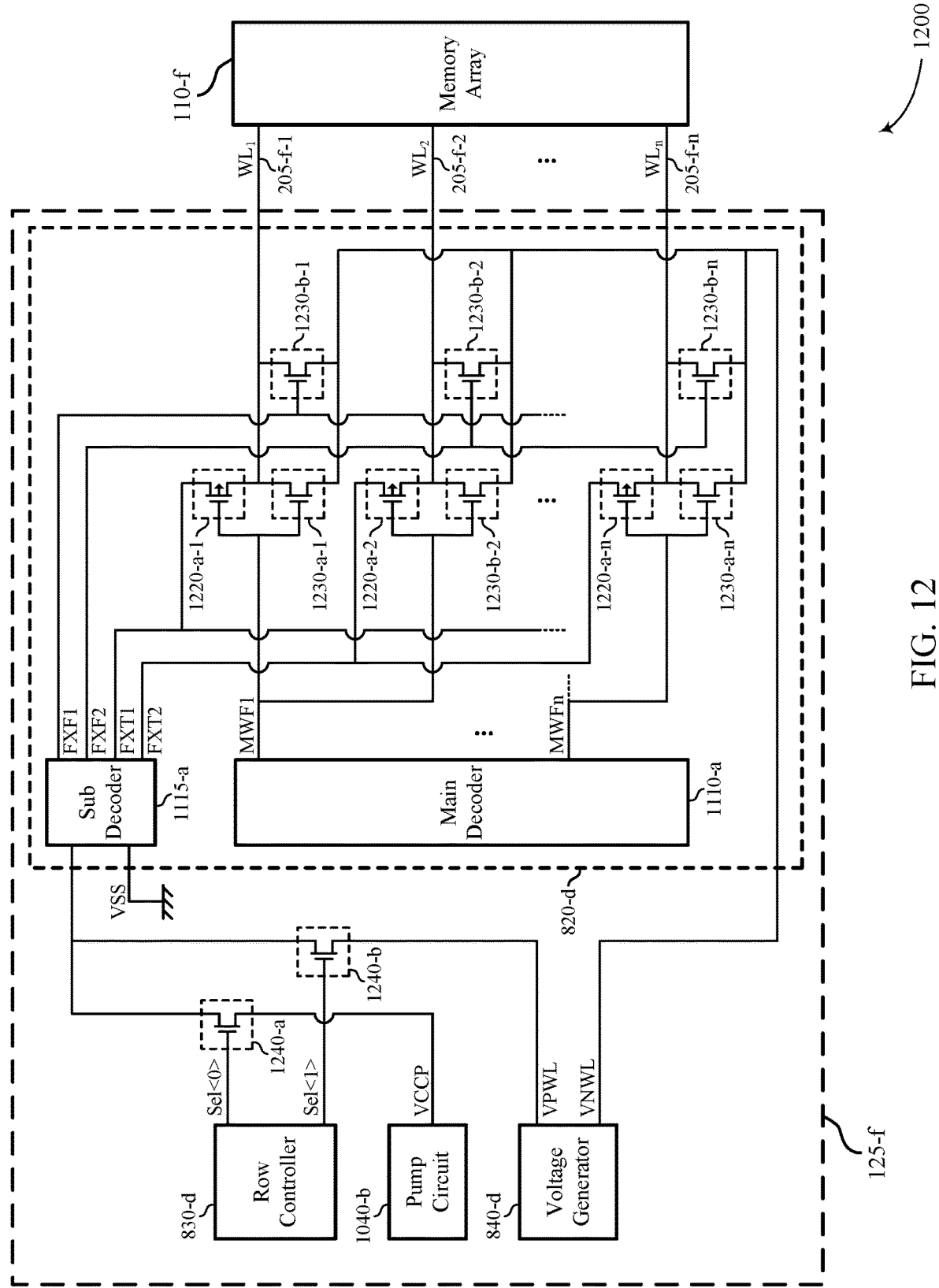

FIG. 12 illustrates a circuit 1200 including an example of a row component 125-*f* that supports protecting stored data in a memory device in accordance with examples of the present disclosure. In some examples, the circuit 1200 may be included in a memory device, such as memory device 100 described with reference to FIG. 1. In some examples, the circuit 1200 may be a component of another circuit, such as circuit 400 described with reference to FIG. 4.

The row component 125-*f* may receive control signals for various access operations, which may include one or more address signals or row control signals. In some examples, the row component 125-*f* may receive control signals from a memory controller 170. The row component 125-*f* may be in communication with a memory array 110-*f*, which may be an example of the memory arrays 110 described herein. In the example of circuit 1200, the row component 125-*f* may be in communication with the memory array 110-*f* via one or more of n word lines 205-*f* (e.g., one or more of word lines 2054-1 through 205-*f*-*n*).

In the example of circuit 1200, the row component 125-*f* may include a row decoder 820-*d*, a row controller 830-*d*, a voltage generator 840-*d*, and a pump circuit 1040-*b*. Each of the described components of the row component 125-*f* may be in communication (e.g., in electronic communication) with components within the illustrative boundary of the row component 125-*f*, or with components outside the illustrative boundary of the row component 125-*f*, including the illustrated connections between components. However, other configurations are possible in accordance with the present disclosure.

The row decoder 820-*d* may be in communication with the memory array 110-*f* (e.g., coupled with cell selection components 230 of a set of memory cells 105 of the memory array 110-*f*) for exchanging various signals with the memory array 110-*f* (e.g., via one or more of the word lines 2054-1 through 205-*f*-*n*). For example, the row decoder 820-*d* may support various examples of selecting a word line 205-*f*, activating a word line 205-*f*, deselecting a word line 205-*f*, deactivating a word line 205-*f*, equalizing a word line 205-*f*, performing an equalization operation, performing a dissipation operation, or others (e.g., as described with reference to timing diagrams 500, 600, and 700). In some examples, the row decoder 820-*d* may receive signals (e.g., logical signals, voltages, currents, charge) from an address buffer 810 (not shown), the row controller 830-*d*, the pump circuit 1040-*b*, or various combinations thereof, to support or control such operations.

In the example of row component 125-*f*, the row decoder 820-*d* may include a main decoder 1110-*a* coupled with a set of transistors 1220-*a* (e.g., p-type transistors) and a set of transistors 1230-*a* (e.g., n-type transistors). The main decoder 1110-*a* may be coupled with a gate or control node of each of the transistors 1220-*a*. A source or supply node of each of the transistors 1220-*a* may be coupled with the output of a sub decoder 1115-*a*, which in some cases may provide a cell selection voltage source (e.g., via signals FXT1 or FXT2), such as a signal providing a voltage VCCP or VPWL as described with reference to timing diagrams 500, 600, or 700. A drain or output node of each of the transistors 1220-*a* may be coupled with respective ones of the word lines 2054-1 through 205-*f-n* (e.g., coupled with the memory array 110-*f*). The main decoder 1110-*a* may also be coupled with a gate or control node of each of the transistors 1230-*a*. A source or supply node of each of the transistors 1230-*a* may be coupled with an output of the voltage generator 840-*d* (e.g., applying or biasing the source or supply node a voltage VNWL). A drain or output node of each of the transistors 1230-*a* may be coupled with respective ones of the word lines 2054-1 through 205-*f-n* (e.g., coupled with the memory array 110-*f*). In other words, in some examples, a transistor 1220-*a* and a corresponding transistor 1230-*a* may operate together to perform the operations of a selection component (e.g., for selectively coupling a word line 205-*f* with either a voltage provided by the pump circuit 1040-*b* or a voltage provided by the voltage generator 840-*d*).

In the example of row component 125-*f*, the row decoder 820-*d* may also include a sub decoder 1115-*a* coupled with the set of transistors 1220-*a* (e.g., p-type transistors) and a set of transistors 1230-*b* (e.g., n-type transistors). The sub decoder 1115-*a* may be coupled with the source or supply node of each of the transistors 1220-*a*. In the example of circuit 1200, the sub decoder 1115-*a* may be coupled with the source or supply nodes of a first subset of the set of transistors 1220-*a* (e.g., odd transistors 1220-*a*, including transistor 1220-*a*-1, transistor 1220-*a*-3, and so on) via a first connection (e.g., as providing a signal FXT1). In the example of circuit 1200, the sub decoder 1115-*a* may be coupled with the source or supply nodes of a second subset of the set of transistors 1220-*a* (e.g., even transistors 1220-*a*, including transistor 1220-*a*-2, transistor 1220-*a*-4, and so on) via a second connection (e.g., as providing a signal FXT2). In other examples, different arrangements of subsets of transistors 1220-*a*, including arrangements of more than two subsets, may be supported by a sub decoder 1115-*a*. The combination of the main decoder 1110-*a* and the sub decoder 1115-*a* may be referred to as a layered word driver configuration.

The sub decoder 1115-*a* may also be coupled with a gate or control node of each of the transistors 1230-*b*. In the example of circuit 1200, the sub decoder 1115-*a* may be coupled with the gate or control nodes of a first subset of the set of transistors 1230-*b* (e.g., odd transistors 1230-*b*, including transistor 1230-*b*-1, transistor 1230-*b*-2, and so on) via a third connection (e.g., as providing a signal FXF1). In the example of circuit 1200, the sub decoder 1115-*a* may be coupled with the gate of control nodes of a second subset of the set of transistors 1230-*b* (e.g., even transistors 1230-*b*, including transistor 1230-*b*-2, transistor 1230-*b*-4, and so on) via a fourth connection (e.g., as providing a signal FXF2). In other examples, different arrangements of subsets of transistors 1230-*b*, including arrangements of more than two subsets, may be supported by a sub decoder 1115-*a*.

A source or supply node of each of the transistors 1230-*b* may be coupled with an output of the voltage generator 840-*d* (e.g., applying or biasing the source or supply node to the voltage, VNWL). A drain or output node of each of the transistors 1230-*b* may be coupled with respective ones of the word lines 2054-1 through 205-*f-n* (e.g., coupled with the memory array 110-*f*). Although illustrated as including transistors 1220-*a*, 1230-*a*, and 1230-*b*, in other examples, a row decoder 820-*d* may employ other types of switching or selection components in place of the transistors 1220-*a*, 1230-*a*, or 1230-*b*.

In some examples, the main decoder 1110-*a* or the sub decoder 1115-*a* may be configured to selectively couple or decouple the output of the pump circuit 1040-*b* (e.g., VCCP) or the voltage generator 840-*d* with one or more of the word lines 2054-1 through 205-*f-n* (e.g., by activating or deactivating one or more of the logical signals MWF1 through MWFn, or signals FXF1, FXF2, FXT1, or FXT2). In some examples, the main decoder 1110-*a* or the sub decoder 1115-*a* may support applying an idle or standby voltage (e.g., VPWL as described with reference to timing diagrams 500 or 600, VSS as described with reference to timing diagram 700) to the word lines 205-*f* In some examples, the main decoder 1110-*a* or the sub decoder 1115-*a* may support applying a cell deselection voltage (e.g., VNWL as described with reference to timing diagram 500, VSS as described with reference to timing diagrams 600 or 700) to the word lines 205-*f* In some examples, the main decoder 1110-*a* or the sub decoder 1115-*a* may support applying a cell selection bias or voltage to a selected one or more of the word lines 205-*f* (e.g., to access a selected memory cell 105), which may be provided by the pump circuit 1040-*b*.

In some examples, when one of the word lines 205-*f* is selected or activated (e.g., by providing one of the logical signals MWF1 through MWFn with a negative selection voltage), the corresponding one of the transistors 1220-*a* may be activated. In other words, when a negative selection voltage or logical signal is applied to the gate or control node of one of the transistors 1220-*a*, the corresponding word line 205-*f* may be selectively coupled with either a signal FXT1 or FXT2 (e.g., depending on whether the transistor 1220-*a* is an odd transistor 1220-*a* or an even transistor 1220-*a*). Thus, the selection of a particular one of the word lines 205-*f* may also depend on whether a signal FXT1 is provided with a cell selection voltage (e.g., VCCP or VPWL), or signal FXT2 is provided with a cell selection voltage (e.g., VCCP or VPWL). Thus, in the example of circuit 1200, the selection of a word line 205-*f* may depend on both a signal from the main decoder 1110-*a* (e.g., one of MWF1 though MWFn being activated with a negative activation voltage) and a signal from a sub decoder 1115-*a* (e.g., whether FXT1 or FXT2 is coupled with a pump circuit, whether FXT1 or FXT2 is provided with a cell selection voltage). In some examples, the row controller 830-*d* may be configured to support selecting a word line 205-*f* (e.g., one or more of the memory cells 105 of the memory array 110-*f*) for an access operation (e.g., when the sub decoder 1115-*a* is provided with a cell selection voltage such as VCCP), or selecting a word line 205-*f* for an equalization operation or a dissipation operation (e.g., when the sub decoder 1115-*a* is provided with a cell equalization or dissipation word line voltage such as VPWL).

In some examples, when one of the FXT signals is activated (e.g., coupled with a pump circuit), the corresponding FXF signal may be deactivated. In other words, if signal FXT1 is activated, FXF1 may be deactivated. In some examples, the potential of an FXT signal and a corresponding FXF signal (e.g., FXT1 and FXF1) may have opposite polarities. Accordingly, when the source or supply nodes of the transistors 1220-*a* are coupled with a cell selection voltage, the gate or control nodes of the corresponding ones of the transistors 1230-*b* may be coupled with a deselection voltage. In other words, those word lines 205-*f* that may be selectively coupled with a cell selection voltage via transistors 1220-*a* may also be selectively decoupled from the voltage generator 840-*d* via transistors 1230-*b*. Thus, the sub decoder 1115-*a* may be employed to select a particular layer or subset of word lines 205-*f* or memory cells 105 of the memory array 110-*f*. Although the sub decoder 1115-*a* is split into two subsets (e.g., FXF1 and FXT1, FXF2 and FXT2), a sub decoder 1115-*a* may support any number of subsets including more than two subsets.

In some examples, when one of the word lines 205-*f* is deselected or deactivated (e.g., by providing one of the logical signals MWF1 through MWFn with a positive selection voltage), the corresponding one of the transistors 1230-*a* may be activated. In other words, when a positive selection voltage or logical signal is applied to the control node of one of the transistors 1230-*a*, the corresponding word line 205-*f* may be selectively coupled with the output of the voltage generator 840-*d* (e.g., when WLFn is provided with a negative selection voltage, the word line 205-*f-n* may be provided with the voltage VNWL). Additionally or alternatively, in the example of circuit 1200, one of the word lines 205-*f* may also be deselected or deactivated when the gate or control node of the corresponding transistor 1230-*b* is provided with an activation signal (e.g., a positive voltage via signals FXF1 or FXF2.

In some examples, word lines 205-*f* may be deselected or deactivated (e.g., by applying a positive logical signal MWF) or selected or activated (e.g., by applying a negative logical signal MWF). In other examples, the main decoder 1110-*a* may support an intermediate state in which a logical signal MWF is equalized (e.g., grounded, neither positive nor negative).

In some examples, the row controller 830-*d* may be configured to support the selection of certain voltages to be applied to one or more of the word lines 2054-1 through 205-*f-n* (e.g., via the row decoder 820-*d*). For example, the row controller 830-*d* may be in communication with the gate or control node of a transistor 1240-*a* and the gate or control node of a transistor 1240-*b*, which may support the selection of either the pump circuit 1040-*b* or the voltage generator 840-*d* (e.g., VPWL) for coupling with the sub decoder 1115-*a* (e.g., for biasing one or more of the word lines 205-*f*). The row controller 830-*d* may select between coupling the sub decoder 1115-*a* with the pump circuit 1040-*b* or the voltage generator 840-*a* based on providing control signals (e.g., "Sel<0>" or "Sel<1>") to the transistors 1240-*a* and 1240-*b*. Thus, the row controller 830-*d* may select a voltage (e.g., VCCP or VPWL) to be provided to the sub decoder 1115-*a*, and the sub decoder 1115-*a* may provide the selected voltage to be applied to one or more of the word lines 2054-1 through 205-*f-n* (e.g., via the transistors 1220-*a*). Although illustrated as including transistors 1240, in other examples, a row controller 830-*d* may provide control signals to other types of switching or selection components in place of the transistors 1140.

Thus, the row component 125-*f* may be an example of a means for performing one or more of the described operations for protecting stored data in a memory device (e.g., one or more of the operations described with reference to the timing diagrams 500, 600, or 700).

In some examples, the row component 125-*f* may be configured specifically to support the operations of one of the timing diagrams 500, 600, or 700. In other examples, the row component 125-*f* may be configured to support the operations of more than one of the timing diagrams 500, 600, or 700, and the row component 125-*f* may be operated by selecting (e.g., by a memory controller) a particular mode of operation corresponding to one of the timing diagrams 500, 600, or 700 (e.g., for a first access operation on a selected memory cell), depending on desired operational characteristics for particular access operations. At a different time (e.g., for a second access operation on a selected memory cell), the row component 125-*f* may be operated by selecting a different mode of operation corresponding to a different one of timing diagrams 500, 600, or 700.

Figure 13:
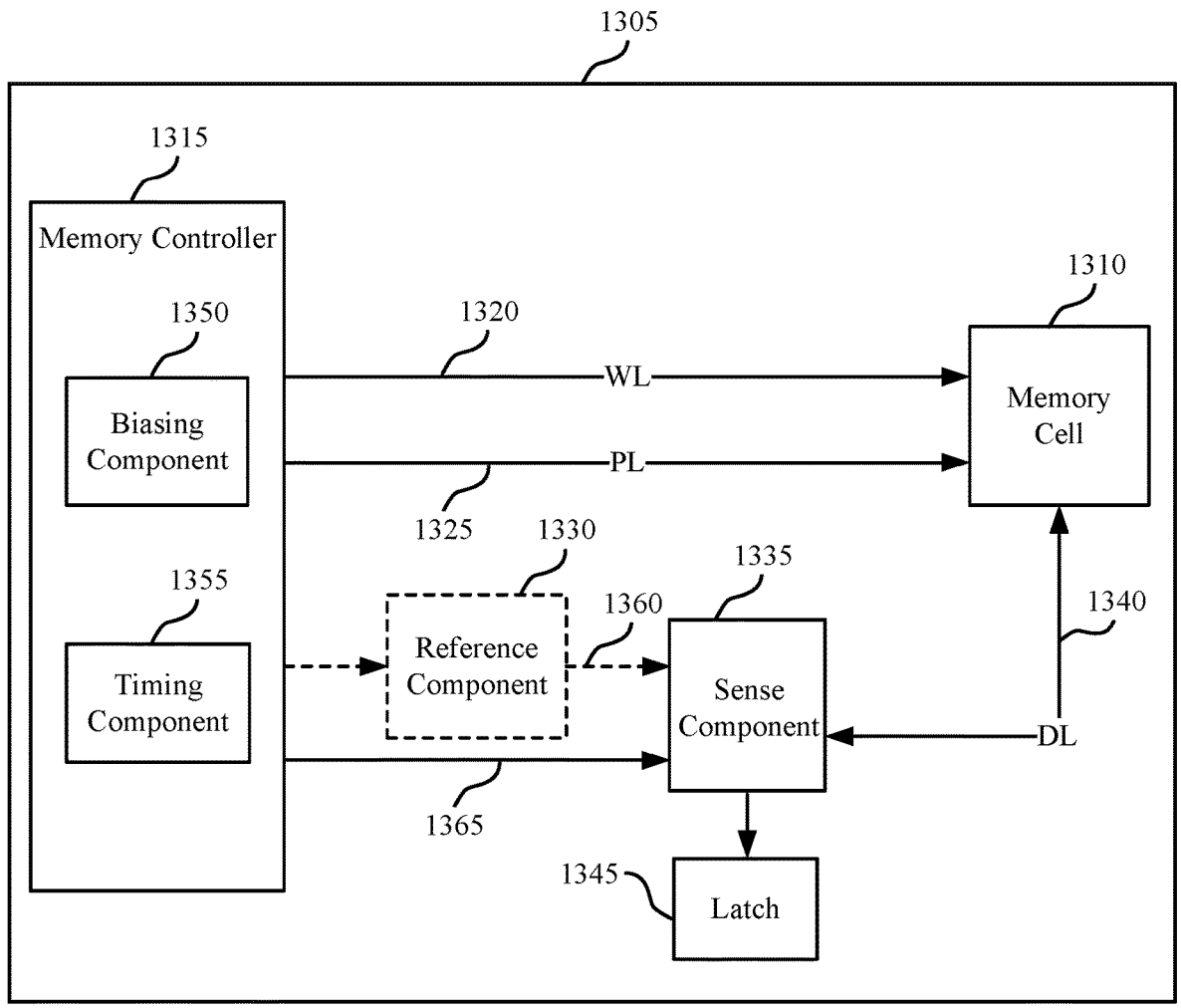
FIG. 13 shows a block diagram of a memory device that may support access schemes for protecting stored data in a memory device in accordance with various embodiments of the present disclosure.

FIG. 13 shows a block diagram 1300 of a memory device 1305 that may support access schemes for protecting stored data in a memory device in accordance with various embodiments of the present disclosure. The memory device 1305 may be referred to as an electronic memory apparatus, and may be an example of a component of a memory device 100 as described with reference to FIG. 1.

The memory device 1305 may include one or more memory cells 1310, which may be an example of memory cells 105 or a memory array 110 described with reference to FIGS. 1 through 12. The memory device 1305 may also include a memory controller 1315, a word line 1320, a plate line 1325, a sense component 1335, and a digit line 1340. These components may be in electronic communication with each other and may perform one or more of the functions described herein in accordance with aspects of the disclosure. In some cases, the memory controller 1315 may include a biasing component 1350 and a timing component 1355.

The memory controller 1315 may be in electronic communication with the word line 1320, the plate line 1325, the digit line 1340, and the sense component 1335, which may be examples of a word line 205, a plate line 215, a digit line 210, and a sense component 150 described with reference to FIGS. 1 through 12. In some examples, the memory device 1305 may also include a latch 1345, which may be an example of an I/O component 160 as described herein. The components of the memory device 1305 may be in electronic communication with each other and may perform embodiments of the functions described with reference to FIGS. 1 through 12. In some cases, the sense component 1335 or latch 1345 may be components of memory controller 1315.

In some examples, the digit line 1340 may be in electronic communication with the sense component 1335 (e.g., via a signal development component 280, via a bypass line 270, as described herein) and a ferroelectric capacitor of a memory cell 1310. A memory cell 1310 may be writable with a logic state (e.g., a first or second logic state). The word line 1320 may be in electronic communication with the memory controller 1315 and a cell selection component of a memory cell 1310. The plate line 1325 may be in electronic communication with the memory controller 1315 and a plate of the ferroelectric capacitor of a memory cell 1310. The sense component 1335 may be in electronic communication with the memory controller 1315, the digit line 1340, and the latch 1345. In some examples, a common access line may provide the functions of a signal line and a reference line. The sense control line 1365 may be in electronic communication with the sense component 1335 and the memory controller 1315. These components may also be in electronic communication with other components, inside, or outside, or both of the memory device 1305, in addition to components not listed above, via other components, connections, or busses.

The memory controller 1315 may be an example of a memory controller 170 as described herein, and may be configured to activate the word line 1320, the plate line 1325, or the digit line 1340 by applying voltages to various nodes. For example, the biasing component 1350 may be configured to apply a voltage to operate the memory cell 1310 to read or write the memory cell 1310 as described above. In some cases, the memory controller 1315 may include or otherwise communicate with a row component 125, a column component 135, a plate component 145, or a combination thereof, as described with reference to FIGS. 1 through 12, which may enable the memory controller 1315 to access one or more memory cells 1310. The biasing component 1350 may provide voltages (e.g., voltage sources) for coupling with the memory cell 1310. Additionally or alternatively, the biasing component 1350 may provide voltages (e.g., voltage sources) for the operation of the sense component 1335 or the reference component 1330.

In some cases, the memory controller 1315 may perform one or more of its operations using the timing component 1355. For example, the timing component 1355 may control the timing of the various word line selections or plate biasing, including timing for switching and voltage application to perform the memory functions, such as reading and writing, discussed herein (e.g., in accordance with operations described with reference to timing diagrams 500, 600, or 700 of FIGS. 5, 6, and 7). In some cases, the timing component 1355 may control the operations of the biasing component 1350.

The sense component 1335 may compare a sense signal from the memory cell 1310 (e.g., via digit line 1340) with a reference signal (e.g., from the reference component 1330, from the memory cell 1310). Upon determining the logic state, the sense component 1335 may then store the output in the latch 1345, where it may be used in accordance with the operations of an electronic device that may include the memory device 1305. The sense component 1335 may include one or more amplifiers in electronic communication with the latch and the ferroelectric memory cell.

The memory controller 1315, or its sub-components, may be implemented in hardware, code (e.g., software, firmware) executed by a processor, or any combination thereof. If implemented in code executed by a processor, the functions of the memory controller 1315, or its sub-components, may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The memory controller 1315, or its sub-components, may be physically located at various positions, including being distributed such that portions of functions are implemented at different physical locations by one or more physical devices. In some examples, the memory controller 1315, or its sub-components, may be a separate and distinct component in accordance with various embodiments of the present disclosure. In other examples, the memory controller 1315, or its sub-components, may be combined with one or more other hardware components, including but not limited to an I/O component, a transceiver, a network server, another computing device, one or more other components described in the present disclosure, or a combination thereof in accordance with various embodiments of the present disclosure. The memory controller 1315 may be an example of the memory controller 1515 described with reference to FIG. 15.

In some examples, the memory controller 1315, including any subcomponents thereof, may support the described examples of access schemes for protecting stored data in the memory device 1305. For example, the memory device 1305 may include a plurality of memory cells 1310 coupled with the digit line 1340 and the plate line 1325. In some examples, each of the plurality of memory cells 1310 may include a cell selection component configured to selectively couple the respective one of the plurality of memory cells with the digit line 1340. The memory device may include a plurality of word lines 1320, each coupled with the cell selection component of the respective one of the plurality of memory cells. The memory device 1305 may also include a row decoder coupled with each of the plurality of word lines, which may be included in the memory controller 1315, or may be a separate component in communication with the memory controller 1315.

In accordance with embodiments of the present disclosure, the memory controller 1315 may be operable to perform an access operation on a first memory cell of the plurality of memory cells 1310 by causing the row decoder to activate a first word line of the plurality of word lines 1320 that is coupled with the cell selection component of the first memory cell. The memory controller 1315 may perform an equalization operation on a second memory cell of the plurality of memory cells 1310 in response to performing the access operation on the first memory cell by causing the row decoder to activate a second word line of the plurality of word lines 1320 that is coupled with the selection component of the second memory cell.

In some examples, for activating the first word line of the plurality of word lines 1320, the memory controller 1315 is operable to cause the row decoder to decouple the first word line from a ground voltage source, and couple the first word line with a first positive voltage source.

In some examples, for activating the second word line of the plurality of word lines 1320, the memory controller 1315 is operable to cause the row decoder to decouple the second word line from a ground voltage source, and couple the second word line with a second positive voltage source.

In some examples, for activating the second word line of the plurality of word lines 1320, the memory controller 1315 is operable to cause the row decoder to decouple the second word line from a negative voltage source, couple the second word line with the ground voltage source, decouple the second word line from a ground voltage source, and couple the second word line with a second positive voltage source.

In some examples, for activating the first word line of the plurality of word lines 1320, the memory controller 1315 is operable to cause the row decoder to, decouple the first word line from a first positive voltage source, couple the first word line with a second positive voltage source.

In some examples, for activating the second word line of the plurality of word lines 1320, the memory controller 1315 is operable to cause the row decoder to decouple the second word line from a ground voltage source, couple the second word line with the first positive voltage source. The memory controller may be further operable to cause the row decoder to decouple the second word line from the first positive voltage source before performing the first access operation, and couple the second word line with a ground voltage source before performing the first access operation.

In some examples, for performing the equalization operation, the memory controller 1315 is operable to couple the digit line 1340 with a first voltage source having a first voltage, and couple the plate line 1325 with a second voltage source having a second voltage. In some examples, the first voltage and the second voltage are a same voltage.

In some examples, for performing the access operation, the memory controller 1315 is operable to perform a read operation on the first memory cell, or perform a write operation on the first memory cell, or perform a read operation and a write operation on the first memory cell.

Figure 14:
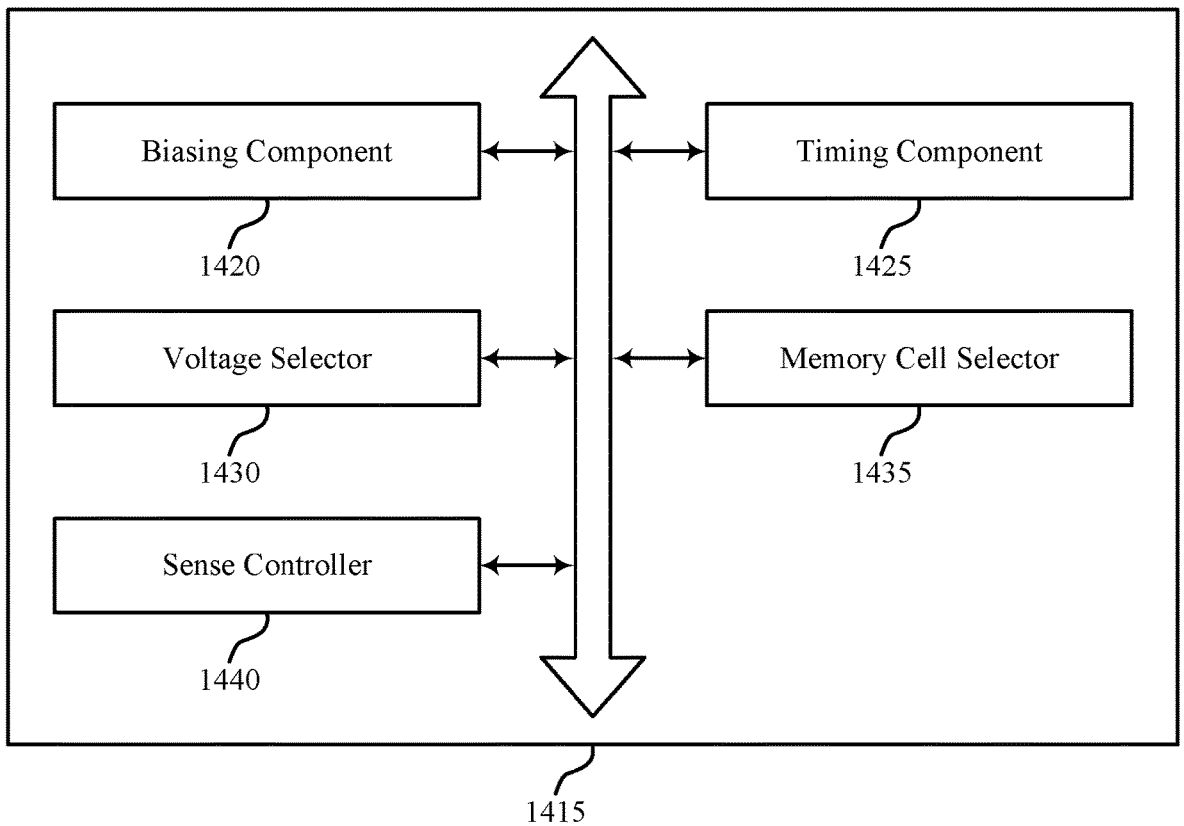
FIG. 14 shows a block diagram of a memory controller that may support access schemes for protecting stored data in a memory device in accordance with various embodiments of the present disclosure.

FIG. 14 shows a block diagram 1400 of a memory controller 1415 that may support access schemes for protecting stored data in a memory device in accordance with various embodiments of the present disclosure. The memory controller 1415 may be an example of a memory controller 170 described with reference to FIG. 1 or a memory controller 1315 described with reference to FIG. 13. The memory controller 1415 may include a biasing component 1420 and a timing component 1425, which may be examples of biasing component 1350 and timing component 1355 described with reference to FIG. 13. The memory controller 1415 may also include a voltage selector 1430, a memory cell selector 1435, and a sense controller 1440. Each of these modules may communicate, directly or indirectly, with one another (e.g., via one or more buses).

The voltage selector 1430 may initiate the selection of voltage sources to support various access operations of a memory device. For example, the voltage selector 1430 may generate or trigger control signals used to activate or deactivate various switching components or voltage sources, such as the control signals provided to the voltage multiplexers 850 as described with reference to FIGS. 8 through 11, or other signals that may be provided by a row controller 830 as described with reference to FIGS. 8 through 12. For example, the voltage selector 1430 may generate one or more of the logical signals for selecting (e.g., enabling, disabling) the voltages of word lines 205, digit lines 210, or plate lines 215 as illustrated in timing diagrams 500, 600, or 700 described with reference to FIGS. 5, 6, and 7.

The memory cell selector 1435 may select a memory cell for access operations (e.g., read operations, write operations, rewrite operations, refresh operations, equalization operations, dissipation operations). In some examples, the memory cell selector 1435 may generate logical signals used to activate or deactivate a cell selection component, such as cell selection components 230 described with reference to FIGS. 2 through 7. In some examples, the memory cell selector 1435 may initiate or otherwise control the word line voltages $V_{WL}$ illustrated in timing diagrams 500, 600, and 700 described with reference to FIGS. 5, 6, and 7.

The sense controller 1440 may control various operations of a sense component, such as the sense components 150 described with reference to FIGS. 1 through 5. For example, the sense controller 1440 may generate logical signals (e.g., ISOa, ISOb) used to activate or deactivate a sense component isolation component, such as the switching components 405-a or 405-b described with reference to FIGS. 4 through 7. In some examples, the sense controller 1440 may generate logical signals (e.g., PREa, PREb) used to equalize nodes of a sense component 150 or of an access line. In some examples, the sense controller 1440 may generate logical signals used to couple or decouple a sense component with a sensing voltage source, or to couple or decouple a sense component with an input/output component 160 or a latch 1345. Thus, in some examples, the sense controller 1440 may generate the logical signals ISOa, ISOb, PREa, PREb, or SE, or any combination thereof, of timing diagrams 500, 600, or 700 described with reference to FIGS. 5, 6, and 7.

In some embodiments, the sense controller 1440 may compare a voltage of a first node of a sense amplifier with a voltage of a second node of a sense amplifier, where the voltages are based on (e.g., result from) accessing the memory cell with one or more access operations of a read operation. The sense controller 1440 may determine a logic value associated with the memory cell based on comparing the resultant voltages. In some examples, the sense controller 1440 may provide signals to another component to determine the logic value associated with the memory cell.

Figure 15:
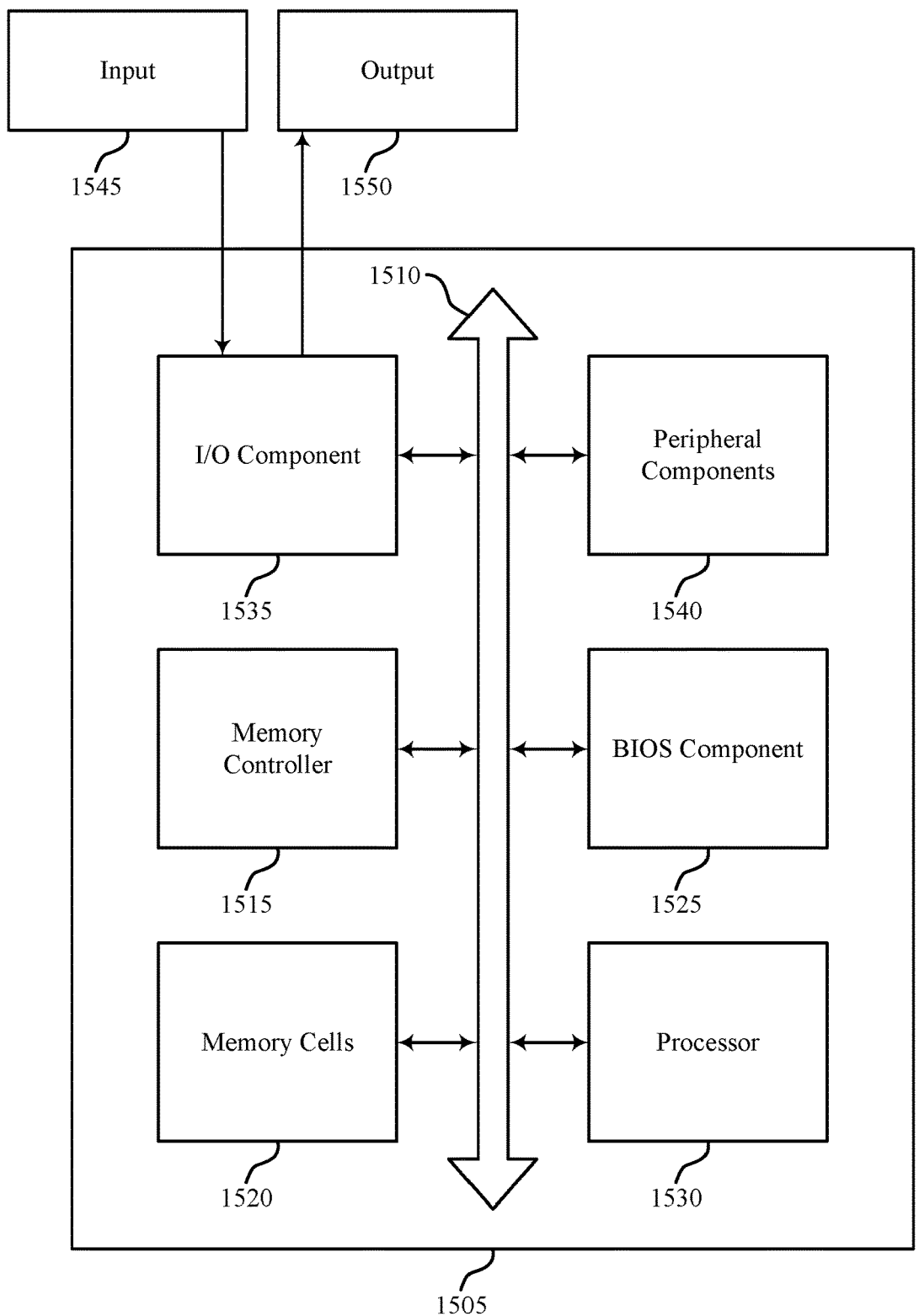
FIG. 15 shows a diagram of a system including a device that may support access schemes for protecting stored data in a memory device in accordance with various embodiments of the present disclosure.

FIG. 15 shows a diagram of a system 1500 including a device 1505 that may support access schemes for protecting stored data in a memory device in accordance with various embodiments of the present disclosure. The device 1505 may be an example of or include the components of memory device 100 as described above, for example, with reference to FIG. 1. The device 1505 may include components for bi-directional communications including components for transmitting and receiving communications, including a memory controller 1515, memory cells 1520, a basic input/output system (BIOS) component 1525, a processor 1530, an I/O component 1535, and peripheral components 1540. These components may be in electronic communication via one or more busses (e.g., bus 1510).

The memory controller 1515 may operate one or more memory cells as described herein. Specifically, the memory controller 1515 may be configured to support the described sensing schemes for accessing memory cells. In some cases, the memory controller 1515 may include a row component, a column component, a plate component, or a combination thereof, as described with reference to FIG. 1.

The memory cells 1520 may be an example of memory cells 105 or 1310 described with reference to FIGS. 1 through 13, and may store information (e.g., in the form of a logic state) as described herein.

The BIOS component 1525 be a software component that includes BIOS operated as firmware, which may initialize and run various hardware components. The BIOS component 1525 may also manage data flow between a processor and various other components, such as peripheral components, I/O control components, and others. The BIOS component 1525 may include a program or software stored in read only memory (ROM), flash memory, or any other non-volatile memory.

The processor 1530 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component). In some cases, the processor 1530 may be configured to operate a memory array using a memory controller. In other cases, a memory controller may be integrated into the processor 1530. The processor 1530 may be configured to execute computer-readable instructions stored in a memory to perform various functions (e.g., functions or tasks supporting access schemes for protecting stored data in a memory device).

The I/O component 1535 may manage input and output signals for the device 1505. The I/O component 1535 may also manage peripherals not integrated into the device 1505. In some cases, the I/O component 1535 may represent a physical connection or port to an external peripheral. In some cases, the I/O component 1535 may utilize an operating system such as iOS®, ANDROID®, MS-DOS®, MS-WINDOWS®, OS/2®, UNIX®, LINUX®, or another known operating system. In other cases, the I/O component 1535 may represent or interact with a modem, a keyboard, a mouse, a touchscreen, or a similar device. In some cases, the I/O component 1535 may be implemented as part of a processor. In some cases, a user may interact with the device 1505 via the I/O component 1535 or via hardware components controlled by the I/O component 1535. The I/O component 1535 may support accessing the memory cells 1520, including receiving information associated with the sensed logic state of one or more of the memory cells 1520, or providing information associated with writing a logic state of one or more of the memory cells 1520.

The peripheral components 1540 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input 1545 may represent a device or signal external to the device 1505 that provides input to the device 1505 or its components. This may include a user interface or an interface with or between other devices. In some cases, the input 1545 may be managed by the I/O component 1535, and may interact with the device 1505 via a peripheral component 1540.

The output 1550 may represent a device or signal external to the device 1505 configured to receive output from the device 1505 or any of its components. Examples of the output 1550 may include a display, audio speakers, a printing device, another processor or printed circuit board, or other devices. In some cases, the output 1550 may be a peripheral element that interfaces with the device 1505 via the peripheral component(s) 1540. In some cases, the output 1550 may be managed by the I/O component 1535.

The components of the device 1505 may include circuitry designed to carry out their functions. This may include various circuit elements, for example, conductive lines, transistors, capacitors, inductors, resistors, amplifiers, or other active or inactive elements, configured to carry out the functions described herein. The device 1505 may be a computer, a server, a laptop computer, a notebook computer, a tablet computer, a mobile phone, a wearable electronic device, a personal electronic device, or the like. Or the device 1505 may be a portion or element of such a device.

Figure 16:
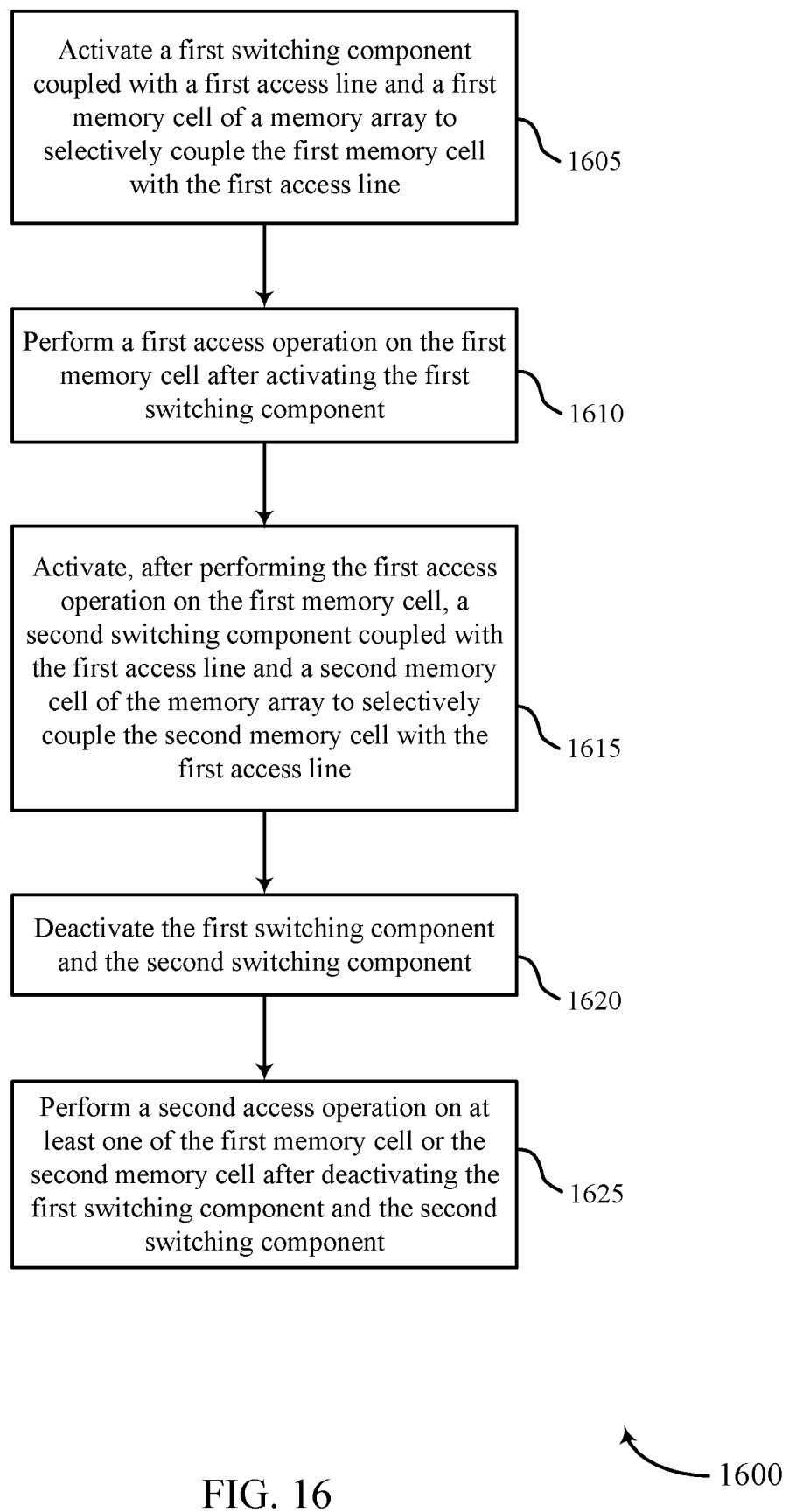
FIG. 16 shows a flowchart illustrating a method that may support access schemes for protecting stored data in a memory device in accordance with various embodiments of the present disclosure.

FIG. 16 shows a flowchart illustrating a method 1600 that may support access schemes for protecting stored data in a memory device in accordance with various embodiments of the present disclosure. The operations of the method 1600 may be performed according to the methods and apparatuses described with reference to FIGS. 1 through 15. In some examples, the operations of method 1600 may be implemented by one or more components illustrated in a memory device 100, a circuit 200, a circuit 400, a circuit 800, a circuit 900, a circuit 1000, a circuit 1100, a circuit 1200, a memory device 1305, a system 1500, or their components as described herein. For example, operations of method 1600 may be performed at least in part by a memory controller or a row component as described with reference to FIGS. 1 through 15. In some examples, a memory device may execute a set of instructions to control the functional elements of the device (e.g., voltage supplies, logical signals, transistors, amplifiers, switching components, selection components) to perform the functions described below. Additionally or alternatively, the memory device may perform some or all of the functions described below using special-purpose hardware.

At 1605 the method may include activating a first switching component coupled with a first access line (e.g., a digit line) and a first memory cell of a memory array to selectively couple the first memory cell with the first access line. In some examples, the first memory cell and the second memory cell each include a ferroelectric capacitor.

At 1610 the method may include performing a first access operation on the first memory cell after activating the first switching component. In some examples, performing the first access operation at 1610 includes performing a read operation, or a write operation, or a combination thereof.

At 1615 the method may include activating, after performing the first access operation on the first memory cell, a second switching component coupled with the first access line and a second memory cell of the memory array to selectively couple the second memory cell with the first access line. Some examples may include coupling the first access line with a first voltage source having a first voltage, and coupling, via a second access line (e.g., a plate line), the second memory cell with a second voltage source having a second voltage. In some examples, activating the second switching component may be based on coupling the first access line with the first voltage source and coupling the second memory cell with the second voltage source. In some examples, the first voltage source and the second voltage source are a same voltage source, or have a same voltage.

At 1620 the method may include deactivating the first switching component and the second switching component.

At 1625 the method may include performing a second access operation on at least one of the first memory cell or the second memory cell after deactivating the first switching component and the second switching component.

In some examples, activating the first switching component at 1605 may include decoupling the first switching component, via a first of a plurality of third access lines (e.g., a plurality of word lines), from a ground voltage source, and coupling the first switching component, via the first of the plurality of third access lines, with a first positive voltage source.

In some examples, activating the second switching component at 1615 may include decoupling the second switching component, via a second of the plurality of third access lines, from a ground voltage source, and coupling the second switching component, via the second of the plurality of third access lines, with a second positive voltage source.

In some examples, activating the second switching component at 1615 may include decoupling the second switching component, via a second of the plurality of third access lines, from a negative voltage source, and coupling the second switching component, via the second of the plurality of third access lines, with the ground voltage source, decoupling the second switching component, via the second of the plurality of third access lines, from a ground voltage source, and coupling the second switching component, via the second of the plurality of third access lines, with a second positive voltage source.

In some examples, activating the first switching component at 1605 may include decoupling the first switching component, via a first of a plurality of third access lines, from a first positive voltage source, and coupling the first switching component, via the first of the plurality of third access lines, with a second positive voltage source.

In some examples, activating the second switching component at 1615 may include decoupling the second switching component, via a second of the plurality of third access lines, from a ground voltage source, and coupling the second switching component, via the second of the plurality of third access lines, with the first positive voltage source.

Some examples may further include decoupling the second switching component, via a second of the plurality of third access lines, from the first positive voltage source before performing the first access operation at 1610, and coupling the second switching component, via the second of the plurality of third access lines, with the ground voltage source before performing the first access operation at 1610.

Figure 17:
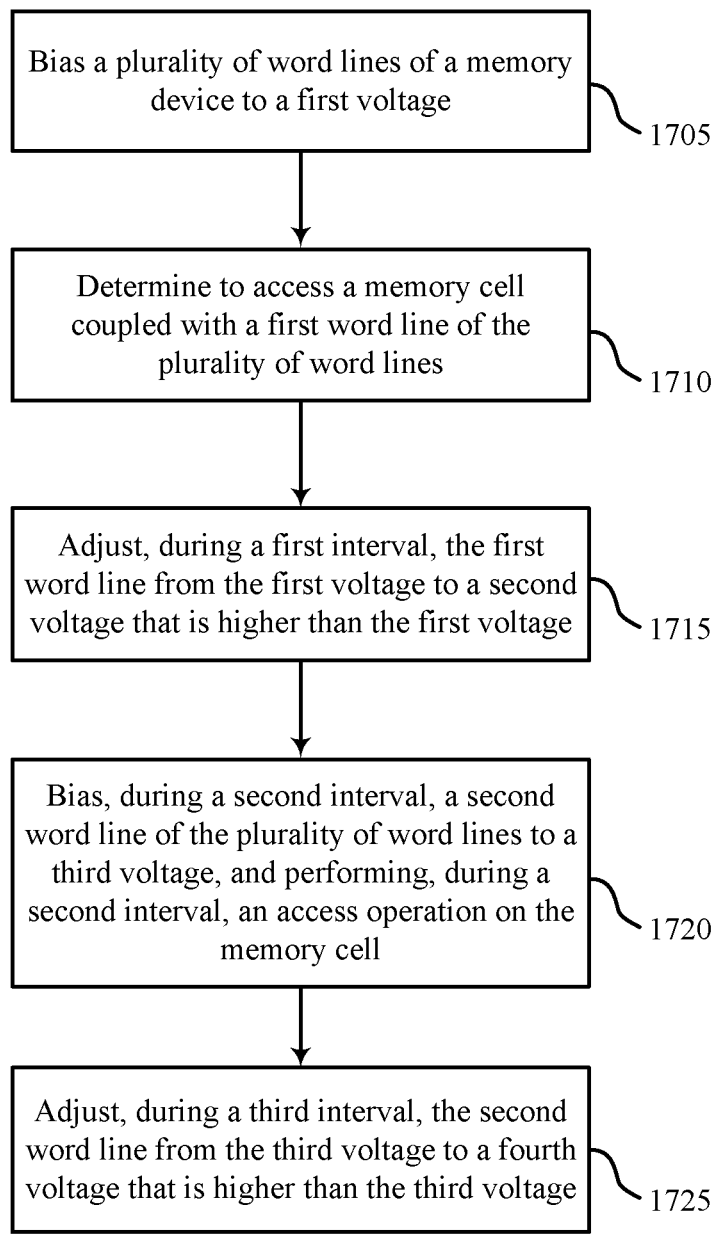
FIG. 17 shows a flowchart illustrating a method that may support access schemes for protecting stored data in a memory device in accordance with various embodiments of the present disclosure.

FIG. 17 shows a flowchart illustrating a method 1700 that may support access schemes for protecting stored data in a memory device in accordance with various embodiments of the present disclosure. The operations of the method 1700 may be performed according to the methods and apparatuses described with reference to FIGS. 1 through 15. In some examples, the operations of method 1700 may be implemented by one or more components illustrated in a memory device 100, a circuit 200, a circuit 400, a circuit 800, a circuit 900, a circuit 1000, a circuit 1100, a circuit 1200, a memory device 1305, a system 1500, or their components as described herein. For example, operations of method 1700 may be performed at least in part by a memory controller or a row component as described with reference to FIGS. 1 through 15. In some examples, a memory device may execute a set of instructions to control the functional elements of the device (e.g., voltage supplies, logical signals, transistors, amplifiers, switching components, selection components) to perform the functions described below. Additionally or alternatively, the memory device may perform some or all of the functions described below using special-purpose hardware.

At 1705 the method may include biasing a plurality of word lines of a memory device to a first voltage (e.g., an idle voltage, a standby voltage).

At 1710, the method may include determining to access (e.g., for a read operation, a write operation, a rewrite operation, a refresh operation, or a combination thereof) a memory cell coupled with a first word line of the plurality of word lines.

At 1715, the method may include adjusting, during a first interval, the first word line from the first voltage to a second voltage that is higher than the first voltage.

At 1720, the method may include biasing, during a second interval, a second word line of the plurality of word lines to a third voltage, and performing, during a second interval, an access operation (e.g., a read operation, a write operation, a rewrite operation, a refresh operation, or a combination thereof) on the memory cell.

At 1725, the method may include adjusting, during a third interval, the second word line from the third voltage to a fourth voltage that is higher than the third voltage.

Some examples of the method 1700 may further include adjusting, during the first interval, the second word line from the first voltage to the third voltage that is lower than the first voltage.

Some examples of the method 1700 may further include adjusting, during the third interval, the first word line from the second voltage to the first voltage, where the fourth voltage is equal to the first voltage.

In some examples, adjusting, during the first interval, the first word line from the first voltage to the second voltage may include biasing the first word line to a fifth voltage that is lower than the first voltage before biasing the first word line to the second voltage.

In some examples, adjusting, during the first interval, the second word line from the first voltage to the third voltage may include biasing the second word line to the fifth voltage before biasing the second word line to the third voltage.

In some examples, adjusting, during a third interval, the second word line from the third voltage to the fourth voltage may include biasing the second word line to the fifth voltage before biasing the second word line to the fourth voltage, wherein the fourth voltage is equal to the first voltage. In some examples, the first voltage and the third voltage are equal.

It should be noted that the methods described above describe possible implementations, and that the operations and the steps may be rearranged or otherwise modified and that other implementations are possible. Further, examples from two or more of the methods may be combined.

The description herein provides examples, and is not limiting of the scope, applicability, or examples set forth in the claims. Changes may be made in the function and arrangement of elements discussed without departing from the scope of the disclosure. Some examples may omit, substitute, or add various operations, procedures, or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V, or some other reference voltage of a device.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (e.g., open, closed).

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

As used herein, the term "terminal" need not suggest a physical boundary or connection point of a circuit element. Rather, "terminal" may refer to a reference point of a circuit relevant to the circuit element, which may also be referred to as a "node" or "reference point."

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, such as a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, such as, transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory device 100, circuit 200, and circuit 400, described with reference to FIGS. 1, 2, and 4, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, such as metals. The source and drain may be conductive and may comprise a heavily-doped, or degenerate semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
biasing a plurality of word lines of a memory device to a first voltage;
adjusting, during a first interval and based at least in part on determining to access a memory cell coupled with a first word line of the plurality of word lines, the first word line from the first voltage to a second voltage that is higher than the first voltage;
adjusting, during the first interval, a second word line of the plurality of word lines from the first voltage to a third voltage that is lower than the first voltage;
biasing, during a second interval, the second word line of the plurality of word lines to the third voltage;
performing, during the second interval, an access operation on the memory cell; and
adjusting, during a third interval, the second word line from the third voltage to a fourth voltage that is higher than the third voltage.

2. The method of claim 1, further comprising:
adjusting, during the third interval, the first word line from the second voltage to the first voltage, wherein the fourth voltage is equal to the first voltage.

3. The method of claim 1, wherein the memory cell comprises a ferroelectric capacitor.

4. The method of claim 1, wherein the access operation comprises a read operation, or a write operation, or a combination thereof.

5. A method, comprising:
biasing a plurality of word lines of a memory device to a first voltage;
adjusting, during a first interval and based at least in part on determining to access a memory cell coupled with a first word line of the plurality of word lines, the first word line from the first voltage to a second voltage that is higher than the first voltage;
biasing, during a second interval, a second word line of the plurality of word lines to a third voltage;
performing, during the second interval, an access operation on the memory cell: and
adjusting, during a third interval, the second word line from the third voltage to a fourth voltage that is higher than the third voltage,
wherein adjusting, during the first interval, the first word line from the first voltage to the second voltage comprises:
biasing the first word line to a fifth voltage that is lower than the first voltage before biasing the first word line to the second voltage.

6. The method of claim 5, wherein adjusting, during the first interval, the second word line from the first voltage to the third voltage comprises:
biasing the second word line to the fifth voltage before biasing the second word line to the third voltage.

7. The method of claim 5, wherein adjusting, during the third interval, the second word line from the third voltage to the fourth voltage comprises:

biasing the second word line to the fifth voltage before biasing the second word line to the fourth voltage, wherein the fourth voltage is equal to the first voltage.

8. The method of claim 5, wherein the first voltage and the third voltage are equal.

9. An apparatus, comprising:
a memory array comprising a plurality of memory cells and a plurality of word lines; and
a controller coupled with the memory array and configured to cause the apparatus to:
bias each word line of the plurality of word lines to a first voltage;
adjust, during a first interval and based at least in part on determining to access a memory cell of the plurality of memory cells that is coupled with a first word line of the plurality of word lines, the first word line from the first voltage to a second voltage that is higher than the first voltage;
adjust, during the first interval, a second word line of the plurality of word lines from the first voltage to a third voltage that is lower than the first voltage;
bias, during a second interval, the second word line of the plurality of word lines to the third voltage;
perform, during the second interval, an access operation on the memory cell; and
adjust, during a third interval and based at least in part on performing the access operation, the second word line from the third voltage to a fourth voltage that is higher than the third voltage.

10. The apparatus of claim 9, wherein the controller is further configured to cause the apparatus to:
adjust, during the third interval, the first word line from the second voltage to the first voltage, wherein the fourth voltage is equal to the first voltage.

11. An apparatus, comprising:
a memory array comprising a plurality of memory cells and a plurality of word lines; and
a controller coupled with the memory array and configured to cause the apparatus to:
bias each word line of the plurality of word lines to a first voltage;
adjust, during a first interval and based at least in part on determining to access a memory cell of the plurality of memory cells that is coupled with a first word line of the plurality of word lines, the first word line from the first voltage to a second voltage that is higher than the first voltage;
bias, during a second interval, a second word line of the plurality of word lines to a third voltage;
perform, during the second interval, an access operation on the memory cell; and
adjust, during a third interval and based at least in part on performing the access operation, the second word line from the third voltage to a fourth voltage that is higher than the third voltage,
wherein to adjust, during the first interval, the first word line from the first voltage to the second voltage, the controller is further configured to cause the apparatus to:
bias the first word line to a fifth voltage that is lower than the first voltage before biasing the first word line to the second voltage.

12. The apparatus of claim 11, wherein to adjust, during the third interval, the second word line from the third voltage to the fourth voltage, the controller is further configured to cause the apparatus to:
bias the second word line to the fifth voltage before biasing the second word line to the third voltage.

13. The apparatus of claim 11, wherein to adjust, during the third interval, the second word line from the third voltage to the fourth voltage, the controller is further configured to cause the apparatus to:
bias the second word line to the fifth voltage before biasing the second word line to the fourth voltage, wherein the fourth voltage is equal to the first voltage.

14. An apparatus, comprising:
a plurality of memory cells, each memory cell of the plurality of memory cells associated with a cell selection component;
a plurality of word lines, each word line of the plurality of word lines coupled with the cell selection components of a row of memory cells of the plurality of memory cells;
a plurality of voltage sources; and
a controller configured to cause the apparatus to:
couple each word line of the plurality of word lines with a first voltage source of the plurality of voltage sources;
couple a first word line with a second voltage source of the plurality of voltage sources based at least in part on identifying the first word line of the plurality of word lines for accessing a memory cell of the plurality of memory cells;
couple a second word line of the plurality of word lines with a third voltage source of the plurality of voltage sources based at least in part on identifying the first word line;
perform an access operation on the memory cell while the first word line is coupled with the second voltage source and while the second word line is coupled with the third voltage source; and
couple each word line of the plurality of word lines with the first voltage source based at least in part on performing the access operation,
wherein:
the first voltage source is associated with a first voltage;
the second voltage source is associated with a second voltage that is greater than the first voltage; and
the third voltage source is associated with a third voltage that is less than the first voltage.

15. The apparatus of claim 14, wherein the controller is further configured to cause the apparatus to:
couple, between each word line of the plurality of word lines being coupled with the first voltage source and coupling the first word line with the second voltage source, each word line of the plurality of word lines with a fourth voltage source of the plurality of voltage sources; and
couple, between performing the access operation on the memory cell and each word line of the plurality of word lines being coupled with the first voltage source, each word line of the plurality of word lines with the fourth voltage source,
wherein the fourth voltage source is associated with a ground voltage.

16. The apparatus of claim 14, wherein the controller is further configured to cause the apparatus to:
equalize a voltage across each memory cell of the plurality of memory cells during the coupling of each word line of the plurality of word lines with the first voltage source before performing the access operation, or during the coupling of each word line of the plurality of word lines with the first voltage source after performing the access operation, or both.

17. The apparatus of claim 14, wherein each memory cell of the plurality of memory cells comprises a ferroelectric capacitor.

* * * * *